(12) United States Patent
Ito et al.

(10) Patent No.: US 6,943,398 B2
(45) Date of Patent: Sep. 13, 2005

(54) SEMICONDUCTOR DEVICE AND METHOD FOR FABRICATING THE SAME

(75) Inventors: Toyoji Ito, Shiga (JP); Eiji Fujii, Osaka (JP); Kazuo Umeda, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/705,984

(22) Filed: Nov. 13, 2003

(65) Prior Publication Data

US 2004/0094791 A1 May 20, 2004

(30) Foreign Application Priority Data

Nov. 13, 2002 (JP) .......................... 2002-329425
Sep. 29, 2003 (JP) .......................... 2003-337280

(51) Int. Cl.$^7$ .......................... H01L 21/8242
(52) U.S. Cl. .................. 257/310; 257/295; 257/306; 257/297; 257/296; 257/311; 257/303; 257/309; 438/393; 438/3; 438/240; 438/207; 438/244
(58) Field of Search .................. 257/310, 295, 257/296, 297, 311, 303, 309, 301, 307, 312, 318, 298; 438/393, 3, 240, 227, 244

(56) References Cited

U.S. PATENT DOCUMENTS 6,249,014 B1   6/2001   Bailey 6,395,612 B1 * 5/2002 Amanuma .................. 438/393
6,611,014 B1 * 8/2003 Kanaya et al. .............. 257/295
6,730,951 B2 * 5/2004 Nagano et al. ............. 257/296
6,750,492 B2 * 6/2004 Mikawa et al. ............. 257/295

FOREIGN PATENT DOCUMENTS

| JP | 11-8355 A | 1/1999 |
| JP | 11-126881 A | 5/1999 |
| JP | 2001-007303 A | 1/2001 |
| JP | 2001-237393 A | 8/2001 |
| JP | 2003-086771 A | 3/2003 |
| JP | 2003-174145 A | 6/2003 |

* cited by examiner

Primary Examiner—Nathan J. Flynn
Assistant Examiner—Fazli Erdem
(74) Attorney, Agent, or Firm—McDermott Will & Emery LLP

(57) ABSTRACT

A semiconductor device includes: a lower hydrogen-barrier film; a capacitor formed on the lower hydrogen-barrier film and including a lower electrode, a capacitive insulating film, and an upper electrode; an interlayer dielectric film formed so as to cover the periphery of the capacitor; and an upper hydrogen-barrier film covering the top and lateral portions of the capacitor. An opening, which exposes the lower hydrogen-barrier film where the lower hydrogen-barrier film is located around the capacitor, and which is tapered and flares upward, is formed in the interlayer dielectric film, and the upper hydrogen-barrier film is formed along the lateral and bottom faces of the opening, and is in contact with the lower hydrogen-barrier film in the opening.

63 Claims, 33 Drawing Sheets

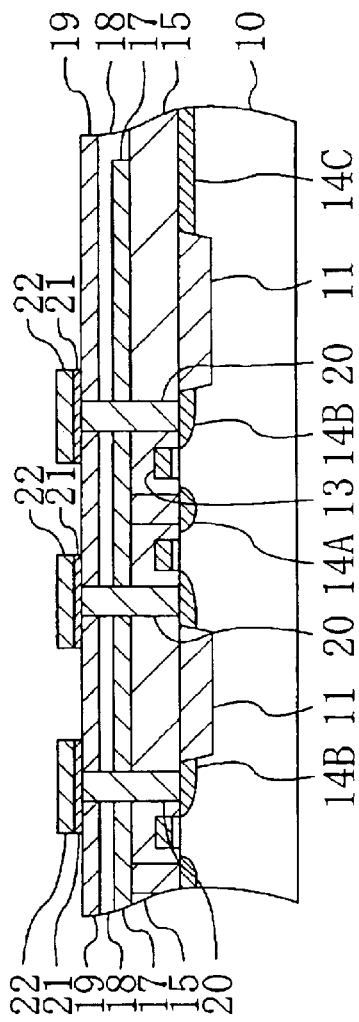
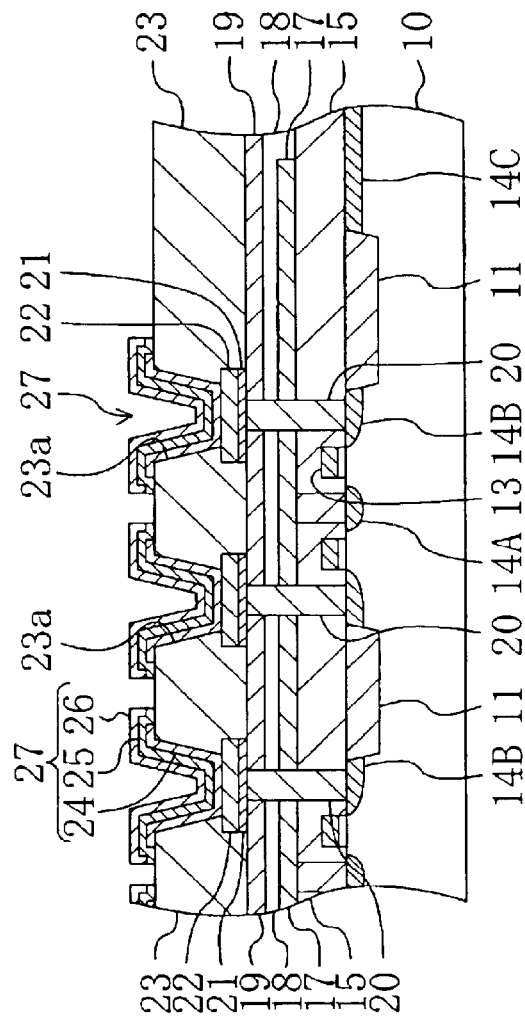
FIG. 6A
FIG. 6B

SEMICONDUCTOR DEVICE AND METHOD FOR FABRICATING THE SAME

BACKGROUND OF THE INVENTION

The present invention relates to semiconductor devices in which a ferroelectric material or a high dielectric material is used for a capacitive insulating film, and methods for fabricating the devices.

Semiconductor devices in which a ferroelectric material or a high dielectric material is used for a capacitive insulating film have residual polarization that exhibits hysteresis characteristics, and a high dielectric constant. Such semiconductor devices therefore may replace semiconductor devices that have a capacitive insulating film made of silicon oxide or silicon nitride, in the field of nonvolatile memory devices and DRAM devices.

However, ferroelectric materials and high dielectric materials, which are oxides whose crystal structure determines the physical characteristics thereof, are affected greatly by hydrogen reduction. Nevertheless, MOS-transistor formation process, multilevel-interconnect formation process, and passivation-film formation process, for example, include many process steps in which not only hydrogen gas but also, for example, silane gas, resist material, and water (moisture) that contain hydrogen atoms are used.

In view of this, technology has recently been proposed in which a hydrogen-barrier layer is provided to the lateral portion of the capacitors, covering each capacitor element itself, or with pluralities of the capacitors as units, the entireties.

(First prior art example)

Hereinafter, a semiconductor device that has a capacitive insulating film using a ferroelectric material in accordance with a first prior art example will be described with reference to FIG. 32 (see Japanese Laid-Open Publication No. 2001-237393, for example.)

As shown in FIG. 32, a MOS switching transistor 2 is formed on a semiconductor substrate 1. The MOS switching transistor 2 is covered by an isolation layer 4 made of an oxide of silicon, such as $SiO_2$ (TEOS) or BPSG (borophosphorosilicate glass). A capacitor is formed on the isolation layer 4 so as to be located over the drain region of the MOS switching transistor 2, and the capacitor is composed of a lower electrode 7 made of, e.g., platinum, a dielectric layer 8 made of a ferroelectric or paraelectric material, and an upper electrode 9 made of, e.g., platinum.

The drain region of the MOS switching transistor 2 is electrically connected to the lower electrode 7 of the capacitor via an oxygen-barrier layer 6 formed underneath the lower electrode 7, and via a contact formed by filling a contact hole 3 formed in the isolation layer 4 with doped polysilicon.

In this prior art example, a first hydrogen-barrier layer 5 made of silicon nitride is buried in a peripheral portion of the isolation layer 4 located under the capacitor. Further, the capacitor-including region of the isolation layer 4 is patterned in its peripheral portion so as to have a mesa shape, so that the end portion of the first hydrogen-barrier layer 5 is exposed. A second hydrogen-barrier layer 10 covers the mesa-shaped portion, that is, the upper surface and lateral/edge faces of the upper electrode 9 of the capacitor, the lateral/edge faces of the dielectric layer 8, and the lateral/edge faces of the portion of the isolation layer 4 located on the first hydrogen-barrier layer 5. Further, the exposed portion of the first hydrogen-barrier layer 5 is connected to the end portion, L-shaped in cross section, of the second hydrogen-barrier layer 10.

In this manner, the capacitor of the first prior art example is covered by the first hydrogen-barrier layer from underneath and by the second hydrogen-barrier layer 10 from above and laterally.

(Second prior art example)

Next, a semiconductor device that has a capacitive insulating film using a ferroelectric or high dielectric material in accordance with a second prior art example will be described with reference to FIG. 33 (see Japanese Laid-Open Publication No. 11-126881, for example.)

As shown in FIG. 33, a plurality of memory cell transistors 102 are formed as semiconductor active devices on a silicon substrate 101. In this example, the memory cell transistors 102 are the semiconductor active devices that are formed below a plurality of information-storing capacitors each composed of a lower electrode 108, a high ferroelectric material 109, and an upper electrode 110.

Between the capacitor layer and the transistor layer, an interlayer dielectric layer 104 for electrically isolating the layers from each other is formed. The capacitor layer is electrically connected to the transistor layer via first and second plugs 105 and 106.

Provided between the interlayer dielectric layer 104 and the capacitor layer is a hydrogen-diffusion-prevention layer 107 made of an insulator in which hydrogen diffuses at a lesser extent than in the interlayer dielectric layer 104.

A hydrogen-absorption-dissociation-prevention layer 111 covers the top and lateral faces of the upper electrode 110 of the capacitor layer in such a manner that the end portion of the hydrogen-absorption-dissociation-prevention layer 111 is connected with the lateral/edge faces of the hydrogen-diffusion-prevention layer 107.

An interlayer dielectric film 112 is formed on the interlayer dielectric layer 104 as well as on the hydrogen-absorption-dissociation-prevention layer 111. On the interlayer dielectric film 112, an upper interconnect layer 114 is formed. The upper interconnect layer is electrically connected to a peripheral transistor 103 formed on the silicon substrate 101 via a connection plug 113 formed in the interlayer dielectric film 112, and via the first and second plugs 105 and 106 formed in the interlayer dielectric layer 104.

In this manner, the information-storing capacitors in accordance with the second prior art example are covered by the hydrogen-diffusion-prevention layer 107 from underneath and by the hydrogen-absorption-dissociation-prevention layer 111 from above and laterally.

However, as in the first and second prior art examples, in a structure in which a hydrogen-barrier layer is provided to the lateral portion of the capacitors as well, to cover each capacitor element itself, or with pluralities of the capacitors as units, the entireties, the upper hydrogen-barrier film is in contact with a lower hydrogen-barrier film in a small area, which results in the problem that the barrier against hydrogen is insufficient.

Specifically, the first prior art example employs the structure in which the upper hydrogen-barrier layer 10 that is L-shaped in cross section is directly connected to the end portion of the lower hydrogen-barrier film 5. In this structure, the upper hydrogen-barrier film 10, in particular, has a single-layer structure against hydrogen entering from the lateral portion of the capacitor, such that it is difficult for the hydrogen-barrier film 10 to have a sufficient coating-film thickness in the bending portions that are L-shaped in cross section.

Also, the second prior art example employs the structure in which the upper hydrogen-barrier film 111 is connected to the lower hydrogen-barrier film 107 along the end face thereof alone, causing the connection area to be very small.

Accordingly, in either of these structures, the barrier against hydrogen is insufficient in the connection portion where the upper and lower hydrogen-barrier films are connected with each other.

Moreover, as in the second prior art example, in a case of a structure in which a hydrogen-barrier film covers a plurality of capacitors as a whole, it is normally difficult to connect bit lines, which are provided above the memory cell regions (more specifically, above the capacitors), to selective transistors, which are located below the capacitors, in such a manner that the memory cell regions do not increase in area, while at the same time the hydrogen-barrier film, located under the bit lines and covering the capacitors, is avoided, for the purpose of increasing the layout flexibility.

SUMMARY OF THE INVENTION

In view of the above-described problems, it is therefore an object of the present invention that in a semiconductor device that includes a capacitive insulating film using ferroelectric or high dielectric material, deterioration, due to hydrogen, in the capacitive insulating film is reliably prevented, and an increase in the area of a memory cell region is suppressed, while at the same time preventing hydrogen-caused deterioration in the capacitive insulating film.

In order to achieve the above object, in inventive semiconductor devices that include a capacitive insulating film using ferroelectric or high dielectric material, hydrogen barrier films cover the periphery, that is, the top, bottom and lateral faces, of more than one capacitor, more specifically, the periphery of capacitor rows that include pluralities of capacitors, while portions of the hydrogen-barrier film which cover the capacitors laterally are formed so as to form an obtuse angle with respect to the substrate surface, or so as to have a cross section of a recess.

More specifically, a first inventive semiconductor device includes: a lower hydrogen-barrier film; one or more capacitors each formed on the lower hydrogen-barrier film; a first interlayer dielectric film formed so as to cover the capacitor, and expose the lower hydrogen-barrier film where the lower hydrogen-barrier film is located near the peripheral portion of the capacitor; and an upper hydrogen-barrier film formed on the first interlayer dielectric film and on the exposed portion of the lower hydrogen-barrier film. The upper hydrogen-barrier film is in contact with the lower hydrogen-barrier film where the upper hydrogen-barrier film is located near the peripheral portion of the capacitor, and the lateral faces of the first interlayer dielectric film, which cover the lateral portions of the capacitor, form an obtuse angle with the lower hydrogen-barrier film.

In the first inventive semiconductor device, the upper hydrogen-barrier film has sufficient coating-film thickness in its cross-sectionally L-shaped bends formed by the portions of the film located on the lateral faces of the first interlayer dielectric film and the portions thereof in contact with the lower hydrogen-barrier film. This sufficiently increases the properties of the lower and upper hydrogen-barrier films as a barrier against hydrogen, in the connection portion where the lower and upper hydrogen-barrier films are connected with each other. Accordingly, it is ensured that hydrogen-caused deterioration in the capacitive insulating film included in the capacitor is prevented.

A second inventive semiconductor device includes: a lower hydrogen-barrier film; one or more capacitors, each formed on the lower hydrogen-barrier film and including a lower electrode, a capacitive insulating film, and an upper electrode; a first interlayer dielectric film formed so as to cover the capacitor; and an upper hydrogen-barrier film covering the top and lateral portions of the capacitor. An opening, which exposes the lower hydrogen-barrier film where the lower hydrogen-barrier film is located around the capacitor, and which is tapered and flares upward, is formed in the first interlayer dielectric film, and the upper hydrogen-barrier film is formed along the lateral and bottom faces of the opening, and is in contact with the lower hydrogen-barrier film in the opening.

In the second inventive semiconductor device, the upper hydrogen-barrier film is formed directly on the lower hydrogen-barrier film, with the lateral and bottom faces of the upper hydrogen-barrier film forming an obtuse-angled "L" in cross section. This structure produces sufficient coating-film thickness in the hydrogen-barrier film in the cross-sectionally L-shaped bends, which sufficiently increases the properties of the hydrogen-barrier films as a barrier against hydrogen, in the connection portion where the lower and upper hydrogen-barrier films are connected with each other. As a result, it is ensured that hydrogen-caused deterioration in the capacitive insulating film included in the capacitor is prevented.

Further, a third inventive semiconductor device includes: a lower hydrogen-barrier film; one or more capacitors, each formed on the lower hydrogen-barrier film and including a lower electrode, a capacitive insulating film, and an upper electrode; a first interlayer dielectric film formed so as to cover the capacitor; and an upper hydrogen-barrier film covering the top and lateral portions of the capacitor. An open trench, which exposes the lower hydrogen-barrier film where the lower hydrogen-barrier film is located around the capacitor, is formed in the first interlayer dielectric film, and the upper hydrogen-barrier film has a portion in the form of a recess formed along the open trench, and the recess-shaped portion is in contact with the lower hydrogen-barrier film.

In the third inventive semiconductor device, when the first interlayer dielectric film is etched for exposing the lower hydrogen-barrier film through the first interlayer dielectric film, the amount of etching required is allowed to be reduced. Furthermore, the lateral portions of the upper hydrogen-barrier film that are grown on the mutually-facing inner wall surfaces of the open trench are formed doubly to the lateral portion of the capacitor. This significantly improves the barrier against hydrogen entering from the lateral portions of the capacitor.

In this case, the recess of the upper hydrogen-barrier film preferably has a cross-sectional configuration that is tapered and flares upward. Then, the upper hydrogen-barrier film is reliably grown on the inner wall surfaces and bottom of the open trench, so that the coverage of the upper hydrogen-barrier film increases, thereby ensuring the properties of the upper hydrogen-barrier film as a barrier.

Also, in this case, the upper hydrogen-barrier film is preferably filled in the recess. Then, the recess of the upper hydrogen-barrier film has already been filled when a second interlayer dielectric film is formed on the upper hydrogen-barrier film, which permits the thickness of the second interlayer dielectric film to be reduced, thereby making it easier to downsize the semiconductor device.

In the first through third inventive semiconductor devices, the lower electrode, capacitive insulating film, and upper electrode in the capacitor preferably have a cross section of a recess, and the lateral faces of each recess are preferably tapered and flare upward. Then, when the capacitor, recess-shaped in cross section, is in three dimensions, the coverage of the lower electrode, capacitive insulating film, and upper electrode on the lateral faces, bottoms and corners of their respective recesses, increases, such that leakage current in the capacitor is prevented to obtain the desired characteristics for the capacitor.

The first through third inventive semiconductor devices preferably further include a second interlayer dielectric film formed on the first interlayer dielectric film so as to cover the capacitor. Further, an open trench, which exposes the lower hydrogen-barrier film, is preferably formed in the first interlayer dielectric film, and the upper hydrogen-barrier film preferably includes a first hydrogen-barrier film and a second hydrogen-barrier film, wherein the first hydrogen-barrier film having a cross section of a recess is formed along the open trench, while the second hydrogen-barrier film is formed on the second interlayer dielectric film and the end portion of the second hydrogen-barrier film is connected to the first hydrogen-barrier film.

As described above, the upper hydrogen-barrier film is composed of the first hydrogen-barrier film recess-shaped in cross section and formed in the first interlayer dielectric film, and the second hydrogen-barrier film formed on the second interlayer dielectric film on the first interlayer dielectric film. Therefore, the open trench that exposes the lower hydrogen-barrier film is formed only in the first interlayer dielectric film. This results in a decrease in the aspect ratio of the open trench formed in the first interlayer dielectric film alone, which increases the coverage of the cross-sectionally recessed first hydrogen-barrier film in the open trench.

The first through third inventive semiconductor devices preferably further include: a second interlayer dielectric film formed over the first interlayer dielectric film so as to cover the upper hydrogen-barrier film, and a third interlayer dielectric film formed on the second interlayer dielectric film and located to the lateral portion of the capacitor. And, a lower contact plug, which passes through the second interlayer dielectric film, is preferably formed in a region of the second interlayer dielectric film which is located to the lateral portion of the capacitor, and an upper contact plug is preferably formed in a region of the third interlayer dielectric film which is located to the lateral portion of the capacitor. The upper contact plug passes through the third interlayer dielectric film and is electrically connected with the lower contact plug. In this manner, the lower contact plug provided in the second interlayer dielectric film, and the upper contact plug provided in the third interlayer dielectric film on the second interlayer dielectric film are formed separately to form a contact plug to the lateral portion of the capacitor. Therefore, the respective aspect ratios of the contact holes for forming the lower and upper contact plugs are both reduced, making it easier to form the contact plug.

In the third inventive semiconductor device, a plurality of open trenches, which expose the lower hydrogen-barrier film, are preferably formed in parallel with each other in the first interlayer dielectric film. The upper hydrogen-barrier film preferably has portions that are each in the form of a recess, and are formed along the open trenches, where the upper hydrogen-barrier film is located to the lateral portion of the first interlayer dielectric film, and the respective recess-shaped portions are preferably in contact with the lower hydrogen-barrier film. Then, the upper hydrogen-barrier film is of at least four-fold structure where the upper hydrogen-barrier film is located to the lateral portion of the capacitor, which further improves the properties of the film as a barrier against hydrogen entering from the lateral portions of the capacitor.

In the first through third inventive semiconductor devices, preferably, the lower hydrogen-barrier film or the upper hydrogen-barrier film is made of an insulative material, and the insulative material is made of silicon nitride, silicon oxynitride, aluminum oxide, titanium aluminum oxide, tantalum aluminum oxide, titanium silicate oxide, or tantalum silicate oxide.

In the first through third inventive semiconductor devices, an oxygen-barrier film for preventing oxygen diffusion is preferably provided under the capacitor. Then, in a case of a structure in which a contact plug is formed under the capacitor, oxygen coming toward the contact plug from above is prevented from diffusing, thereby preventing the upper portion of the contact plug from being oxidized.

In this case, the oxygen-barrier film is preferably made of iridium, iridium oxide, ruthenium, or ruthenium oxide.

Further, in this case, preferably, the oxygen-barrier film is made of any one of an iridium oxide film, a multilayer film composed of an iridium film and an iridium oxide film that are sequentially formed from the lowermost layer, a ruthenium oxide film, and a multilayer film composed of a ruthenium film and a ruthenium oxide film that are sequentially formed from the lowermost layer, or is made of a multilayer film that includes at least two of these films.

In the first through third inventive semiconductor devices, a conductive lower hydrogen-barrier film for preventing hydrogen diffusion is preferably provided under the capacitor. Then, in a case of a structure in which a contact plug is formed under the capacitor, hydrogen is prevented from entering from underneath the contact plug.

In this case, the conductive lower hydrogen-barrier film is preferably made of titanium aluminum nitride, titanium aluminum, titanium silicide nitride, tantalum nitride, tantalum silicide nitride, tantalum aluminum nitride, or tantalum aluminum.

Further, in this case, the conductive lower hydrogen-barrier film is preferably made of a multilayer film that includes at least two of a titanium aluminum nitride film, a titanium aluminum film, a titanium silicide nitride film, a tantalum nitride film, a tantalum silicide nitride film, a tantalum aluminum nitride film, and a tantalum aluminum film.

Furthermore, in this case, the conductive lower hydrogen-barrier film preferably includes a multilayer film composed of a first conductive barrier layer for preventing oxygen diffusion and hydrogen diffusion, and a second conductive barrier layer for preventing oxygen diffusion.

In the first through third inventive semiconductor devices, preferably, a plurality of the capacitors are arranged in a row to form a capacitor row, and the upper electrodes forming the capacitor row are connected with each other to form a cell plate, and the capacitors are covered in cell-plate units by the upper hydrogen-barrier film.

Further, in the first through third inventive semiconductor devices, preferably, a plurality of the capacitors are arranged to form a block, and the capacitors are covered in block units by the upper hydrogen-barrier film.

Furthermore, in the first through third inventive semiconductor devices, preferably, a plurality of the capacitors are arranged in a matrix to form a capacitor array, and the capacitors are covered in capacitor-array units by the upper hydrogen-barrier film.

Moreover, in the first through third inventive semiconductor devices, preferably, a plurality of the capacitors are arranged in rows to form capacitor rows, and the upper electrodes forming each capacitor row are connected with each other to form a cell plate; the capacitor rows are arranged to form blocks, and the blocks are arranged to form a capacitor array; and the capacitors are covered by the upper hydrogen-barrier film in cell-plate units, block units, or capacitor-array units, or are covered in a mixture of the cell-plate units and the block units.

As described above, if the hydrogen barrier film is formed to cover the capacitors in the cell-plate units, in the block units, or in the capacitor-array units, wherein each block includes a plurality of the cell plates, and each capacitor array includes a plurality of the blocks, it is possible to suppress an increase in the area of a unit cell itself that includes a cell-selecting transistor and a capacitor, for example. Then, the semiconductor device is allowed to decrease in size.

In the first through third inventive semiconductor devices, a plurality of the capacitors are preferably arranged, and among the capacitors, capacitors located adjacent to the peripheral portion of the upper hydrogen-barrier film are preferably non-actuating dummy capacitors that do not operate electrically. Then, since the capacitors adjacent to the peripheral portion of the upper hydrogen-barrier film are the non-actuating dummy capacitors, the semiconductor device is capable of performing its predetermined operation, even if the hydrogen-barrier film should fail to prevent hydrogen from diffusing into the capacitors.

The first through third inventive semiconductor devices preferably further include a cell-selecting transistor formed in a semiconductor substrate, and a bit line formed over the semiconductor substrate, the bit line being electrically connected with the cell-selecting transistor. The bit line is preferably connected with another interconnect where the bit line is located outside the lower and upper hydrogen-barrier films. Then, even if the hydrogen-barrier films cover the periphery, including the top and bottom faces, of the capacitor, the cell-selecting transistor is accessible without forming openings in those hydrogen barrier films.

In this case, the bit line is preferably formed underneath the capacitor and the lower hydrogen-barrier film. Then, a contact plug for connecting a doped layer of the cell-selecting transistor with the bit line does not have to be formed between neighboring capacitors, which therefore reduces the margin of such a contact plug that connects the doped layer with the bit line. In addition, a connection portion, in which the lower hydrogen-barrier film is connected with the upper hydrogen-barrier film, does not have to be formed between neighboring capacitors, which reduces the margin required by such a connection portion. This results in decrease in the area that a unit cell occupies. In other words, it is possible to provide the bit line without causing the unit cell to increase in area.

Also, in this case, the bit line is preferably formed between the lower hydrogen-barrier film and the semiconductor substrate. Then, a contact hole provided between the doped layer and the bit line, and a contact hole provided between the bit line and the interconnect are both allowed to be formed shallowly, which thus reduces the amount of etching required for forming those contact holes. Additionally, the connection between the interconnect located above the capacitor and the bit line is established outside the connection portion in which the upper hydrogen-barrier film is connected with the lower hydrogen-barrier film. Therefore, it is possible to provide the bit line without forming through-holes in the upper and lower hydrogen-barrier films.

In this case, the bit line is preferably formed under the lower hydrogen-barrier film so as to be in contact with the lower hydrogen-barrier film. Then, since no interlayer dielectric film is necessary between the bit line and the lower hydrogen-barrier film, the semiconductor device is allowed to decrease in size.

In the third semiconductor device, the bottom of the recess of the upper hydrogen-barrier film is preferably in contact with the lower hydrogen-barrier film. Then, as compared to a case in which the lateral faces of the recess of the upper hydrogen-barrier film are in contact with the lower hydrogen-barrier film, the connection portion in which these films are connected with each other increases in size, which improves the properties of the connection portion as a barrier against hydrogen.

In the first through third inventive semiconductor devices, the upper electrode of the capacitor and the upper hydrogen-barrier film are preferably in contact with each other. With this structure, no interlayer dielectric film is necessary between the upper electrodes and the upper hydrogen-barrier film, thus permitting the semiconductor device to decrease in size.

The first through third inventive semiconductor devices preferably further include an interconnect formed directly on the upper hydrogen-barrier film. With this structure, no interlayer dielectric film is necessary between the upper hydrogen-barrier film and the interconnects, thus permitting the semiconductor device to decrease in size.

The first through third inventive semiconductor devices preferably further include: a cell-selecting transistor formed in a semiconductor substrate and having a source region and a drain region; a second interlayer dielectric film formed on the semiconductor substrate and covering the cell-selecting transistor; and a contact plug in the second interlayer dielectric film, the contact plug electrically connecting the lower electrode with the source region or the drain region.

Then, a stacked memory cell is formed composed of the capacitor and the cell-selecting transistor that makes the capacitor accessible, and a semiconductor memory device is obtained by integrating the memory cell.

Also, the first through third inventive semiconductor devices preferably further include a plurality of cell-selecting transistors formed in a semiconductor substrate. And, preferably, a plurality of the capacitors are ranged to form capacitor rows, while the upper electrodes of the capacitors are connected with each other to form cell plates; the cell-selecting transistors are electrically connected with the capacitors by contact plugs; the capacitor rows include conducting dummy capacitors that are the same in structure as the capacitors; and an upper electrode and a lower electrode in each conducting dummy capacitor are electrically connected with each other, so that the cell plates are electrically connected with the semiconductor substrate via the contact plugs.

With this structure, even if the top face of the capacitor rows is covered by the hydrogen barrier film, it is possible to supply a predetermined potential for the upper electrodes from the semiconductor substrate.

In this case, the lower hydrogen-barrier film preferably includes conductive lower hydrogen-barrier films and an insulative lower hydrogen-barrier film, wherein each conductive lower hydrogen-barrier film is formed between each cell-selecting transistor and each capacitor, while the insulative lower hydrogen-barrier film is formed between the capacitor rows. And the conductive lower hydrogen-barrier films are preferably formed on the insulative lower hydrogen-barrier film so as to cover the upper surfaces of the contact plugs.

Also, in this case, the lower hydrogen-barrier film preferably includes conductive lower hydrogen-barrier films and an insulative lower hydrogen-barrier film, wherein each conductive lower hydrogen-barrier film is formed between each cell-selecting transistor and each capacitor, while the insulative lower hydrogen-barrier film is formed between the capacitor rows. And the end faces of the conductive lower hydrogen-barrier films are preferably in contact with the insulative lower hydrogen-barrier film.

Moreover, in this case, the lower hydrogen-barrier film preferably includes conductive lower hydrogen-barrier films and an insulative lower hydrogen-barrier film, wherein each conductive lower hydrogen-barrier film is formed between each cell-selecting transistor and each capacitor, while the insulative lower hydrogen-barrier film is formed between the capacitor rows. And the conductive lower hydrogen-barrier films are preferably formed on the lateral faces of the contact plugs, so that the conductive lower hydrogen-barrier films are in contact with the insulative lower hydrogen-barrier film.

In the first through third inventive semiconductor devices, the lower electrode or the upper electrode preferably contains an element of the platinum group.

In the first through third inventive semiconductor devices, the capacitive insulating film is preferably made of a substance, which is expressed by the general formula $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (wherein $0 \leq x \leq 1$ in the formulas), or $Ta_2O_5$.

A first inventive method for fabricating a semiconductor device includes the steps of forming a plurality of cell-selecting transistors in a semiconductor substrate; forming bit lines, which are electrically connected with the cell-selecting transistors, over the semiconductor substrate; forming an insulative lower hydrogen-barrier film over the bit lines; forming a plurality of first contact plugs, which pass through the insulative lower hydrogen-barrier film to reach the cell-selecting transistors; selectively forming a plurality of conductive lower hydrogen-barrier films on the insulative lower hydrogen-barrier film so that the conductive lower hydrogen-barrier films cover the upper faces of the first contact plugs; forming capacitor rows over the conductive lower hydrogen-barrier films, the capacitor rows including a plurality of capacitors each having a capacitive insulating film made of a ferroelectric material or a high dielectric material; and forming an upper hydrogen-barrier film over the capacitor rows. The upper-hydrogen-barrier-film formation step includes the step of forming the upper hydrogen-barrier film in such a manner that the upper hydrogen-barrier film is in contact with the insulative lower hydrogen-barrier film where the insulative lower hydrogen-barrier film is located outside the capacitor rows.

In accordance with the first inventive semiconductor-device fabrication method, no hydrogen enters from between the insulative lower hydrogen-barrier film and the conductive lower hydrogen-barrier films. In addition, since the upper hydrogen-barrier film and the insulative lower hydrogen-barrier film cover the capacitor rows entirely rather than cover each capacitor, a unit cell, which includes the cell-selecting transistor and the capacitor, does not increase in area. Moreover, the upper hydrogen-barrier film and the insulative lower hydrogen-barrier film are connected with each other where they are outside the capacitor rows. Deterioration, due to hydrogen, in the capacitive insulating film included in each capacitor is therefore reliably prevented.

A second inventive method for fabricating a semiconductor device includes the steps of: forming a plurality of cell-selecting transistors in a semiconductor substrate; forming bit lines, which are electrically connected with the cell-selecting transistors, over the semiconductor substrate; forming a plurality of first contact plugs, which reach the respective cell-selecting transistors; selectively forming a plurality of conductive lower hydrogen-barrier films on the first contact plugs so that the conductive lower hydrogen-barrier films cover the upper faces of the first contact plugs; forming an insulative lower hydrogen-barrier film so that the insulative lower hydrogen-barrier film covers regions located alongside the conductive lower hydrogen-barrier films, and also covers the end faces of the conductive lower hydrogen-barrier films; forming capacitor rows over the conductive lower hydrogen-barrier films, the capacitor rows including a plurality of capacitors each having a capacitive insulating film made of a ferroelectric material or a high dielectric material; and forming an upper hydrogen-barrier film over the capacitor rows. The upper-hydrogen-barrier-film formation step includes the step of forming the upper hydrogen-barrier film in such a manner that the upper hydrogen-barrier film is in contact with the insulative lower hydrogen-barrier film where the insulative lower hydrogen-barrier film is located outside the capacitor rows.

In accordance with the second inventive semiconductor-device fabrication method, the end faces of the conductive lower hydrogen-barrier films are in contact with the insulative lower hydrogen-barrier film, which allows no hydrogen to enter from between the insulative lower hydrogen-barrier film and the conductive lower hydrogen-barrier films. In addition, since the upper hydrogen-barrier film and the insulative lower hydrogen-barrier film cover the capacitor rows as a whole rather than cover each capacitor, a unit cell, which includes the cell-selecting transistor and the capacitor, does not increase in area. Moreover, the upper hydrogen-barrier film and the insulative lower hydrogen-barrier film are connected with each other where they are located outside the capacitor rows. Therefore, hydrogen-caused deterioration in the capacitive insulating film included in each capacitor is reliably prevented.

A third inventive method for fabricating a semiconductor device includes the steps of forming a plurality of cell-selecting transistors in a semiconductor substrate; forming bit lines, which are electrically connected with the cell-selecting transistors, over the semiconductor substrate; forming an insulative lower hydrogen-barrier film over the bit lines; forming a plurality of contact holes, which pass through the insulative lower hydrogen-barrier film to reach the cell-selecting transistors; forming conductive lower hydrogen-barrier films on the wall and bottom faces of the contact holes so that the upper end portions of the conductive lower hydrogen-barrier films are in contact with the insulative lower hydrogen-barrier film, and then forming first contact plugs that include at least the conductive lower hydrogen-barrier films; forming capacitor rows over the conductive lower hydrogen-barrier films, the capacitor rows including a plurality of capacitors each having a capacitive insulating film made of a ferroelectric material or a high dielectric material; and forming an upper hydrogen-barrier film over the capacitor rows. The upper-hydrogen-barrier-film formation step includes the step of forming the upper hydrogen-barrier film in such a manner that the upper hydrogen-barrier film is in contact with the insulative lower hydrogen-barrier film where the insulative lower hydrogen-barrier film is located outside the capacitor rows.

In accordance with the third inventive semiconductor-device fabrication method, the conductive lower hydrogen-barrier films are in contact with the first contact plugs whose surface includes the conductive lower hydrogen-barrier film. Therefore, no hydrogen enters from between the insulative lower hydrogen-barrier film and the first contact plugs. In addition, since the upper hydrogen-barrier film and the insulative lower hydrogen-barrier film cover the capacitor rows as a whole rather than cover each capacitor, a unit cell, which includes the cell-selecting transistor and the capacitor, does not increase in area. Moreover, the upper hydrogen-barrier film and the insulative lower hydrogen-barrier film are connected with each other where they are located outside the capacitor rows, which therefore reliably prevents hydrogen-caused deterioration in the capacitive insulating film included in each capacitor.

The first through third inventive methods preferably further include, after the upper-hydrogen-barrier-film formation step, the steps of: forming an interlayer dielectric film over the entire surface of the semiconductor substrate as well as on the upper hydrogen-barrier film; forming second contact plugs, which are connected to the bit lines, in portions in the interlayer dielectric film that are located outside the region where the upper hydrogen-barrier film has been formed; and forming interconnects, which are in contact with the second contact plugs, on the interlayer dielectric film.

In this case, the step of forming the second contact plugs in the interlayer dielectric film preferably includes the steps of: forming a lower interlayer dielectric film on the upper hydrogen-barrier film, and then forming a lower contact plug in the lower interlayer dielectric film, and forming an upper interlayer dielectric film on the lower interlayer dielectric film, and then forming an upper contact plug, which is connected to the lower contact plug, in the upper interlayer dielectric film.

A fourth inventive method for fabricating a semiconductor device includes the steps of forming a lower hydrogen-barrier film over a semiconductor substrate; forming capacitor rows over the lower hydrogen-barrier film, the capacitor rows including a plurality of capacitors each having a capacitive insulating film made of a ferroelectric material or a high dielectric material; forming an interlayer dielectric film covering the capacitor rows; forming, in the interlayer dielectric film, an open trench exposing the lower hydrogen-barrier film where the lower hydrogen-barrier film is located outside the capacitor rows; and forming an upper hydrogen-barrier film on the interlayer dielectric film so that the upper hydrogen-barrier film is in contact with the lower hydrogen-barrier film where the upper hydrogen-barrier film is on the bottom face of the open trench.

According to the fourth inventive semiconductor-device fabrication method, the trench is formed in the interlayer dielectric film that covers the capacitor rows, permitting the upper hydrogen-barrier film formed on the interlayer dielectric film to be in contact with the lower hydrogen-barrier film in the bottom of the trench. This ensures the barrier against hydrogen coming toward the lateral portion of the capacitors, without causing the unit cell to increase in area. Further, since the interlayer dielectric film is removed only where the trench is formed, a resist film formed over the capacitor rows does not have a small thickness when the upper hydrogen-barrier film is patterned. Furthermore, the lateral portions of the upper hydrogen-barrier film that are grown on the mutually-facing inner wall surfaces of the open trench are formed doubly to the lateral portion of the capacitor. This greatly improves the barrier against hydrogen entering from the lateral portion of the capacitor. Moreover, the trench is formed for the capacitor rows. Thus, even if another interlayer dielectric film is formed on the upper hydrogen-barrier film after the upper hydrogen-barrier film has been patterned, the planarity of said other interlayer dielectric film after said other interlayer dielectric film has been embedded in the trench increases.

In the fourth inventive method, the step of forming the open trench in the interlayer dielectric film preferably includes the step of forming a plurality of the open trenches in parallel with each other.

In the fourth inventive method, the open trench preferably has a cross-sectional configuration that is tapered and flares upward.

In the first through fourth inventive methods, in the lower-hydrogen-barrier-film formation step, the lower hydrogen-barrier film is preferably formed directly on bit lines.

A fifth inventive method for fabricating a semiconductor device includes the steps of: forming a lower hydrogen-barrier film over a semiconductor substrate; forming capacitor rows over the lower hydrogen-barrier film, the capacitor rows including a plurality of capacitors each having a capacitive insulating film made of a ferroelectric material or a high dielectric material; forming a side-wall hydrogen-barrier film so that the side-wall hydrogen-barrier film covers the lateral portions of the capacitor rows, and is in contact with the lower hydrogen-barrier film where the lower hydrogen-barrier film is located outside the capacitor rows; and forming an upper hydrogen-barrier film so that the upper hydrogen-barrier film covers the top face of the capacitor rows, and is in contact with the side-wall hydrogen-barrier film.

In accordance with the fifth inventive semiconductor device fabrication method, the capacitor rows are covered by the side-wall hydrogen-barrier film and the upper hydrogen-barrier film that is in contact with the side-wall hydrogen-barrier film. This ensures the barrier against hydrogen coming toward the lateral portion of the capacitors, without causing the unit cell to increase in area. Furthermore, since the side-wall hydrogen-barrier film is formed independently of the upper hydrogen-barrier film, the coverage of the upper hydrogen-barrier film is excellent even if the difference in level between the top and bottom of the capacitor rows is large.

In the first through fifth inventive methods, a lower electrode, the capacitive insulating film, and an upper electrode in each capacitor preferably has a cross-sectional configuration that is tapered and flares upward.

In the first through fifth inventive methods, in the upper-hydrogen-barrier-film formation step, the upper hydrogen-barrier film is preferably formed directly on upper electrodes.

The first through fifth inventive methods preferably further include the step of forming interconnects directly on the upper hydrogen-barrier film, after the upper-hydrogen-barrier-film formation step is performed.

In the first through fifth inventive methods, the capacitor-row formation step preferably includes the step of connecting upper electrodes of the capacitors with each other so that the upper electrodes form a cell plate, and electrically connecting an upper electrode and a lower electrode in one capacitor connected to the cell plate, thereby making the one capacitor be a conducting dummy capacitor whose upper and lower electrodes are electrically connected with each other.

BRIEF DESCRIPTION OF THE DRAWINGS

FIGS. 6A and 6B are cross-sectional views illustrating sequential process steps for fabricating the semiconductor device in accordance with the first embodiment of the present invention.

DESCRIPTION OF THE PREFERRED EMBODIMENTS (First Embodiment)

Hereinafter, a first embodiment of the present invention will be described with reference to the accompanying drawings.

Figure 1:
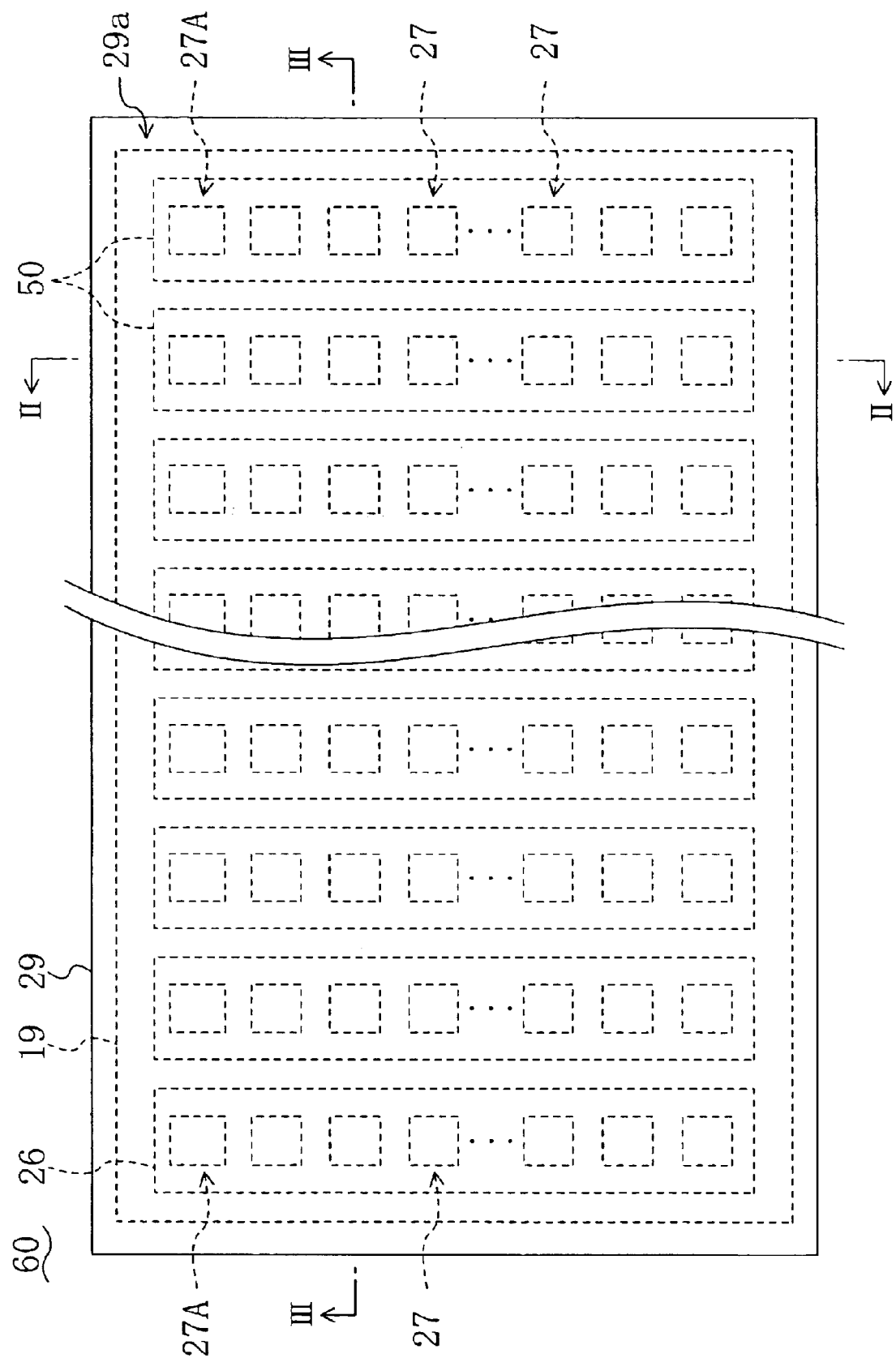
FIG. 1 is a plan view illustrating a cell block in a semiconductor device in accordance with a first embodiment of the present invention.
Figure 2:
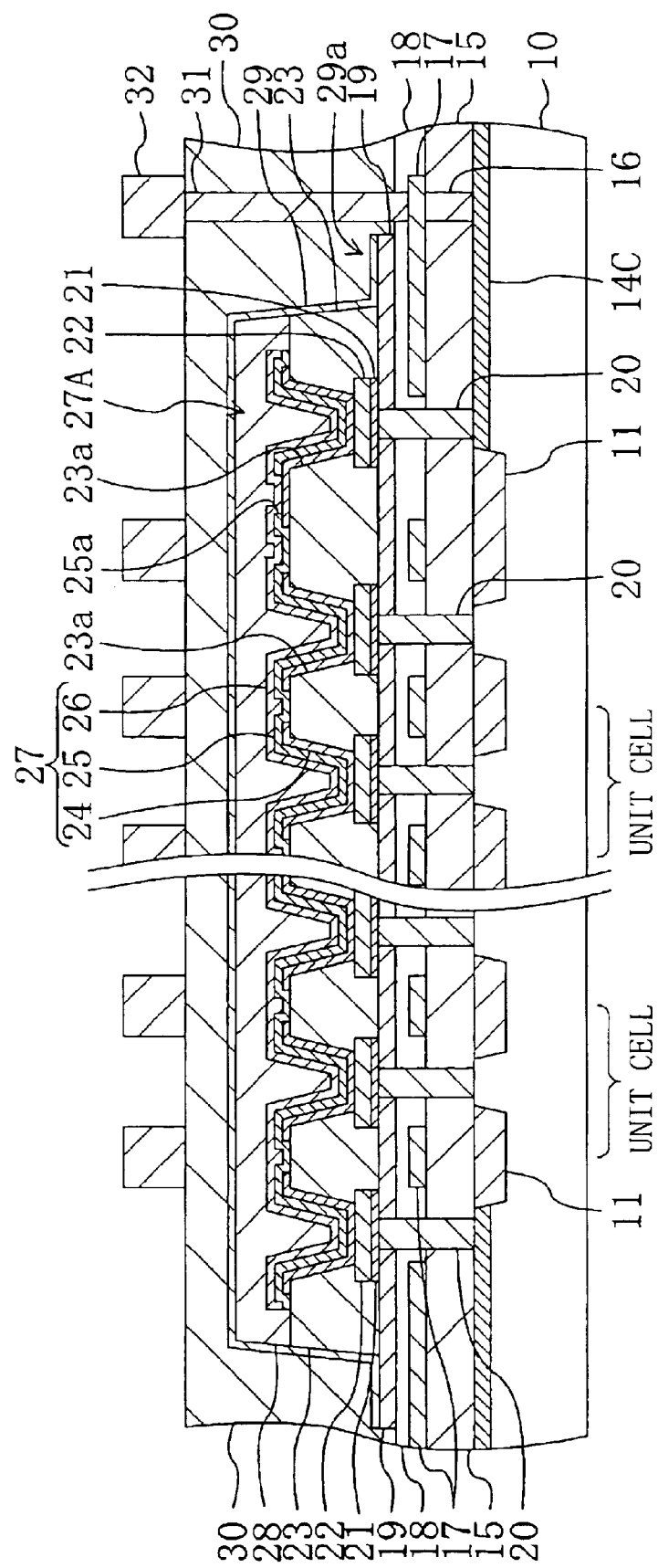
FIG. 2 illustrates the cross-sectional structure taken along the line II—II of FIG. 1.
Figure 3:
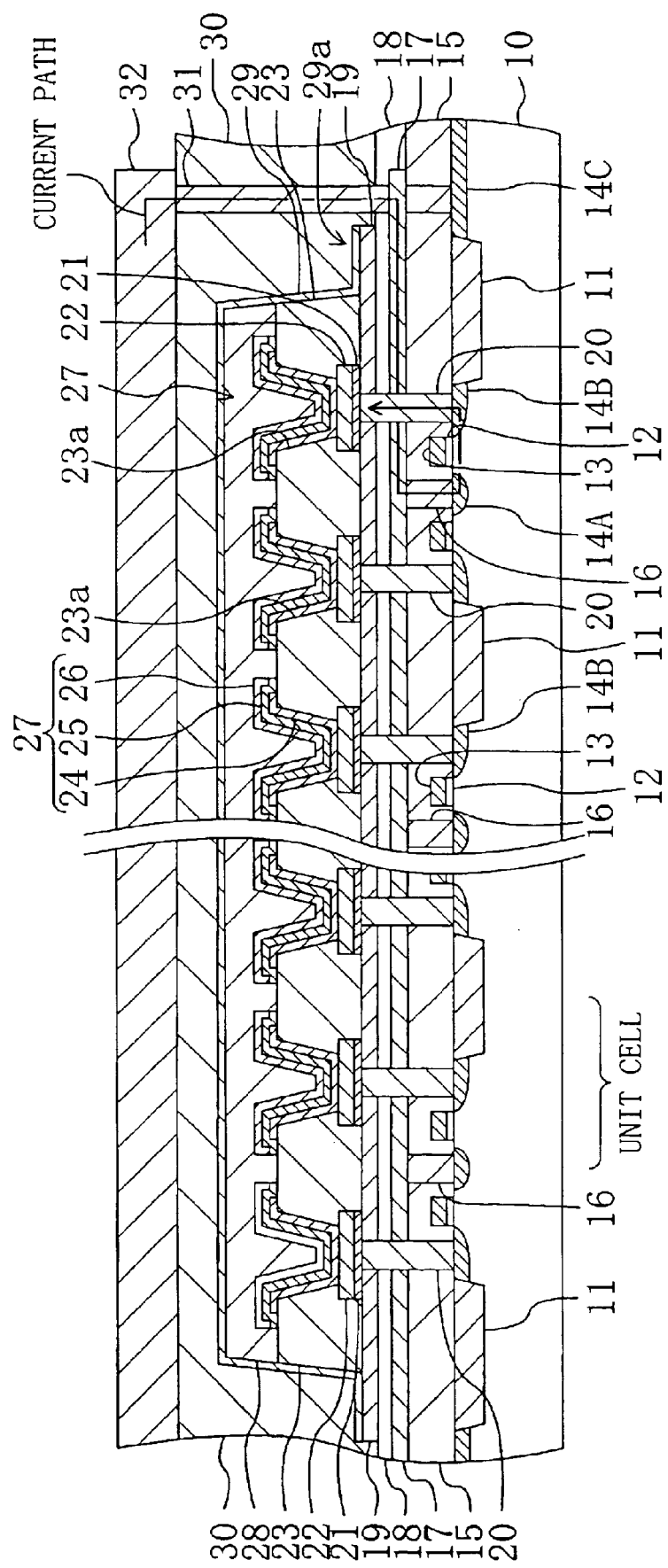
FIG. 3 illustrates the cross-sectional structure taken along the line III—III of FIG. 1.

FIG. 1 illustrates the plan configuration of a cell block in a semiconductor device in accordance with the first embodiment of the present invention. FIG. 2 illustrates the cross-sectional structure taken along the line II—II of FIG. 1, while FIG. 3 illustrates the cross-sectional structure taken along the line III—III of FIG. 1.

As shown in FIG. 1, an insulative lower hydrogen-barrier film 19 of silicon nitride ($Si_3N_4$) is formed over a semiconductor substrate of silicon (Si), for example. Over the insulative lower hydrogen-barrier film 19, a plurality of capacitors 27 are provided in the form of a matrix.

In each of the capacitor 27 groups that are disposed in the direction intersecting the direction in which bit lines extend, as will be described later, sixty-five upper electrodes, for example, are connected with each other, thereby forming a cell plate 50. In this embodiment, capacitors 27A, each located in an end portion of each cell plate 50, are conducting dummy capacitors for electrically connecting the semiconductor substrate with the cell plates 50. Accordingly, each cell plate 50 includes the sixty-four capacitors 27 substantially. Moreover, for instance, the cell plates 50, arranged, e.g., in sixty-four rows in the direction in which the bit lines extend, form a single cell block 60.

The first embodiment is characterized in that the single cell block 60 that includes the cell plates 50 is covered by an upper hydrogen-barrier film 29 made of, e.g., titanium aluminum oxide (TiAlO) having insulative property, and that the end portion (peripheral portion) of the upper hydrogen-barrier film 29 is connected to the end portion (peripheral portion) of the insulative lower hydrogen-barrier film 19 along a connecting portion 29a.

For instance, if sixteen cell blocks 60 are disposed in the direction in which the cell plates 50 extend, a capacitor array as a semiconductor memory device is formed. Needless to say, the number of capacitors 27 for a single cell plate, the number of cell plates 50 for a single cell block, and the number of cell blocks 60 for a single capacitor array are not limited to those above-mentioned figures.

Further, although the conducting dummy capacitors 27A are formed located in the respective end portions of the cell plates 50 in the first embodiment, the present invention is not limited to this structure, but the conducting dummy capacitor 27A may be formed in an inner portion of each cell plate 50. It should be noted, however, that as in this embodiment, in a case where the conducting dummy capacitors 27A are formed in such a manner as to be located in the respective end portions of the cell plates 50, even if part of the hydrogen-barrier film that covers the entire periphery of the capacitor rows disappears or becomes thin for some reason to permit hydrogen to enter into an inner portion of the capacitor rows, deterioration in the electrical characteristics of the inner capacitors 27 can be suppressed, because the conducting dummy capacitors 27A located in the end portions that are most susceptible to the hydrogen do not practically act as capacitors. Therefore, the structure of this embodiment is more effective.

The units in which the insulative lower hydrogen-barrier film 19 and the upper hydrogen-barrier film 29 cover the capacitors 27 may be capacitor units, may be cell-plate units, may be cell-block units, or may be capacitor-array units. Alternatively, the unit scheme may be a combination of the capacitor units, cell-plate units, and cell-block units.

Next, cross sectional structures of the cell block 60 will be described in detail.

As shown in FIGS. 2 and 3, isolation regions 11 having a depth of about 300 nm are selectively formed in the upper portion of a p-type semiconductor substrate 10, for example. On regions in the p-type-semiconductor-substrate 10 principal surface that are defined by the isolation regions 11, gate insulating films 12 with a thickness of about 10 nm are formed, and gate electrodes 13 of polysilicon having a thickness of about 200 nm are formed on the gate insulating films 12. Sidewall insulating films (not shown) having a thickness of about 50 nm are formed on the lateral faces of the gate electrodes 13. Further, formed in the upper portion of the p-type semiconductor substrate 10 are doped drain layers 14A, doped source layers 14B, and doped interconnect layers 14C, into which ions have been implanted with the gate electrodes 13 used as masks. In this manner, a plurality of MOS transistors, each including the gate insulating film 12, the gate electrode 13, the doped drain layer 14A, and the doped source layer 14B, form cell-selecting transistors in respective memory cells.

The MOS transistors are covered by a first interlayer dielectric film 15 of silicon oxide ($SiO_2$), which is planarized so as to have a thickness of about 200 nm in the portions thereof located on the gate electrodes 13. A plurality of first contact plugs 16, each made of tungsten (W), are formed in portions of the first interlayer dielectric film 15 located on the doped drain layers 14A, so as to be connected with the respective doped drain layers 14A. Although not shown, a barrier layer, which is in contact with the semiconductor substrate 10, and composed of an about 10 nm thick film of titanium (Ti) and an about 20 nm thick film of titanium nitride (TiN) stacked on the titanium film, is formed in the lower portion of each first contact plug 16 in order to enhance the adhesion of the tungsten to the doped drain layer 14A.

On the first interlayer dielectric film 15, bit lines 17, in which an about 10 nm thick film of titanium and an about 100 nm thick film of tungsten are sequentially deposited, are formed so as to be connected with the first contact plugs 16. In this manner, the doped drain layers 14A of the MOS transistors are electrically connected with the bit lines 17 via the first contact plugs 16.

The bit lines 17 are covered by a second interlayer dielectric film 18 of silicon oxide, which is planarized so that the portions thereof located on the bit lines 17 have a thickness of about 100 nm.

On the second interlayer dielectric film 18, an insulative lower hydrogen-barrier film 19 of silicon nitride having a thickness of from about 5 nm to about 200 nm, more preferably, having a thickness of about 100 nm, is formed. It should be noted that although silicon nitride is used to form the insulative lower hydrogen-barrier film 19 in this embodiment, the present invention is not limited to this, but silicon oxynitride (SiON), aluminum oxide ($Al_2O_3$), titanium aluminum oxide (TiAlO), tantalum aluminium oxide (TaAlO), titanium silicate oxide (TiSiO), or tantalum silicate oxide (TaSiO), for example, may be used instead.

In portions of the insulative lower hydrogen-barrier film 19, second interlayer dielectric film 18, and first interlayer dielectric film 15 that are located on and above the doped source layers 14B, a plurality of second contact plugs 20 of tungsten are formed passing through those portions, so as to be connected to the doped source layers 14B. As in the first contact plugs 16, formed in the lower portion of each second contact plug 20 is a barrier film (not shown) for the doped source layer 14B, which barrier film is composed of an about 10 nm thick film of titanium and an about 20 nm thick film of titanium nitride that have been sequentially stacked.

Figure 4:
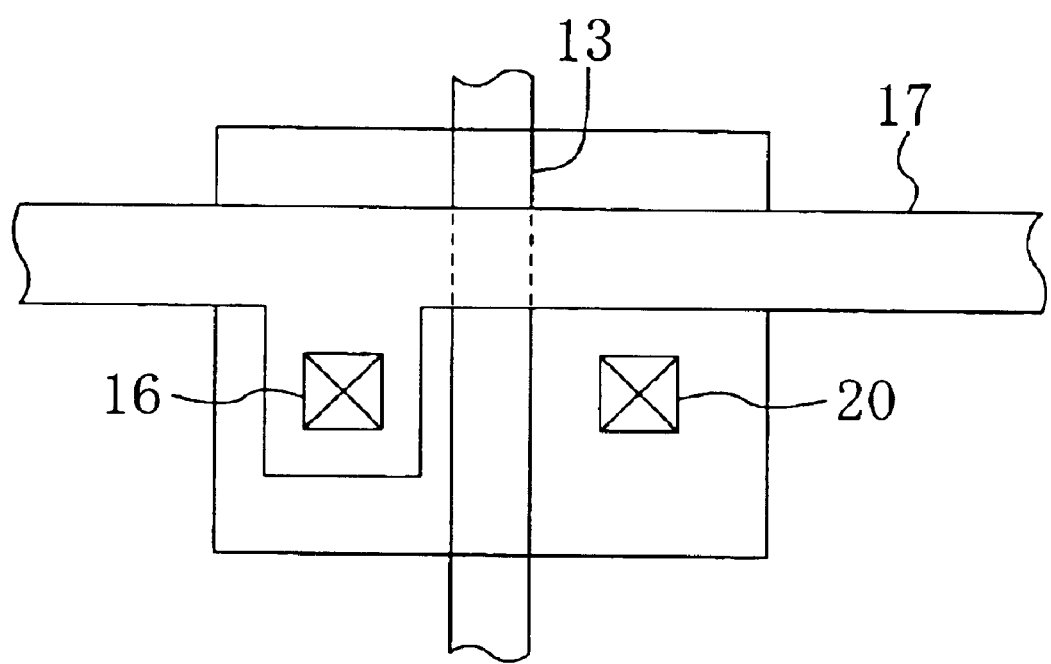
FIG. 4 is a plan view illustrating a layout for a first contact plug, bit line, and second contact plug in the semiconductor device in accordance with the first embodiment of the present invention.

FIG. 4 illustrates a layout for the first contact plug 16, bit line 17, and second contact plug 20.

A unit memory cell includes a MOS transistor, a capacitor 27 (not shown), and a bit line 17. The MOS transistor is composed of a doped drain layer 14A and a doped source layer 14B formed in the p-type semiconductor substrate 10, and a gate electrode 13. The capacitor 27, located above the MOS transistor, is connected with the doped source layer 14B of the MOS transistor via the second contact plug 20.

The bit line 17 is connected with the doped drain layer 14A of the MOS transistor via the first contact plug 16.

On the insulative lower hydrogen-barrier film 19, a plurality of conductive lower hydrogen-barrier films 21 of titanium-aluminum nitride (TiAlN) having a thickness of about 50 nm are selectively formed so as to cover the respective second contact plugs 20. Each conductive lower hydrogen-barrier film 21 is connected with its corresponding second contact plug 20 as well as with a portion of the insulative lower hydrogen-barrier film 19 around the second contact plug 20. Further, formed on each conductive lower hydrogen-barrier film 21 is an oxygen-barrier film 22 having the same shape as that of the conductive lower hydrogen-barrier film 21, and composed of an about 50 nm thick film of iridium (Ir) and an about 50 nm thick film of iridium oxide ($IrO_2$).

The oxygen-barrier films 22 are covered by a third interlayer dielectric film 23 of silicon oxide, which is planarized so that the portions thereof located on the oxygen-barrier films 22 have a thickness of about 500 nm. In the third interlayer dielectric film 23, contact holes 23a that expose the respective oxygen-barrier films 22 at least partially are formed so that the cross section of each contact hole 23a is tapered and flares upward.

On the bottom and wall surfaces of each contact hole 23a formed in the third interlayer dielectric film 23, a lower electrode 24, composed of an about 5 nm thick film of iridium oxide and an about 50 nm thick film of platinum (Pt), is formed along the shapes of the bottom and wall surfaces.

Capacitive insulating films 25, made of a ferroelectric material, a bismuth-layered perovskite oxide which has a thickness of about 50 nm, and whose major constituent is strontium (Sr), bismuth (Bi), tantalum (Ta), or niobium (Nb), are formed on the third interlayer dielectric film 23 as well as over the contact holes 23a so as to cover the lower electrodes 24. In each capacitive insulating film 25, an opening 25a is formed where the capacitive insulating film 25 is on the inner, planarized portion of the lower electrode 24 that is located in the end portion (the right end in FIG. 2), so that the opening 25a exposes the lower electrode 24.

On the capacitive insulating films 25, upper electrodes 26, which are made of an about 50 nm thick platinum film, and act as cell plates 50, are formed to cover the capacitive insulating films 25. In this manner, the capacitors 27, composed of the lower electrodes 24, the capacitive insulating films 25, and the upper electrodes 26, are formed, thereby forming the capacitor rows in which 1024 capacitors 27, for example, are included in a single block.

As described above, the upper electrodes 26 formed as the cell plates 50 are electrically connected with the lower electrodes 24 by the openings 25a formed in the capacitive insulating films 25. As a result, the capacitors located in the respective right ends of the capacitor rows become the conducting dummy capacitors 27A that do not have the original function as a capacitor, and their lower electrodes 24 are electrically connected with the doped interconnect layers 14C via the second contact plugs 20 that are connected to those lower electrodes 24. In this way, it is possible to supply a predetermined potential for the upper electrodes 26 of the capacitors 27 of the first embodiment from the semiconductor substrate 10 through the conductive lower hydrogen-barrier films 21 and the second contact plugs 20.

The upper electrodes 26 of the capacitors 27 are covered by a fourth interlayer dielectric film 28 of silicon oxide, which is planarized so that the portions thereof located on the upper electrodes 26 where the upper electrodes 26 are located on the planarized portions of the third interlayer dielectric film 23, have a thickness of about 300 nm. The fourth and third interlayer dielectric films 28 and 23 are removed where they are located outside the capacitor rows, in such a manner that the insulative lower hydrogen-barrier film 19 is exposed when viewed in plan view, and that the removed portion is tapered and flares upward when viewed in cross section. The respective exposed portions of the fourth interlayer dielectric film 28, third interlayer dielectric film 23, and insulative lower hydrogen-barrier film 19 are covered by an upper hydrogen-barrier film 29 made of an insulative, titanium aluminum oxide (TiAlO) film having a thickness of about 50 nm. Further, the upper hydrogen-barrier film 29 has a connection portion 29a having a connection width of about 500 nm in the planarized portion in which the upper hydrogen-barrier film 29 is connected with the insulative lower hydrogen-barrier film 19. And the respective portions of the upper hydrogen-barrier film 29 and insulative lower hydrogen-barrier film 19 which are externally beyond the connection portion 29a are removed so that the second interlayer dielectric film 18 is exposed.

The upper hydrogen-barrier film 29 and the exposed portion of the second interlayer dielectric film 18 are covered by a fifth interlayer dielectric film 30 of silicon oxide, which is planarized so that the portion thereof located on the upper hydrogen-barrier film 29 above the capacitor rows has a thickness of about 300 nm.

Third contact plugs 31 of tungsten are formed in the fifth interlayer dielectric film 30, and connected with the bit lines 17 in regions outside the capacitor rows, that is, outside the upper hydrogen-barrier film 29.

On the fifth interlayer dielectric film 30, formed so as to cover the third contact plugs 31 are interconnects 32 composed of an about 10 nm thick film of titanium (Ti), an about 50 nm thick film of titanium nitride (TiN), an about 500 nm thick film of aluminum (Al), and an about 50 nm thick film of titanium nitride (TiN) that are stacked in that order starting from the bottom layer. The interconnects 32 are connected with the bit lines 17 via the third contact plugs 31.

In the first embodiment, the capacitor rows that form the cell block 60 are covered throughout all directions—in the up-down direction and in the parallel direction—with respect to the substrate surface by the insulative lower hydrogen-barrier film 19 formed underneath the capacitor rows, by the conductive lower hydrogen-barrier films 21 electrically connected with the second contact plugs 20, and by the upper hydrogen-barrier film 29 provided above and to the lateral portion of, the capacitor rows. In addition, the upper hydrogen-barrier film 29 is formed in such a manner that its portion formed on the peripheral portion of the insulative lower hydrogen-barrier film 19 is directly connected to that peripheral portion, with the lateral and bottom faces of the upper hydrogen-barrier film 29 forming an obtuse-angled "L" in cross section. This structure produces sufficient coating-film thickness in the upper hydrogen-barrier film 29 in the cross-sectionally L-shaped bending portions, thereby enabling the connection portion to sufficiently function as a barrier against hydrogen. Accordingly, the capacitive insulating films 25, made of a ferroelectric material and included in the capacitors 27, are reliably prevented from deteriorating due to hydrogen.

Moreover, the upper hydrogen-barrier film 29 is formed for each cell block that includes the multiple capacitors 27. Therefore, unlike in a case in which a hydrogen-barrier film is formed for each unit cell that includes a MOS transistor and a capacitor 27 as a pair, the lateral barrier against hydrogen coming in the direction parallel with respect to the substrate surface is ensured without causing the cell area to increase.

Additionally, the conductive lower hydrogen-barrier film 21 is interposed between the lower electrode 24 of each capacitor 27 and its corresponding second contact plug 20, which provides electrical connection between the doped source layer 14B of the MOS transistor and the capacitor 27.

In FIG. 3, an arrow indicates a path in which a current is applied from the interconnect 32 to the lower electrode 24 of a capacitor 27.

Hereinafter, referring to the accompanying figures, it will be described how to fabricate a semiconductor device having the above-described structure.

FIGS. 5A through 5C, 6, 7, 8, and 9 are cross-sectional views illustrating sequential process steps for fabricating a semiconductor device in accordance with the first embodiment of the present invention. Those cross sections are taken in the direction along the line III—III of the FIG. 1, that is, the direction in which the bit lines extend (the direction that intersects the direction in which the cell plates extend).

[Formation of MOS Transistors]

Figure 5A:
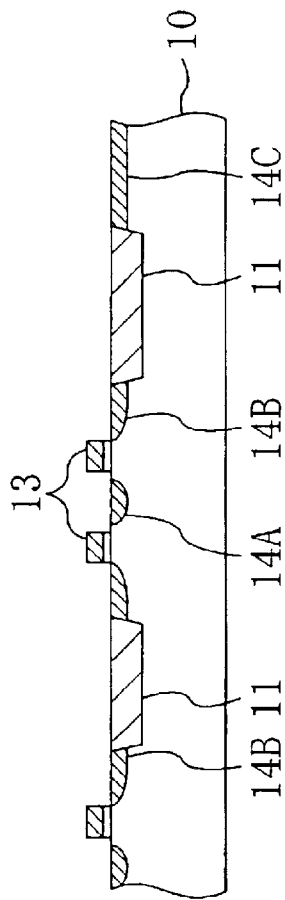
FIGS. 5A through 5C are cross-sectional views illustrating sequential process steps for fabricating the semiconductor device in accordance with the first embodiment of the present invention.

First, as shown in FIG. 5A, trenches with a depth of about 300 nm are formed in the upper portion of a p-type semiconductor substrate 10, e.g., of silicon by a lithography process and a dry-etching process. Subsequently, silicon oxide is deposited on the p-type semiconductor substrate 10 by a CVD process, and the deposited silicon oxide is then planarized by a chemical mechanical polishing (CMP) process so that the silicon oxide film is embedded in the trenches, thereby forming isolation regions 11 selectively. Thereafter, a gate insulating film of about 10 nm thickness is formed on the principal surface of the p-type semiconductor substrate 10 by a heat oxidation process, for example. Polysilicon is then deposited to a thickness of about 200 nm by a low-pressure CVD process, and the deposited polysilicon is patterned by a lithography process and a dry-etching process, thereby forming a plurality of gate electrodes 13 made of the polysilicon. Then, although not shown, silicon oxide is deposited to a thickness of about 50 nm on the p-type semiconductor substrate 10 by a CVD process so as to cover the gate electrodes 13, and an etchback is performed to form sidewall insulating films. Thereafter, with the gate electrodes 13 and the sidewalls acting as masks, a high concentration of arsenic ions, for example, are implanted into the p-type semiconductor substrate 10 to form n-type doped drain layers 14A and n-typed doped source layers 14B, thereby obtaining MOS transistors. At this time, doped interconnect layers 14C are selectively formed in the active regions, except the MOS-transistor formation regions, in the p-type semiconductor substrate 10.

[Formation of Bit Lines]

Figure 5B:
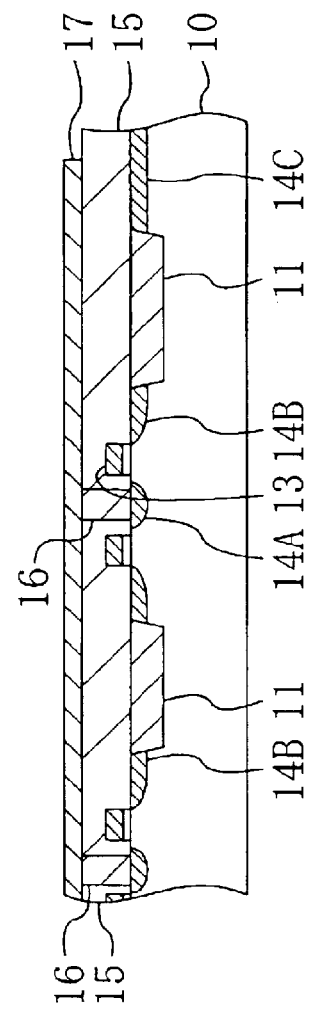

Next, as shown in FIG. 5B, after silicon oxide is deposited by a CVD process on the entire surface of the p-type semiconductor substrate 10 as well as on the gate electrodes 13, a CMP process is performed to planarize the deposited silicon oxide so that the portions thereof located on the gate electrodes 13 have a thickness of about 200 nm, thereby forming a first interlayer dielectric film 15 made of the silicon oxide. Then, contact holes are formed by a lithography process and a dry-etching process in portions of the first interlayer dielectric film 15 located on the n-type doped drain layers 14A so that the contact holes expose the n-type doped drain layers 14A. Thereafter, an about 10 nm thick film of titanium, an about 20 nm thick film of titanium nitride, and an about 300 nm thick film of tungsten are sequentially deposited on the first interlayer dielectric film 15 by a CVD process so that the contact holes are filled. This is followed by a process step for removing the portion of the deposited films that remains on the first interlayer dielectric film 15 by a CMP process. In this manner, first contact plugs 16, which are connected with the n-type doped drain layers 14A of the MOS transistors, are formed in the first interlayer dielectric film 15. Subsequently, an about 10 nm thick film of titanium and an about 100 nm thick film of tungsten are sequentially deposited on the first interlayer dielectric film 15 by a sputtering process, and the multilayer film of the stacked metals is then patterned by a lithography process and a dry-etching process, so that bit lines 17, which are connected with the first contact plugs 16, are formed out of the multilayer metal film.

Although silicon oxide is used herein to form the first interlayer dielectric film 15, more specifically, so-called BPSG (boro-phospho-silicate glass), in which boron (B) and phosphorus (P) are added, so-called HDP-NSG (high density plasma-non silicate glass), which is formed by high-density plasma and in which no boron and no phosphorus are added, or $O_3$-NGS, in which ozone ($O_3$) is used in an oxidizing atmosphere, may be used. Further, the first interlayer dielectric film 15, after planarized, may have a thickness of from about 100 nm to about 500 nm where it is located on the gate electrodes 13.

This embodiment describes an exemplary case in which a semiconductor substrate of silicon is used as the p-type semiconductor substrate 10, and Nch-type MOS transistors are formed in the p-type semiconductor substrate 10. However, the present invention is effective in cases in which an n-type semiconductor substrate is used and Pch-type MOS transistors are formed in the n-type semiconductor substrate.

[Formation of Lower Hydrogen-barrier Films]

Figure 5C:
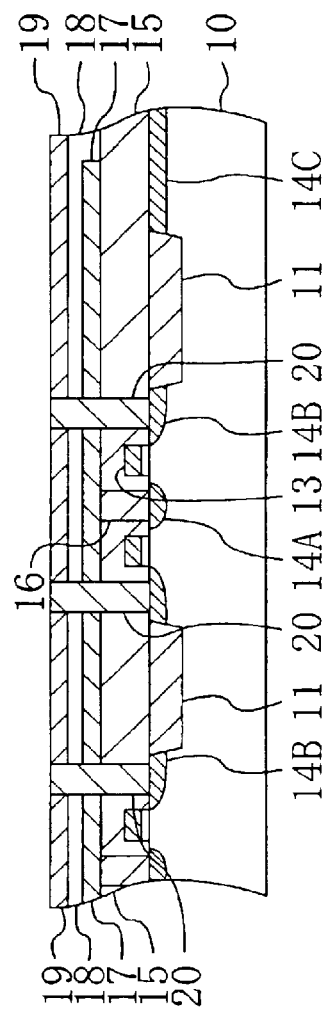

Subsequently, as shown in FIG. 5C, after silicon oxide is deposited on the entire surface of the first interlayer dielectric film 15 as well as on the bit lines 17 by a CVD process, for example, a CMP process is performed to planarize the deposited silicon oxide so that the portions thereof located on the bit lines 17 have a thickness of about 100 nm, thereby forming a second interlayer dielectric film 18 made of the silicon oxide. An insulative lower hydrogen-barrier film 19 of silicon nitride having a thickness of about 100 nm is then deposited on the second interlayer dielectric film 18 by a CVD process. Thereafter, contact holes are formed by a lithography process and a dry-etching process in regions located on the doped source regions 14B of the MOS transistors and on the doped interconnect layers 14C so that the contact holes expose the doped source layers 14B and the doped interconnect layers 14C. Then, an about 10 nm thick film of titanium, an about 20 nm thick film of titanium nitride, and an about 300 nm thick film of tungsten are sequentially deposited on the insulative lower hydrogen-barrier film 19 by a CVD process so that the contact holes are filled. This is followed by a process step for removing the portion of the deposited films that remains on the insulative lower hydrogen-barrier film 19 by a CMP process. In this manner, second contact plugs 20, which are connected with the doped source layers 14B of the MOS transistors and the doped interconnect layers 14C, are formed passing through the insulative lower hydrogen-barrier film 19, the second interlayer dielectric film 18, and the first interlayer dielectric film 15.

Silicon oxide such as BPSG, HDP-NSG, or $O_3$-NSG may also be used to form the second interlayer dielectric film 18.

Further, the second interlayer dielectric film 18, after planarized, may have a thickness of from 0 nm to about 500 nm where it is located on the bit lines 17.

Subsequently, as shown in FIG. 6A, titanium aluminum nitride, iridium, and iridium oxide, each having a thickness of about 50 nm, are sequentially deposited on the entire surface of the insulative lower hydrogen-barrier film 19 as well as on the upper surfaces of the second contact plugs 20 by a sputtering process, for example. These stacked films are then patterned by a lithography process and a dry-etching process so that the portions thereof covering the second contact plugs 20 are left, thereby forming conductive lower hydrogen-barrier films 21 made of the titanium aluminum nitride, and oxygen-barrier films 22 made of the iridium and the iridium oxide. In this manner, the central portion of the lower face of each conductive lower hydrogen-barrier film 21 is connected with the second contact plug 20, while the peripheral portion thereof is connected with the insulative lower hydrogen-barrier film 19.

Although an about 100 nm thick film of silicon nitride is used herein to form the insulative lower hydrogen-barrier film 19, the present invention is not limited to this, but instead of silicon nitride, silicon oxynitride (SiON), aluminum oxide ($Al_2O_3$), titanium aluminum oxide (TiAlO), tantalum aluminum oxide (TaAlO), titanium silicate oxide (TiSiO), or tantalum silicate oxide (TaSiO) may be used. Further, it is effective that the insulative lower hydrogen-barrier film 19 has a thickness of from about 5 nm to about 200 nm.

Further, an about 50 nm thick film of titanium aluminum nitride is used to form the conductive lower hydrogen-barrier films 21. However, instead of this, titanium silicide nitride (TiSiN), tantalum nitride (TaN), tantalum silicide nitride (TaSiN), tantalum aluminum nitride (TaAlN), or tantalum aluminum (TaAl) may be used. It is effective that the conductive lower hydrogen-barrier films 21 have a thickness of from about 5 nm to about 200 nm.

Also, although a multilayer film that is composed of iridium and iridium oxide films each having a thickness of about 50 nm, is used to form the oxygen-barrier films 22, an iridium oxide film or a ruthenium oxide ($RuO_2$) film, having a thickness of from about 50 nm to about 300 nm, may be used instead. Alternatively, a multilayer film composed of a ruthenium film and a ruthenium oxide film, each having a thickness of from about 50 nm to about 300 nm, that are formed sequentially starting from the bottom layer, may be used. Or a multilayer film that includes at least two of these single-layer and multilayer films may also be used.

Further, although in the first embodiment, a CVD process is used to form the insulative lower hydrogen-barrier film 19, while a sputtering process is used to form the conductive lower hydrogen-barrier films 21, the present invention is not limited thereto. For instance, a sputtering process may be used to form the insulative lower hydrogen-barrier film 19, and a CVD process may be used to form the conductive lower hydrogen-barrier films 21.

[Formation of Capacitors]

Next, as shown in FIG. 6B, after silicon oxide is deposited by a CVD process on the entire surface of the insulative lower hydrogen-barrier film 19 as well as on the oxygen-barrier films 22, a CMP process is performed to planarize the deposited silicon oxide so that the portions thereof located on the oxygen-barrier films 22 have a thickness of about 500 nm, thereby forming a third interlayer dielectric film 23 made of the silicon oxide. In this process step, silicon oxide such as BPSG, HDP-NSG, or $O_3$-NSG may also be used to form the third interlayer dielectric film 23. Further, the thickness of the third interlayer dielectric film 23, which determines the capacitor size, may be from about 100 nm to about 1000 nm after the planarization process. As the thickness of the third interlayer dielectric film 23 after the planarization process increases, the respective effective areas and thus capacitance of the capacitors increase. On the other hand, the smaller the post-planarization thickness is, the easier the processing of the capacitors becomes.

Then, contact holes 23a are formed by a lithography process and a dry-etching process in portions of the third interlayer dielectric film 23 located on the oxygen-barrier films 22 so that the contact holes 23a expose the oxygen-barrier films 22. Since a capacitor is formed on the wall surfaces and bottom of each contact hole 23a, the contact holes 23a are preferably tapered and flare upward in cross section, in order to increase the coverage of, e.g., lower electrodes 24 on the wall surfaces and in the bottom corners. To attain such a tapered shape, an etching gas whose major constituent is fluorocarbon, for example, may be used.

Subsequently, an about 5 nm thick film of iridium oxide and an about 50 nm thick film of platinum are sequentially deposited by a sputtering process on the entire surface of the third interlayer dielectric film 23 as well as on the wall surfaces and bottoms of the contact holes 23a. The deposited films are then patterned by a lithography process and a dry-etching process so that their portions that cover the contact holes 23a are left, thereby forming lower electrodes 24 out of the deposited films. Then, a metal organic chemical vapor deposition (MOCVD) process is performed to deposit a capacitive insulating film 25 on the entire surface of the third interlayer dielectric film 23 as well as over the contact holes 23a, which capacitive insulating film 25 has a thickness of about 50 nm and is made of a ferroelectric material, which is a bismuth-layered perovskite oxide whose major constituent is strontium, bismuth, tantalum, or niobium. Thereafter, openings 25a for exposing the lower electrodes 24 are formed in the capacitive insulating film 25, each opening 25a being located between the one of the second contact plugs 20 that is located in an end portion of each capacitor row, which will be formed in a later process step, and its adjacent contact plug, for example. Then, platinum is deposited to a thickness of about 50 nm on the capacitive insulating film 25 by a sputtering process, and the deposited platinum and the capacitive insulating film 25 are patterned so that their portions that cover the lower electrodes 24 are left, thereby forming upper electrodes 26 of the platinum, which also act as cell plates 50. Through these process steps, a plurality of capacitors 27, each including the lower electrode 24, the capacitive insulating film 25, and the upper electrode 26, are formed in the contact holes 23a. Each capacitor 27 is electrically connected with the doped source layer 14B of the corresponding MOS transistor via the lower electrode 24, the oxygen-barrier film 22, the conductive lower hydrogen-barrier film 21 and the second contact plug 20. The capacitors formed over the second contact plugs 20 that are connected with the doped interconnect layers 14C are formed as conducting dummy capacitors 27A, because as shown in FIG. 2, the openings 25a that expose the lower electrodes 24 are filled with the material that forms the upper electrodes 26, so that the upper electrodes 26 are shorted with the lower electrodes 24 of the conducting dummy capacitors 27A.

It should be noted that although an about 50 nm thick film of platinum is used to form the lower electrodes 24 and the upper electrodes 26, other elements of the platinum group may be used instead of platinum. Specifically, ruthenium (Ru), rhodium (Rh), palladium (Pd), osmium (Os), or iridium (Ir) may be used. The lower electrodes 24 and the upper electrodes 26 preferably have a thickness of from about 10 nm to about 200 nm.

Moreover, although in this embodiment oxygen-barrier films of iridium oxide are provided as the respective lowermost layers in the lower electrodes 24, ruthenium oxide may be used in place of iridium oxide. Further, it should be noted that the oxygen-barrier films do not necessarily have to be formed as the respective lowermost layers in the lower electrodes 24, if the conductive lower hydrogen-barrier films 21 also have the property of functioning as a barrier against oxygen.

In addition, the capacitive insulating films 25 may be made of an about 50 nm thick film of a ferroelectric material, which is a bismuth-layered perovskite oxide whose major constituent is strontium, bismuth, tantalum, or niobium, which is expressed by the general formula, for example, $SrBi_2(Ta_xNb_{1-x})_2O_9$, $Pb(Zr_xTi_{1-x})O_3$, $(Ba_xSr_{1-x})TiO_3$, or $(Bi_xLa_{1-x})_4Ti_3O_{12}$ (wherein $0 \leq x \leq 1$ in the formulas). Alternatively, tantalum pentoxide ($Ta_2O_5$), which is a high dielectric material, may also be used. The capacitive insulating films 25 preferably have a thickness of from about 50 nm to about 200 nm.

[Formation of Upper Hydrogen-barrier Film]

Figure 7:
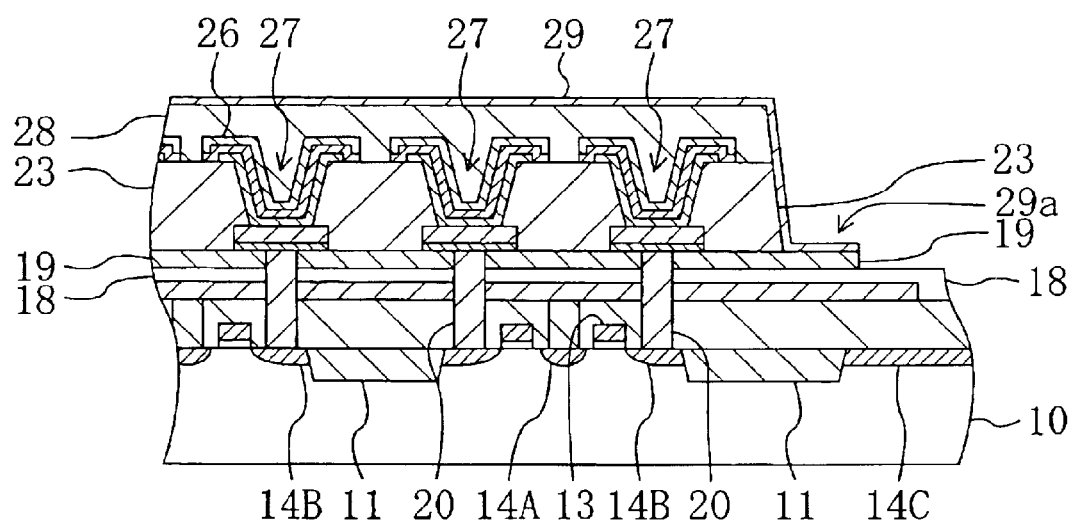
FIG. 7 is a cross-sectional view illustrating a process step for fabricating the semiconductor device in accordance with the first embodiment of the present invention.

Next, as shown in FIG. 7, after silicon oxide is deposited by a CVD process on the entire surface of the third interlayer dielectric film 23 as well as on the upper electrodes 26 of the capacitors 27, a CMP process is performed to planarize the deposited silicon oxide so that the portions thereof located on the upper electrodes 26 where the upper electrodes 26 are located over the planarized portions of the third interlayer dielectric film 23 have a thickness of about 300 nm, thereby forming a fourth interlayer dielectric film 28 made of the silicon oxide. Then, while the third and fourth interlayer dielectric films 23 and 28 are masked where they are included in the cell block, a lithography process and a dry-etching process are performed to remove the unmasked portions thereof located outside the masked portions, thereby exposing the insulative lower hydrogen-barrier film 19. In this process step, the portions of the third and fourth interlayer dielectric films 23 and 28 that are externally beyond the capacitor rows when viewed in plan view, are removed in such a manner as to be tapered and flare upward when viewed in cross section. Subsequently, an upper hydrogen-barrier film 29 of an about 50 nm thick film of titanium aluminum oxide is deposited on the top surface and end faces of the fourth interlayer dielectric film 28, on the end faces of the third interlayer dielectric film 23, and on the exposed face of the insulative lower hydrogen-barrier film 19. Then, the upper hydrogen-barrier film 29 is connected with the insulative lower hydrogen-barrier film 19 where they are located outside the cell block. Thereafter, the respective portions of the upper hydrogen-barrier film 29 and insulative lower hydrogen-barrier film 19 that are located outside the cell block are removed by dry-etching in such a manner as to leave the connection portion 29a of the upper hydrogen-barrier film 29 with a width of only about 500 nm.

Silicon oxide such as BPSG, HDP-NSG, or $O_3$-NSG may also be used to form the fourth interlayer dielectric film 28. Further, the fourth interlayer dielectric film 28 located on the upper electrodes 26 may have a thickness of from 0 nm to about 500 nm after the planarization process has been performed.

Figure 8:
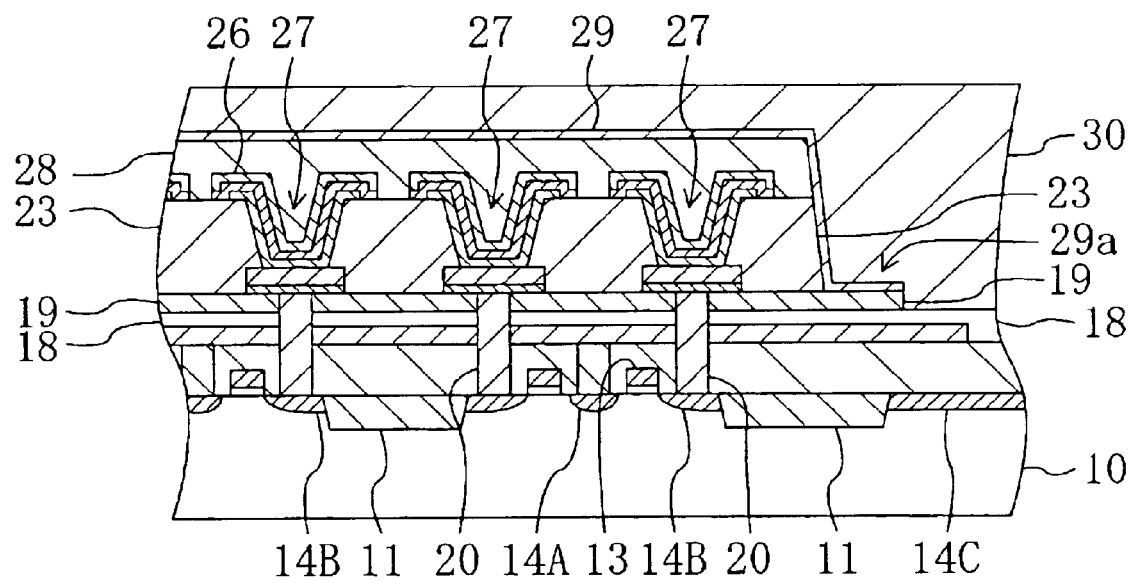
FIG. 8 is a cross-sectional view illustrating a process step for fabricating the semiconductor device in accordance with the first embodiment of the present invention.

Next, as shown in FIG. 8, after silicon oxide is deposited by a CVD process on the entire surfaces of the upper hydrogen-barrier film 29 and second interlayer dielectric film 18, a CMP process is performed to planarize the deposited silicon oxide so that the portion thereof located on the upper hydrogen-barrier film 29 where the upper hydrogen-barrier film 29 is located above the capacitor rows, has a thickness of about 300 nm, thereby forming a fifth interlayer dielectric film 30 made of the silicon oxide.

Although an about 50 nm thick film of titanium aluminum oxide is used to form the upper hydrogen-barrier film 29, the present invention is not limited thereto, but silicon nitride, silicon oxynitride, aluminum oxide, tantalum aluminum oxide, titanium silicate oxide, or tantalum silicate oxide may also be used. It should be noted that the upper hydrogen-barrier film 29, when formed to have a thickness of from about 5 nm to about 200 nm, sufficiently functions as a barrier against hydrogen.

Moreover, silicon oxide such as BPSG, HDP-NSG, or $O_3$-NSG may be used to form the fifth interlayer dielectric film 30. Further, the fifth interlayer dielectric film 30 may have a thickness of from 0 nm to about 500 nm after the planarization process has been performed.

[Formation of Interconnects]

Figure 9:
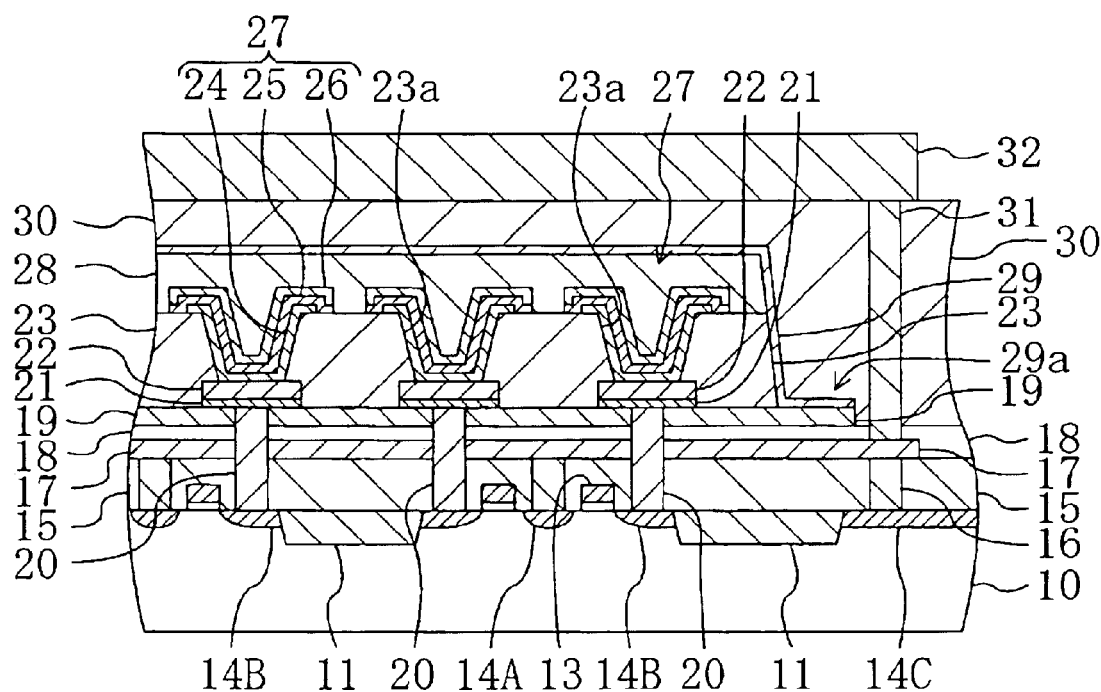
FIG. 9 is a cross-sectional view illustrating a process step for fabricating the semiconductor device in accordance with the first embodiment of the present invention.

Next, as shown in FIG. 9, contact holes that expose the bit lines 17 are selectively formed in portions of the fifth interlayer dielectric film 30 that are located outside the cell block. Thereafter, an about 10 nm thick film of titanium, an about 20 nm thick film of titanium nitride, and an about 300 nm thick film of tungsten are sequentially deposited on the fifth interlayer dielectric film 30 by a CVD process so that the contact holes are filled. This is followed by a process step for removing the portion of the deposited films that remains on the fifth interlayer dielectric film 30 by a CMP process. In this manner, third contact plugs 31, which are connected with the bit lines 17, are formed in the fifth interlayer dielectric film 30. Subsequently, an about 10 nm thick film of titanium, an about 50 nm thick film of titanium nitride, an about 500 nm thick film of aluminum, and an about 50 nm thick film of titanium nitride are sequentially deposited on the fifth interlayer dielectric film 30 by a sputtering process. The deposited multilayer film is then patterned by a dry-etching process. In this way, interconnects 32, which are connected with the third contact plugs 31, are formed out of the multilayer film.

Next, although not shown, known fabrication processes for forming multilevel interconnects, passivation films, and pads, for example, are performed to obtain the desired semiconductor device.

As described above, in the semiconductor device fabrication method in accordance with the first embodiment, the insulative lower hydrogen-barrier film 19 is provided under the cell block that includes the capacitors 27 and the conducting dummy capacitors 27A, while the top and lateral faces of the cell block are covered by the upper hydrogen-barrier film 29 having the connection portion 29a in contact with the insulative lower hydrogen-barrier film 19. Further, the conductive lower hydrogen-barrier films 21 are formed on the second contact plugs 20 that pass through the insulative lower hydrogen-barrier film 19, so that the conductive lower hydrogen-barrier films 21 are connected in their respective peripheral portions to the insulative lower hydrogen-barrier film 19, while covering the upper surfaces of the second contact plugs 20. Therefore, no hydrogen enters from between the insulative lower hydrogen-barrier film 19 and the conductive lower hydrogen-barrier films 21.

Further, as described above, the upper electrodes 26 of the capacitors 27, forming the cell plates 50, are allowed to be electrically connected to the doped interconnect layers 14C in the semiconductor substrate 10 by the conducting dummy capacitors 27A formed in the respective end portions of the capacitor rows. This eliminates the need for forming, in the upper hydrogen-barrier film 29, openings for the interconnects for supplying a potential to the upper electrodes 26, which therefore ensures that the properties of the upper hydrogen-barrier film 29 as a barrier are maintained. In addition, the doped interconnect layers 14C provided in the semiconductor substrate 10 may be formed in the ion-implantation process step in which the doped drain layers 14A and doped source layers 14B of the MOS transistors are formed. Moreover, since the second contact plugs 20 and the conducting dummy capacitors 27A may be simultaneously formed in the process step for forming the capacitor rows, the number of fabrication process steps does not have to be increased.

Figure 10:
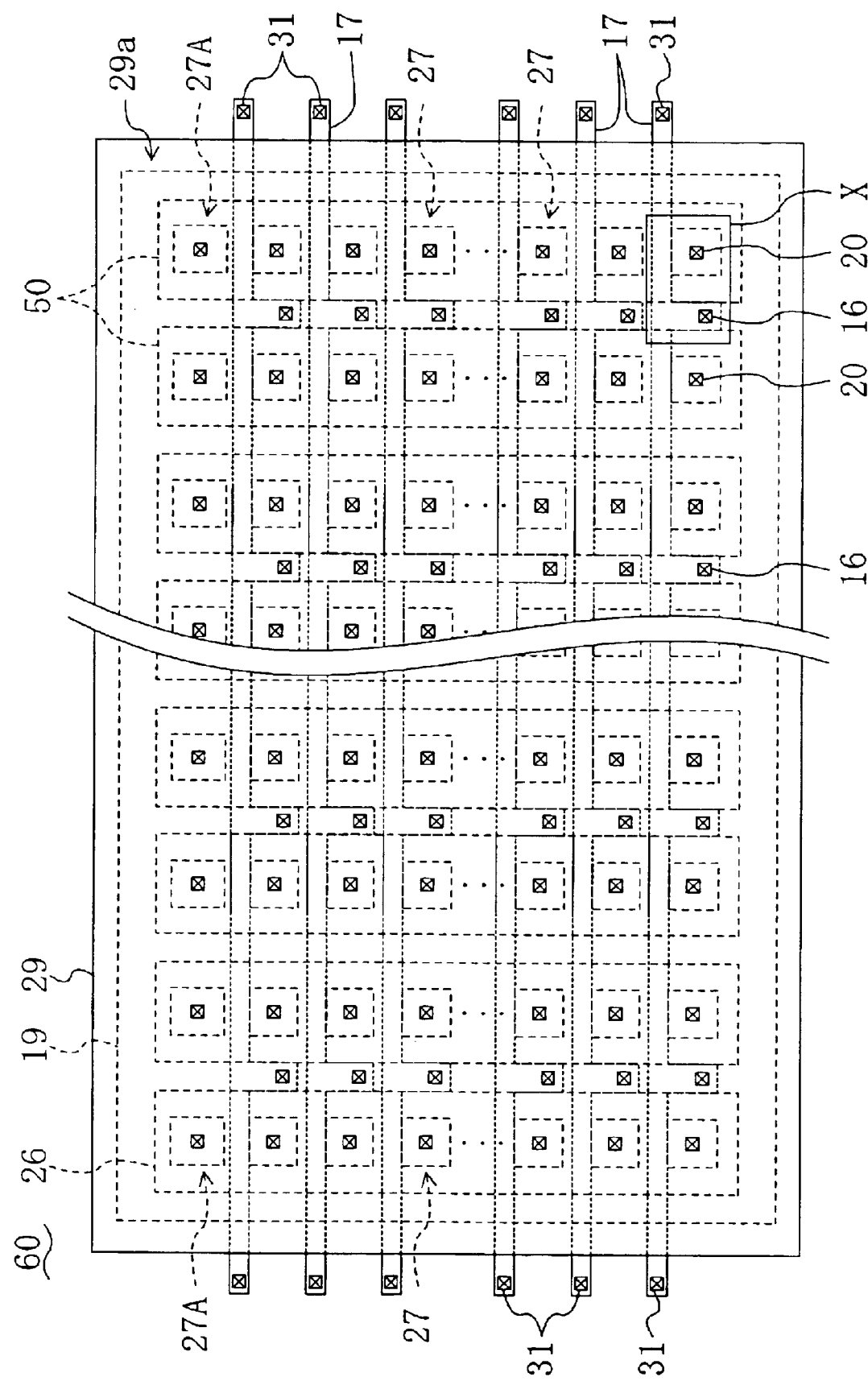
FIG. 10 is a plan view illustrating the details of the cell block in the semiconductor device in accordance with the first embodiment of the present invention.

Furthermore, as shown in FIG. 3, in the semiconductor device of the first embodiment, the bit lines 17, which are connected via the first contact plugs 16 to the doped drain layers 14A of the MOS transistors, are provided below the capacitors 27, and interposed between the insulative lower hydrogen-barrier film 19 and the p-type semiconductor substrate 10. Thus, unlike the known configuration in which bit-line contacts that connect interconnects located above the capacitors with doped layers in the semiconductor substrate are provided between neighboring capacitors, the present invention allows the area of the unit memory cell to be decreased by an area equivalent to the margin of the conventional bit-line contact (that is, the contact formation region.) Therefore, as shown in FIG. 10, which is a plan view of the memory cell as seen from the top of FIG. 3, the first contact plugs 16 are permitted to be provided beneath regions located between neighboring capacitors 27, while requiring the smallest margin.

Hereinafter, FIG. 10 will be discussed in detail. FIG. 10 is a plan view showing the details of the cell block 60 in the semiconductor device of the first embodiment. As shown in FIG. 10, the cell block 60 includes the plurality of capacitors 27 arranged in a matrix over the semiconductor substrate. As mentioned above, in the capacitor 27 rows arranged upwardly and downwardly in the figure, the upper electrodes (not shown) are connected with one another to form the cell plates 50.

The bit lines 17, connected to the doped layers (not shown) of the MOS transistors, are formed between the capacitors 27 that are ranged in the direction (left-right direction in the figure) intersecting the direction in which the cell plates 50 extend, and located below the capacitors 27. The first contact plugs 16 are formed in every other row between neighboring second contact plugs 20 located underneath the capacitors 27. The first contact plugs 16 are connected to the bit lines 17. The region X shown in FIG. 10 corresponds to the unit memory cell illustrated in FIG. 4.

The bit lines 17 are connected via the third contact plugs 31 to the interconnects (not shown) formed above the capacitors 27, where the bit lines 17 are located outside the cell block 60. Further, the insulative lower hydrogen-barrier film 19 is connected with the upper hydrogen-barrier film 29 in the peripheral portion of the cell block 60. In this manner, the capacitors 27 included in the cell block 60 are covered as a whole by the insulative lower hydrogen-barrier film 19 and the upper hydrogen-barrier film 29.

It should be noted that FIG. 2 is a cross-sectional view taken in the direction in which the cell plates 50 extend in FIG. 10, while FIG. 3 is a cross-sectional view taken in the direction in which the bit lines extend in FIG. 10.

As described above, since the bit lines 17 are provided underneath the insulative lower hydrogen-barrier film 19, the capacitors 27 are allowed to be covered as a whole by the upper hydrogen-barrier film 29 and the insulative lower hydrogen-barrier film 19. This structure results in the removal of the connecting portions of the upper and insulative lower hydrogen-barrier films, formed between neighboring capacitors in the prior art example, and thus the removal of the margins around the connecting portions. Therefore, as shown in FIG. 10, the upper hydrogen-barrier film is connected with the lower hydrogen-barrier film along the connection portion 29a alone, which is the end portion of the capacitor 27 rows. Consequently, the area that the unit memory cell shown in FIG. 4 occupies is reduced to about half as compared to that of the prior art example. In other words, providing the bit lines 17 underneath the insulative lower hydrogen-barrier film 19 allows the memory cells to be highly integrated in the direction in which the bit lines 17 extend.

Moreover, since the bit lines 17 are located between the semiconductor substrate 10 and the insulative lower hydrogen-barrier film 19, the first contact plugs 16 connecting the doped drain layers 14A of the MOS transistors to the bit lines 17 are allowed to be formed shallowly. Thus, when contact holes for the first contact plugs 16 are formed, the amount of etching required is reduced.

Furthermore, the bit lines 17, while being formed underneath the insulative lower hydrogen-barrier film 19 as shown in FIG. 3, are connected via the third contact plugs 31 to the interconnects (not shown) provided above the capacitors 27, where the insulative lower hydrogen-barrier film 19 and the upper hydrogen-barrier film 29 that cover the capacitors 27 are not present, that is, where the bit lines 17 are externally beyond the insulative lower hydrogen-barrier film 19 and the upper hydrogen-barrier film 29 as shown in FIGS. 3 and 10. Therefore, unlike in the conventional configuration in which contact plugs that connect the interconnects above the capacitors to the doped layers of the MOS transistors are formed directly on the doped layers, in the present invention the third contact plugs 31 connected with the interconnects do not need to be formed directly on the doped drain layers 14A of the MOS transistors. More specifically, the connection between the bit lines 17 and the interconnects (not shown) is established without forming through-holes in the insulative lower hydrogen-barrier film 19 and the upper hydrogen-barrier film 29. This eliminates the need to form openings in the respective hydrogen-barrier films, thus enabling the hydrogen-barrier films to prevent hydrogen from entering the capacitive insulating films 25.

Furthermore, the third contact plugs 31, electrically connecting the interconnects to the bit lines 17 that are formed above the semiconductor substrate 10 but underneath the insulative lower hydrogen-barrier film 19, require shallower contact holes than the conventional contact plugs that connect the doped layers to the interconnects. Thus, when an interlayer dielectric film is etched to form the third contact plugs 31, the amount of etching required is allowed to be decrease, which consequently suppresses adverse effect of the etching of the interlayer dielectric film on the capacitors 27, thereby preventing deterioration in the characteristics of the capacitors 27.

(Second Embodiment)

Hereinafter, a second embodiment of the present invention will be described with reference to the accompanying drawings.

Figure 11:
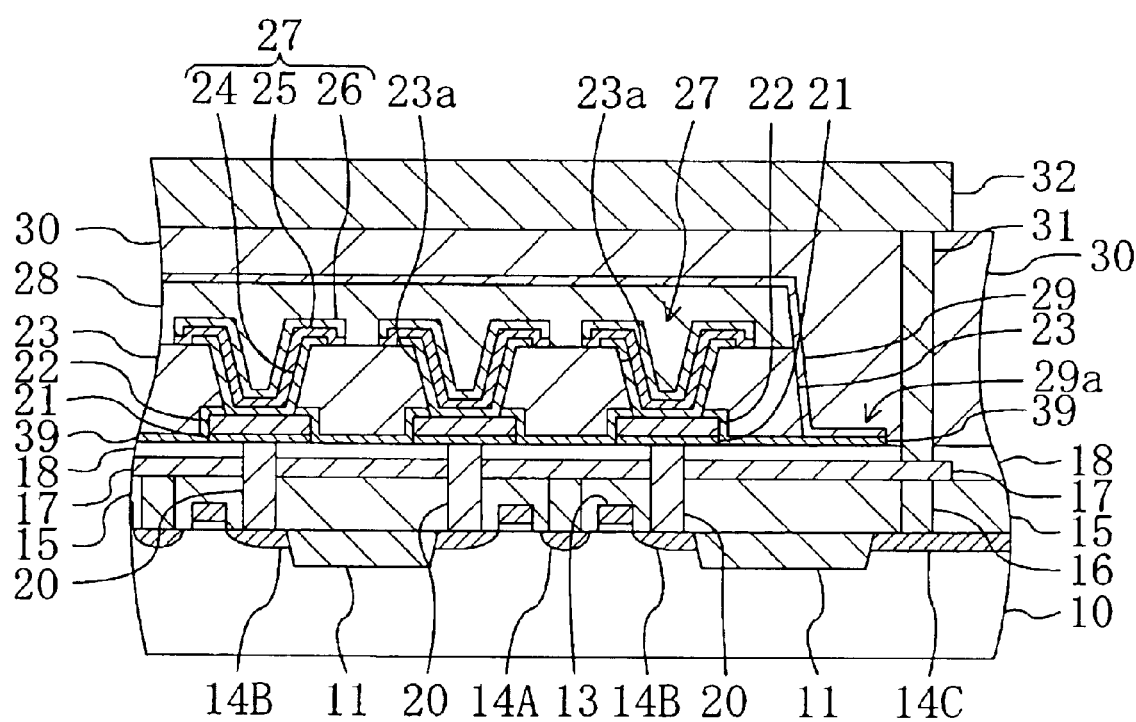
FIG. 11 shows a partial cross-sectional structure of a semiconductor device in accordance with a second embodiment of the present invention.

FIG. 11 shows a partial cross-sectional structure of a semiconductor device in accordance with the second embodiment of the present invention. In FIG. 11, the same members as those shown in FIG. 3 are identified by the same reference numerals and the description thereof will be omitted herein.

In the semiconductor device of the second embodiment, conductive lower hydrogen-barrier films 21, which cover the upper surfaces of second contact plugs 20 that are connected to doped source regions 14B of MOS transistors or doped interconnect layers 14C, are formed directly on a second interlayer dielectric film 18 that covers bit lines 17. Further, an insulative lower hydrogen-barrier film 39 of titanium aluminum oxide is formed on the second interlayer dielectric film 18 so that the insulative lower hydrogen-barrier film 39 covers the lateral/edge faces of the conductive lower hydrogen-barrier films 21 and oxygen-barrier films 22.

Hereinafter, referring to the accompanying drawings, it will be described how to fabricate a semiconductor device that has the above-mentioned structure. This embodiment will be described only in terms of its differences from the fabrication method of the first embodiment.

Figure 12A:
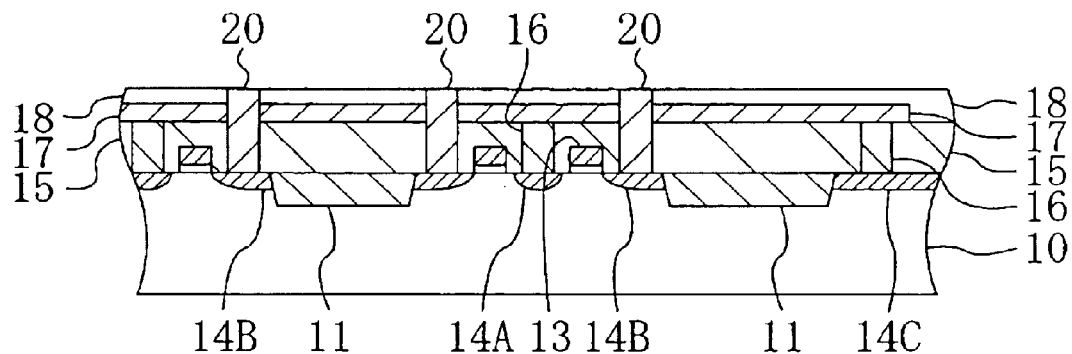
FIGS. 12A and 12B are cross-sectional views illustrating some of the process steps for fabricating the semiconductor device in accordance with the second embodiment of the present invention.
Figure 12B:
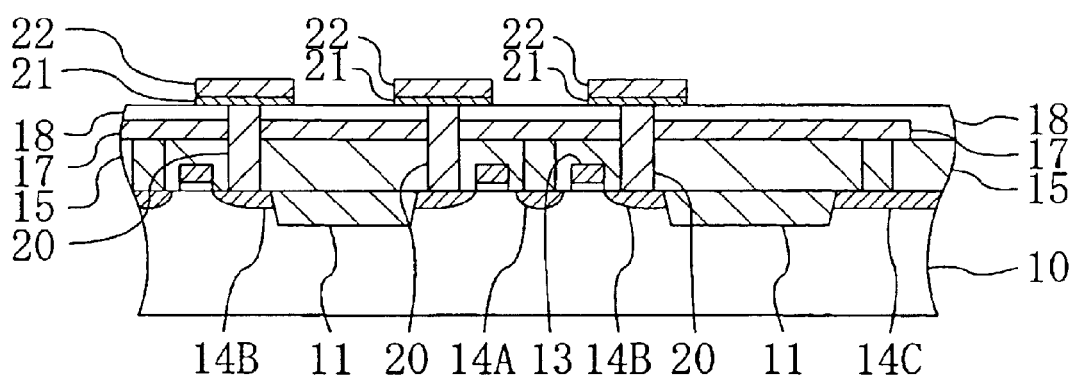
Figure 13:
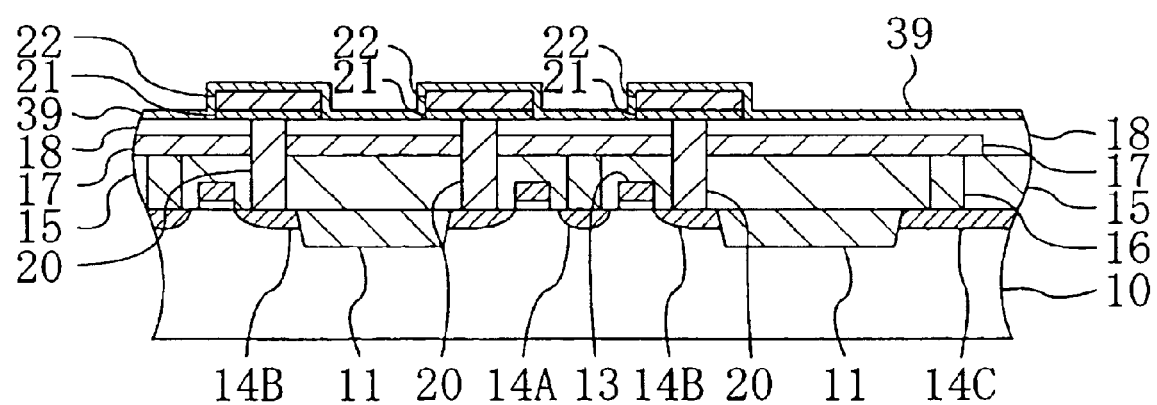
FIG. 13 is a cross-sectional view illustrating a process step for fabricating the semiconductor device in accordance with the second embodiment of the present invention.

FIGS. 12A and 12B, and FIG. 13 are cross-sectional views illustrating some of the process steps for fabricating the semiconductor device in accordance with the second embodiment of the present invention.

[Formation of Lower Hydrogen-barrier Films]

As shown in FIG. 12A, bit lines 17, which have a multilayer structure of an about 10 nm thick film of titanium and an about 100 nm thick film of tungsten, are selectively formed on a first interlayer dielectric film 15 of silicon oxide, as in the first embodiment. Subsequently, after silicon oxide is deposited by a CVD process, for example, on the entire surface of the first interlayer dielectric film 15 as well as on the bit lines 17, a CMP process is performed to planarize the deposited silicon oxide so that the portions thereof located on the bit lines 17 have a thickness of about 100 nm, thereby forming a second interlayer dielectric film 18 made of the silicon oxide. Contact holes are then formed on n-type source regions 14B of MOS transistors and on doped interconnect layers 14C by a lithography process and a dry-etching process so that the contact holes expose the respective doped layers 14B and 14C. Thereafter, an about 10 nm thick film of titanium, an about 20 nm thick film of titanium nitride, and an about 300 nm thick film of tungsten are sequentially deposited on the second interlayer dielectric film 18 by a CVD process so that the contact holes are filled. This is followed by a process step for removing the portion of the deposited films that remains on the second interlayer dielectric film 18 by a CMP process. In this manner, second contact plugs 20, which are connected to the doped source layers 14B of the MOS transistors and the doped interconnect layers 14C, are formed passing through the second interlayer dielectric film 18 and the first interlayer dielectric film 15.

Subsequently, as shown in FIG. 12B, an about 50 nm thick film of titanium aluminum nitride, an about 50 nm thick film of iridium, and an about 50 nm thick film of iridium oxide are sequentially deposited on the entire surface of the second interlayer dielectric film 18 as well as on the upper surfaces of the second contact plugs 20 by a sputtering process, for example. The stacked films are then sequentially patterned by a lithography process and a dry-etching process in such a manner that their portions covering the top faces of the second contact plugs 20 are left, thereby forming conductive lower hydrogen-barrier films 21 made of the titanium aluminum nitride, and oxygen-barrier films 22 made of the iridium and the iridium oxide.

Next, as shown in FIG. 13, an insulative lower hydrogen-barrier film 39 made of an about 50 nm thick film of titanium aluminum oxide is deposited on the entire surface of the second interlayer dielectric film 18 as well as on the conductive lower hydrogen-barrier films 21 and the oxygen-barrier films 22 by a sputtering process, for example. This allows the insulative lower hydrogen-barrier film 39 to be connected to the lateral/edge faces of the conductive lower hydrogen-barrier films 21. Although not shown, when contact holes 23a are formed in a third interlayer dielectric film 23 in a later process step, the respective portions of the insulative lower hydrogen-barrier film 39 located above the conductive lower hydrogen-barrier films 21 are removed selectively.

As described above, like the semiconductor device of the first embodiment, the semiconductor device of the second embodiment includes the insulative lower hydrogen-barrier film 39 and the conductive lower hydrogen-barrier films 21, which cover the lower face of the cell block that includes the capacitors 27, and an upper hydrogen-barrier film 29, which covers the top and lateral faces of the cell block. Therefore, unlike in a case in which a hydrogen-barrier film is formed for each unit cell, the lateral barrier against hydrogen coming in the direction parallel with respect to the substrate surface is ensured without causing the cell area to increase.

In addition, the upper hydrogen-barrier film 29 is provided in such a manner that its portion formed on the peripheral portion of the insulative lower hydrogen-barrier film 39 is directly connected to that peripheral portion, with the lateral and bottom faces of the upper hydrogen-barrier film 29 forming an obtuse-angled "L" in cross section. This structure produces sufficient coating-film thickness in the upper hydrogen-barrier film 29 in the cross-sectionally L-shaped bending portions, thus enabling the connection portion to sufficiently function as a barrier against hydrogen.

Additionally, in the second embodiment, the insulative lower hydrogen-barrier film 39 is contact with the lateral/edge faces of the conductive lower hydrogen-barrier films 21, which prevents hydrogen from entering from between the insulative lower hydrogen-barrier film 39 and the conductive lower hydrogen-barrier films 21.

(Third Embodiment)

Hereinafter, a third embodiment of the present invention will be described with reference to the accompanying drawings.

Figure 14:
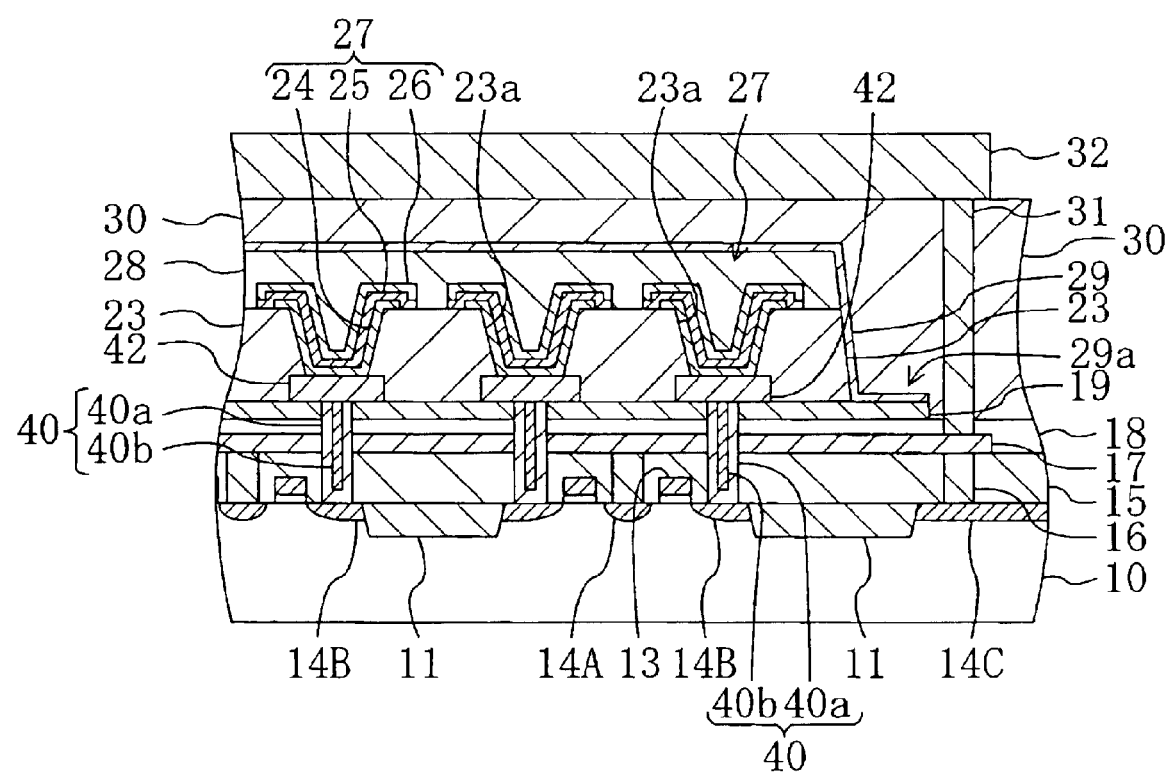
FIG. 14 illustrates a partial cross-sectional structure of a semiconductor device in accordance with a third embodiment of the present invention.

FIG. 14 illustrates a partial cross-sectional structure of a semiconductor device in accordance with the third embodiment of the present invention. In FIG. 14, the same members as those shown in FIG. 3 are identified by the same reference numerals and the description thereof will be omitted herein.

The semiconductor device of the third embodiment employs a structure in which conductive lower hydrogen-barrier films 40a, each made of an about 50 nm thick film of titanium aluminum nitride, are provided in the lateral and lower portions of second contact plugs 40 that are connected to doped source regions 14B of MOS transistors and doped interconnect layers 14C. In each of the second contact plugs 40, a contact plug body 40b of tungsten is formed.

Further, an oxygen-barrier film 42, composed of, from the bottom layer, an about 10 nm thick film of titanium, an about 50 nm thick film of iridium, and an about 50 nm thick film of iridium oxide, is formed between each second contact plug 40 and the lower electrode 24 of the corresponding capacitor 27 so that the oxygen-barrier film 42 covers the second contact plug 40.

Hereinafter, referring to the accompanying drawings, it will be described how to fabricate a semiconductor device that has the above-mentioned structure. This embodiment will be also described only in terms of its differences from the fabrication method of the first embodiment.

Figure 15A:
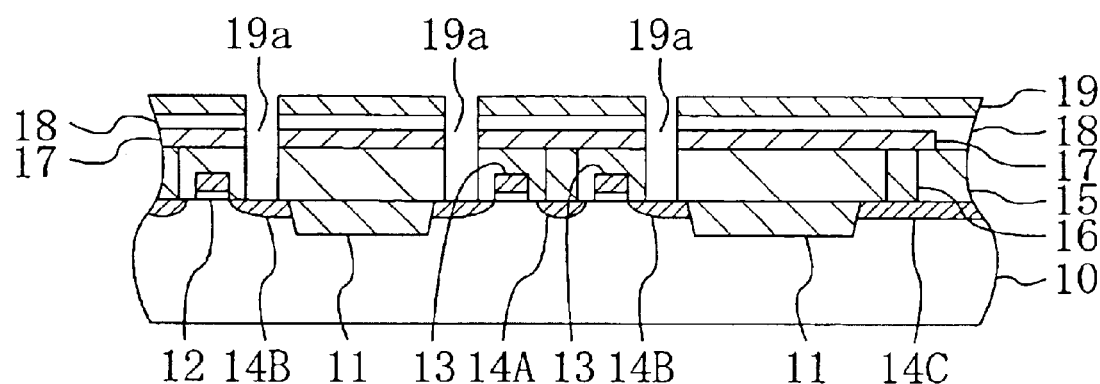
FIGS. 15A and 15B are cross-sectional views illustrating some of the process steps for fabricating the semiconductor device in accordance with the third embodiment of the present invention.
Figure 15B:
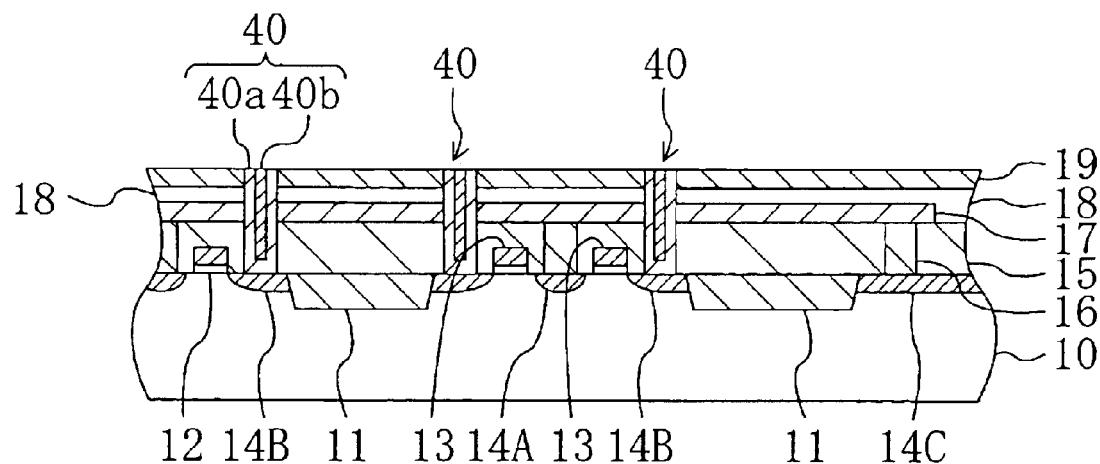
Figure 16:
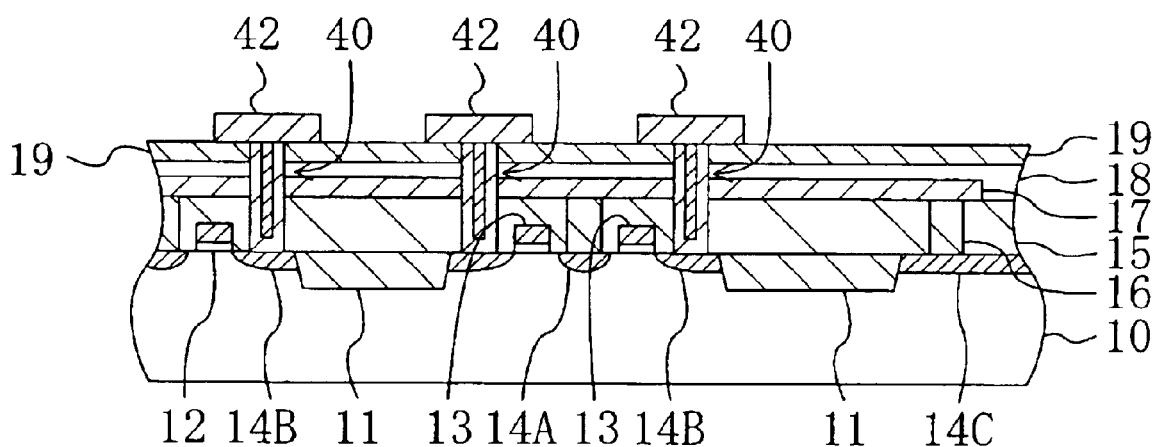
FIG. 16 is a cross-sectional view illustrating a process step for fabricating the semiconductor device in accordance with the third embodiment of the present invention.

FIGS. 15A and 15B, and FIG. 16 are cross-sectional views illustrating some of the process steps for fabricating the semiconductor device in accordance with the third embodiment of the present invention.

[Formation of Lower Hydrogen-barrier Films]

As shown in FIG. 15A, bit lines 17, which have a multilayer structure of an about 10 nm thick film of titanium and an about 100 nm thick film of tungsten, are selectively formed on a first interlayer dielectric film 15 of silicon oxide, as in the first embodiment. Subsequently, after silicon oxide is deposited by a CVD process, for example, on the entire surface of the first interlayer dielectric film 15 as well as on the bit lines 17, a CMP process is performed to planarize the deposited silicon oxide so that the portions thereof located on the bit lines 17 have a thickness of about 100 nm, thereby forming a second interlayer dielectric film 18 made of the silicon oxide. An insulative lower hydrogen-barrier film 19 of, e.g., an about 100 nm thick film of silicon nitride is then deposited on the second interlayer dielectric film 18 by a CVD process. Thereafter, contact holes 19a are formed on source regions 14B of MOS transistors and on doped interconnect layers 14C by a lithography process and a dry-etching process so that the contact holes 19a expose the respective doped layers 14B and 14C.

Next, as shown in FIG. 15B, a conductive lower hydrogen-barrier film 40a of an about 50 nm thick film of titanium aluminum nitride is deposited by a CVD process, for example, on the insulative lower hydrogen-barrier film 19 so that the conductive lower hydrogen-barrier film 40a is deposited on the bottom and wall faces of the contact holes 19a, and then tungsten having a thickness of about 300 nm is deposited so as to fill the contact holes 19a. This is followed by a process step for removing the portion of the deposited films that remains on the insulative lower hydrogen-barrier film 19 by a CMP process, thereby forming contact plug bodies 40b of the tungsten inside the respective conductive lower hydrogen-barrier films 40a in the contact holes 19a. In this manner, second contact plugs 40, which are connected with the doped source layers 14B of the MOS transistors and the doped interconnect layers 14C, are formed passing through the insulative lower hydrogen-barrier film 19, the second interlayer dielectric film 18 and the first interlayer dielectric film 15.

Subsequently, as shown in FIG. 16, an about 10 nm thick film of titanium, an about 50 nm thick film of iridium, and an about 50 nm thick film of iridium oxide are sequentially deposited on the entire surface of the insulative lower hydrogen-barrier film 19 as well as on the upper surfaces of the second contact plugs 40 by a sputtering process, for example. Those stacked films are then patterned by a lithography process and a dry-etching process in such a manner that their portions covering the top faces of the second contact plugs 40 are left, thereby forming oxygen-barrier films 22 each composed of, from the bottom layer, the titanium, the iridium and the iridium oxide.

As described above, like the semiconductor device of the first embodiment, the semiconductor device of the third embodiment includes the insulative lower hydrogen-barrier film 19 and the conductive lower hydrogen-barrier films 40a, which cover the lower face of the cell block that includes the capacitors 27, and an upper hydrogen-barrier film 29, which covers the top and lateral faces of the cell block. Therefore, unlike in a case in which a hydrogen-barrier film is formed for each unit cell, the lateral barrier against hydrogen coming in the direction parallel with respect to the substrate surface is ensured without causing the cell area to increase.

In addition, the upper hydrogen-barrier film 29 is provided in such a manner that its portion formed on the peripheral portion of the insulative lower hydrogen-barrier film 19 is directly connected to that peripheral portion, with the lateral and bottom faces of the upper hydrogen-barrier film 29 forming an obtuse-angled "L" in cross section. This structure produces sufficient coating-film thickness in the upper hydrogen-barrier film 29 in the cross-sectionally L-shaped bending portions, thereby enabling the connection portion to sufficiently function as a barrier against hydrogen.

Additionally, in the third embodiment, the conductive lower hydrogen-barrier films 40a are provided on the bottom and wall faces of the contact holes 19a, so that the conductive lower hydrogen-barrier films 40a are in contact with the end faces of the insulative lower hydrogen-barrier film 19 that face the contact holes 19a, which prevents hydrogen from entering from between the insulative lower hydrogen-barrier film 19 and the conductive lower hydrogen-barrier films 40a.

(Fourth Embodiment)

Hereinafter, a fourth embodiment of the present invention will be described with reference to the accompanying drawings.

Figure 17:
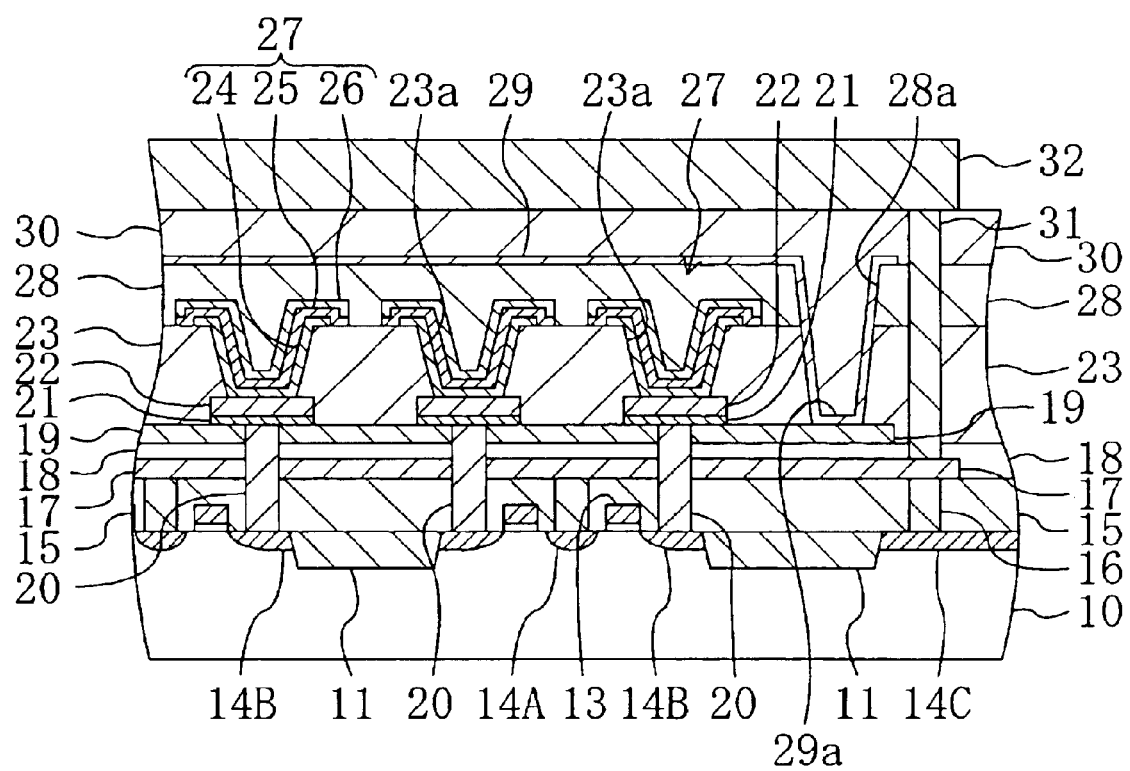
FIG. 17 illustrates a partial cross-sectional structure of a semiconductor device in accordance with a fourth embodiment of the present invention.

FIG. 17 illustrates a partial cross-sectional structure of a semiconductor device in accordance with the fourth embodiment of the present invention. In FIG. 17, the same members as those shown in FIG. 3 are identified by the same reference numerals and the description thereof will be omitted herein.

The semiconductor device of the fourth embodiment employs a structure in which a connection portion 29a of an upper hydrogen-barrier film 29, in which the upper hydrogen-barrier film 29 is in contact with an insulative lower hydrogen-barrier film 19, is formed on the bottom face of a trench 28a formed in third and fourth interlayer dielectric films 23 and 28.

Hereinafter, referring to the accompanying drawings, it will be described how to fabricate a semiconductor device that has the above-mentioned structure. This embodiment will be also described only in terms of its differences from the fabrication method of the first embodiment.

Figure 18:
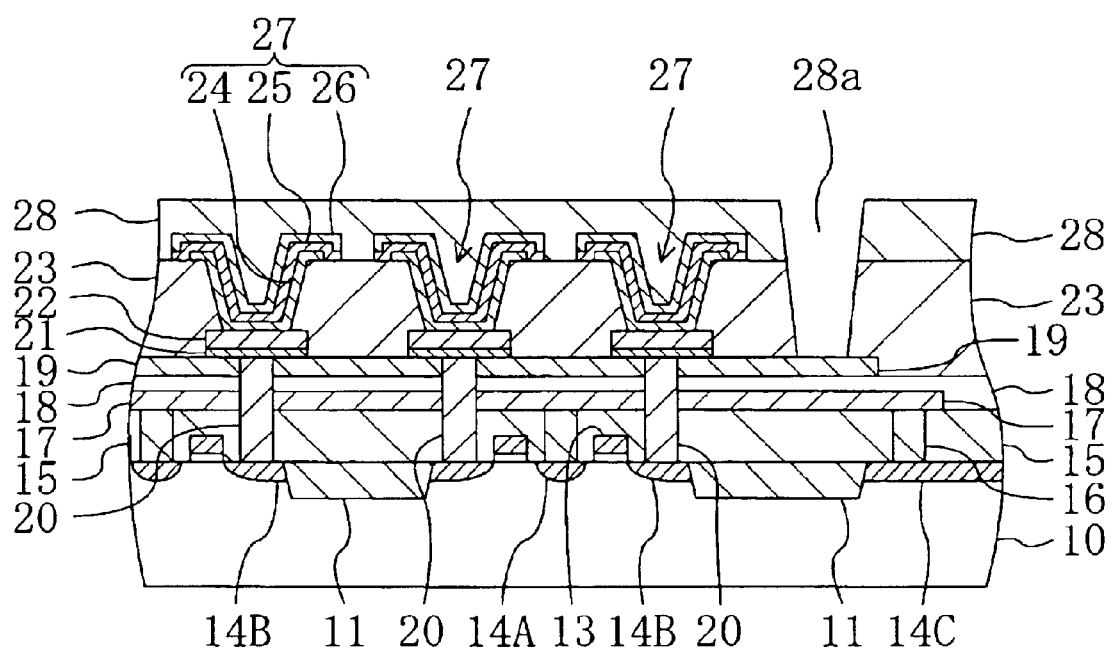
FIG. 18 is a cross-sectional view illustrating a process step for fabricating the semiconductor device in accordance with the fourth embodiment of the present invention.
Figure 19:
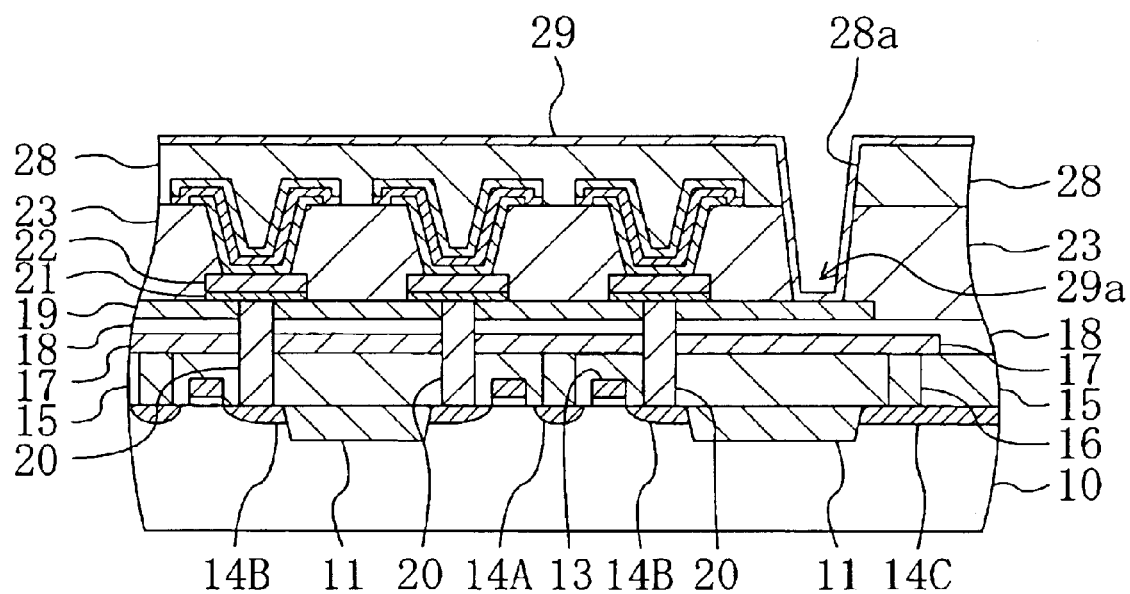
FIG. 19 is a cross-sectional view illustrating a process step for fabricating the semiconductor device in accordance with the fourth embodiment of the present invention.
Figure 20:
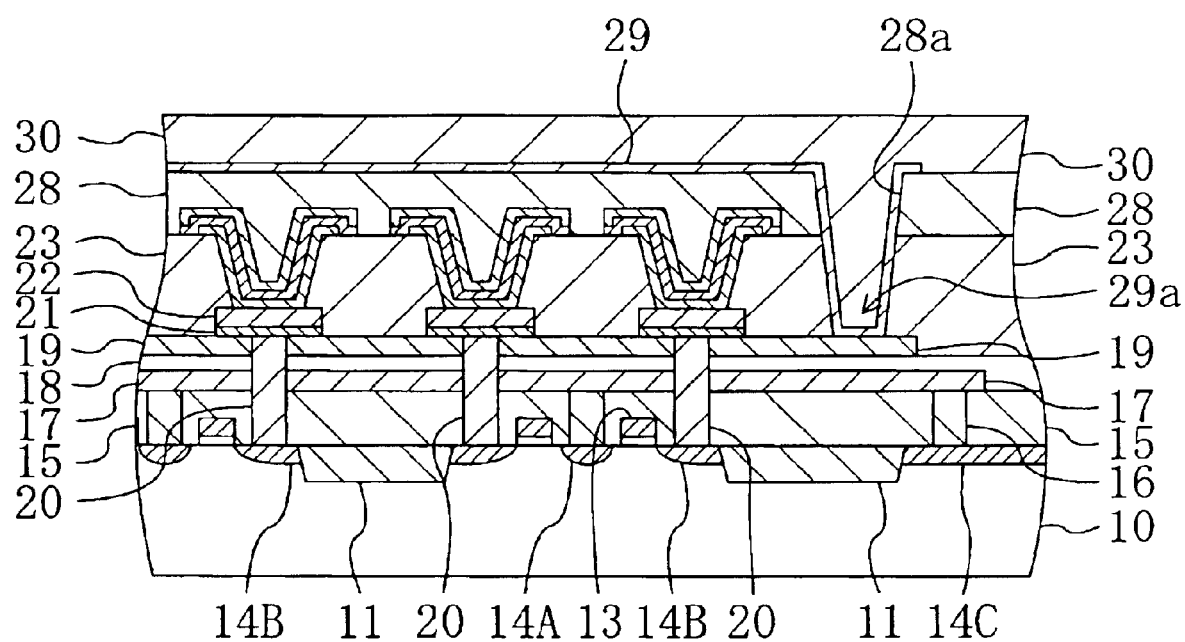
FIG. 20 is a cross-sectional view illustrating a process step for fabricating the semiconductor device in accordance with the fourth embodiment of the present invention.

FIGS. 18 through 20 are cross-sectional views illustrating some of the process steps for fabricating the semiconductor device in accordance with the fourth embodiment of the present invention.

[Formation of Upper Hydrogen-barrier Film]

As shown in FIG. 18, after silicon oxide is deposited by a CVD process on the entire surface of a third interlayer dielectric film 23 as well as on upper electrodes 26 of capacitors 27, a CMP process is performed to planarize the deposited silicon oxide so that the portions thereof located on the upper electrodes 26 where the upper electrodes 26 are located over the planarized portions of the third interlayer dielectric film 23, have a thickness of about 300 nm, thereby forming a fourth interlayer dielectric film 28 made of the silicon oxide. Then, a trench 28a is formed in the fourth interlayer dielectric film 28 and the third interlayer dielectric film 23 by a lithography process and a dry-etching process in such a manner that the trench 28a surrounds the cell block and exposes an insulative lower hydrogen-barrier film 19. Since an upper hydrogen-barrier film 29 will be formed on the wall and bottom faces of the trench 28a in the subsequent process step, the trench 28a is preferably tapered and flares upward in cross section, in order to increase the coverage of the upper hydrogen-barrier film 29 on the wall surfaces and in the bottom corners. To attain such a tapered shape, an etching gas whose major constituent is fluorocarbon, for example, may be used.

Subsequently, as shown in FIG. 19, the upper hydrogen-barrier film 29, made of an about 50 nm thick film of titanium aluminum oxide, is deposited by a sputtering process, for example, on the entire upper surface of the fourth interlayer dielectric film 28 as well as on the bottom and wall faces of the trench 28a. Then, a connection portion 29a, which is connected with the portion of the insulative lower hydrogen-barrier film 19 exposed through the trench 28a, is formed in a region of the upper hydrogen-barrier film 29 located outside the cell block.

Then, as shown in FIG. 20, the upper hydrogen-barrier film 29 is selectively removed where it is externally beyond the trench 28a. Then, after silicon oxide is deposited by a CVD process on the entire surface of the upper hydrogen-barrier film 29 as well as on the trench 28a, a CMP process is performed to planarize the deposited silicon oxide so that the portion thereof located on the upper hydrogen-barrier film 29 where the upper hydrogen-barrier film 29 is located above the capacitor rows has a thickness of about 300 nm, thereby forming a fifth interlayer dielectric film 30 made of the silicon oxide.

It should be noted that in the fourth embodiment, before the third interlayer dielectric film 23 is deposited, the insulative lower hydrogen-barrier film 19 may be removed where it is located outside the region for forming the trench 28a.

As described above, like the semiconductor device of the first embodiment, the semiconductor device of the fourth embodiment includes the insulative lower hydrogen-barrier film 19 and the conductive lower hydrogen-barrier films 21, which cover the lower face of the cell block that includes the capacitors 27, and the upper hydrogen-barrier film 29, which covers the top and lateral faces of the cell block. Therefore, unlike in a case in which a hydrogen-barrier film is formed for each unit cell, the lateral barrier against hydrogen coming in the direction parallel with respect to the substrate surface is ensured without causing the cell area to increase.

In addition, when the connection portion 29 for connecting the upper hydrogen-barrier film 29 with the insulative lower hydrogen-barrier film 19 is formed, the trench 28a is provided in the fourth interlayer dielectric film 28 and the third interlayer dielectric film 23. As a result, most part of the third and fourth interlayer dielectric films 23 and 28 remains unremoved over the semiconductor substrate 10, which avoids a situation in which a resist pattern formed over the cell block has a small thickness when the upper hydrogen-barrier film 29 is patterned. Moreover, the planarity of the fifth interlayer dielectric film 30 that covers the upper hydrogen-barrier film 29 also increases.

Furthermore, since the upper hydrogen-barrier film 29 is formed on the bottom and wall surfaces of the trench 28a formed in the fourth interlayer dielectric film 28 and the third interlayer dielectric film 23, the upper hydrogen-barrier film 29 is formed doubly to the lateral portion of the capacitor rows, which improves the barrier against hydrogen entering from the lateral portion of the capacitor rows.

It should be noted that in the fourth embodiment the semiconductor device may also employ a structure in which an insulative lower hydrogen-barrier film is connected with the end faces of conductive lower hydrogen-barrier films as in the second embodiment, or may employ a structure in which conductive lower hydrogen-barrier films are formed on the bottom and lateral faces of second contact plugs as in the third embodiment.

(Fifth Embodiment)

Hereinafter, a fifth embodiment of the present invention will be described with reference to the accompanying drawings.

Figure 21:
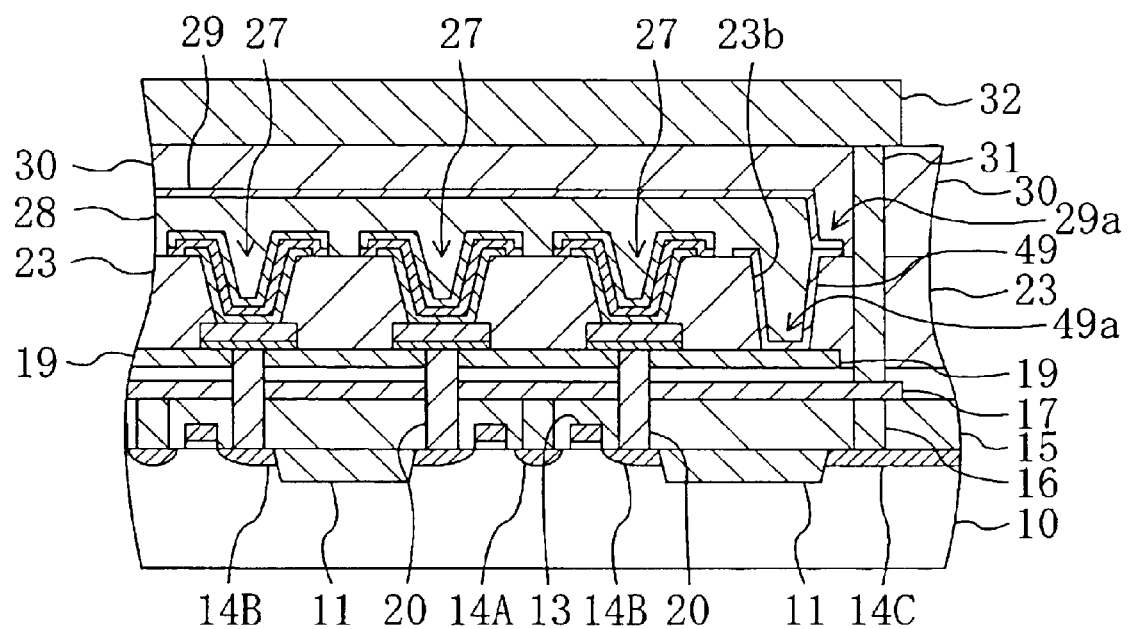
FIG. 21 illustrates a partial cross-sectional structure of a semiconductor device in accordance with a fifth embodiment of the present invention.

FIG. 21 illustrates a partial cross-sectional structure of a semiconductor device in accordance with the fifth embodiment of the present invention. In FIG. 21, the same members as those shown in FIG. 3 are identified by the same reference numerals and the description thereof will be omitted herein.

In the semiconductor device of the fifth embodiment, instead of directly connecting an upper hydrogen-barrier film 29 to an insulative lower hydrogen-barrier film 19 formed under the cell block, a trench 23b that exposes part of the insulative lower hydrogen-barrier film 19 is formed in a region of a third interlayer dielectric film 23 located outside the cell block, and a side-wall hydrogen-barrier film 49 made of an about 50 nm thick film of titanium aluminum oxide is formed on the bottom and wall faces of the trench 23b. In this way, a first connection portion 49a of the side-wall hydrogen-barrier film 49 is formed on the bottom of the trench 23b.

Further, a second connection portion 29a is also formed in the outer portions of the upper hydrogen-barrier film 29 and side-wall hydrogen-barrier film 49. The cell block is thus covered with the insulative lower hydrogen-barrier film 19, conductive lower hydrogen-barrier films 21, the side-wall hydrogen-barrier film 49, and the upper hydrogen-barrier film 29.

Figure 22:
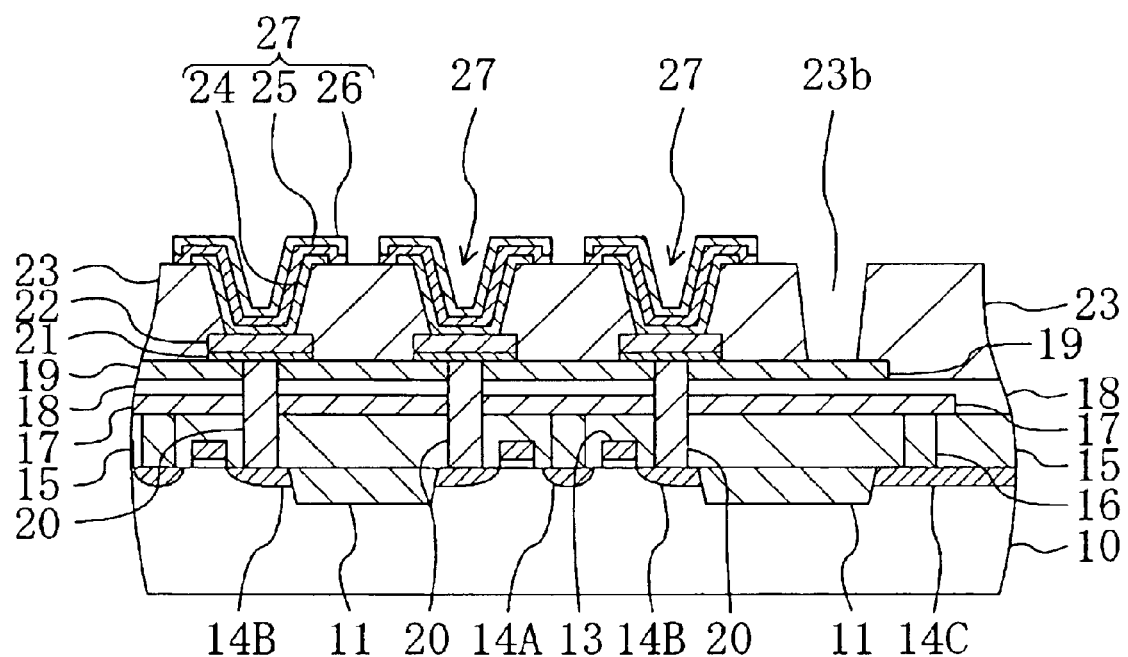
FIG. 22 is a cross-sectional view illustrating a process step for fabricating the semiconductor device in accordance with the fifth embodiment of the present invention.
Figure 23:
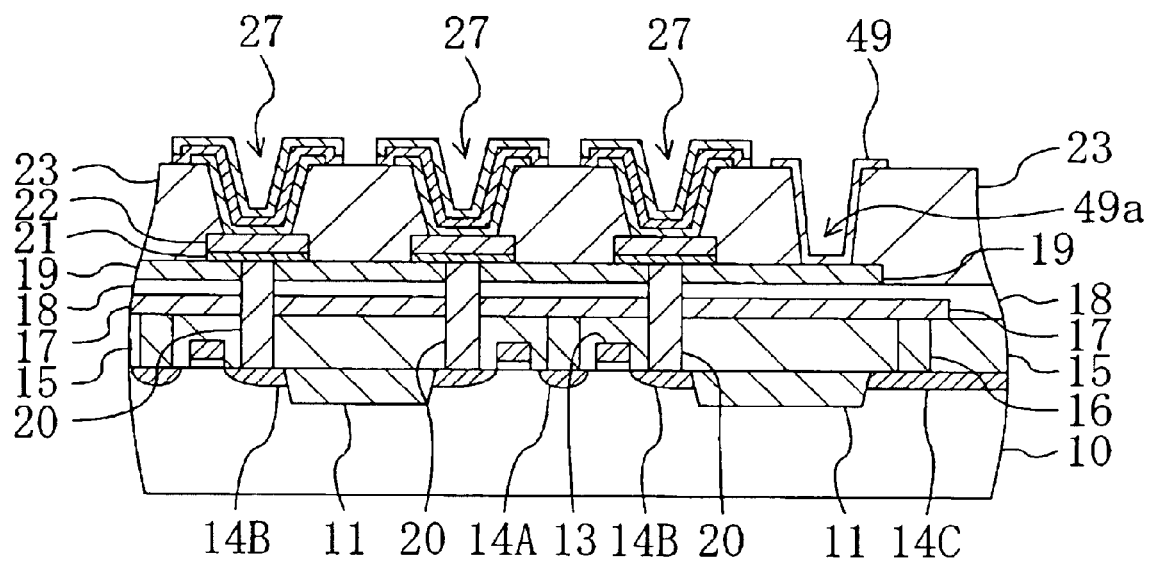
FIG. 23 is a cross-sectional view illustrating a process step for fabricating the semiconductor device in accordance with the fifth embodiment of the present invention.
Figure 24:
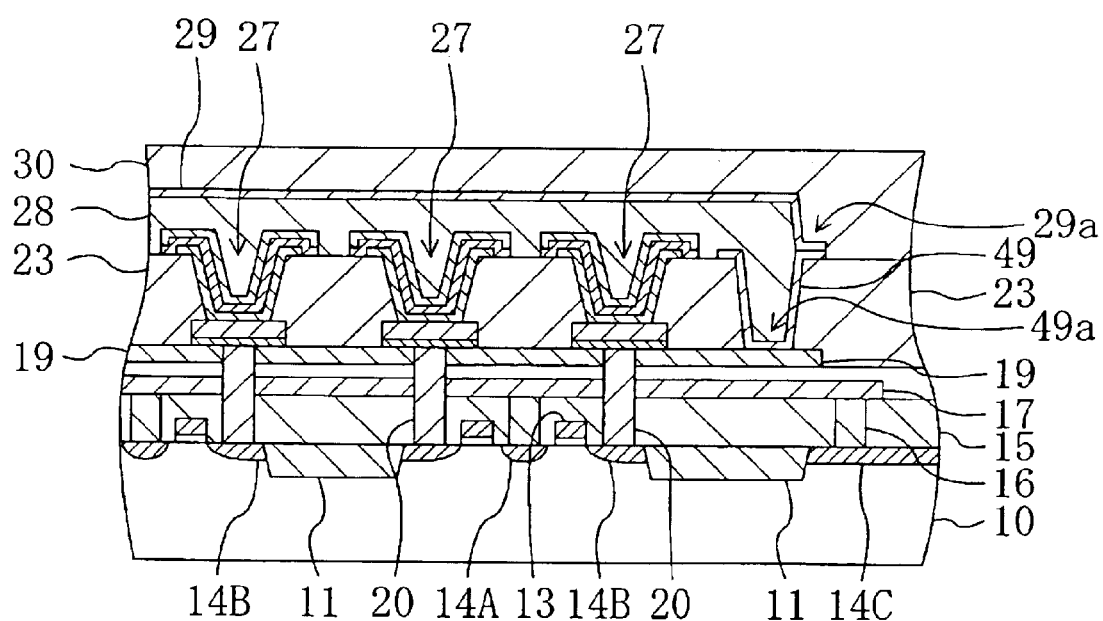
FIG. 24 is a cross-sectional view illustrating a process step for fabricating the semiconductor device in accordance with the fifth embodiment of the present invention.

FIGS. 22 through 24 are cross-sectional views illustrating some of the process steps for fabricating the semiconductor device in accordance with the fifth embodiment of the present invention.

[Formation of Upper Hydrogen-barrier Film]

As shown in FIG. 22, a trench 23b is formed by a by a lithography process and a dry-etching process in a third interlayer dielectric film 23 so that the trench 23b surrounds the cell block and exposes part of an insulative lower hydrogen-barrier film 19. Since a side-wall hydrogen-barrier film 49 will be formed on the wall and bottom faces of the trench 23b in the subsequent process step, the trench 23a is preferably tapered and flares upward in cross section, in order to increase the coverage of the side-wall hydrogen-barrier film 49 on the wall surfaces and in the bottom corners. To attain such a tapered shape, an etching gas whose major constituent is fluorocarbon, for example, may be used.

Subsequently, as shown in FIG. 23, the side-wall hydrogen-barrier film 49, made of an about 50 nm thick film of titanium aluminum oxide, is deposited by a sputtering process, for example, on the bottom and wall faces of the trench 23b formed in the third interlayer dielectric film 23. In this manner, a first connection portion 49a is formed, allowing the side-wall hydrogen-barrier film 49 to be connected with the insulative lower hydrogen-barrier film 19 where the side-wall hydrogen-barrier film 49 is located on the bottom of the trench 23b. Subsequently, the side-wall hydrogen-barrier film 49 is patterned so that its portion covering the trench 23b is left.

Then, as shown in FIG. 24, after silicon oxide is deposited by a CVD process on the entire surface of the third interlayer dielectric film 23 as well as on upper electrodes 26 of capacitors 27 and on the side-wall hydrogen-barrier film 49, a CMP process is performed to planarize the deposited silicon oxide so that the portions thereof located on the upper electrodes 26 where the upper electrodes 26 are located on the third interlayer dielectric film 23 have a thickness of about 300 nm, thereby forming a fourth interlayer dielectric film 28 made of the silicon oxide. Thereafter, while the fourth interlayer dielectric film 28 is masked where it is included in the cell block, a lithography process and a dry-etching process are performed to remove the unmasked portion thereof located outside the masked portion, in such a manner that the removed portion is tapered and flares upward, thereby exposing the outer upper end portion of the side-wall hydrogen-barrier film 49.

Subsequently, an upper hydrogen-barrier film 29 of an about 50 nm thick film of titanium aluminum oxide is deposited by a sputtering process on the respective top faces of the fourth and third interlayer dielectric films 28 and 23 and on the exposed face of the side-wall hydrogen-barrier film 49. Then, the upper hydrogen-barrier film 29 is connected with the exposed face of the side-wall hydrogen-barrier film 49 by a second connection portion 29*a*. Thereafter, the respective portions of the upper hydrogen-barrier film 29 and side-wall hydrogen-barrier film 49 that are located outside the cell block are removed by dry-etching so as to leave the second connection portion 29*a* of the upper hydrogen-barrier film 29 with a width of only 500 nm. Then, after silicon oxide is deposited by a CVD process on the entire surfaces of the upper hydrogen-barrier film 29 and third interlayer dielectric film 23, a CMP process is performed to planarize the deposited silicon oxide so that the portion thereof located on the upper hydrogen-barrier film 29 where the upper hydrogen-barrier film 29 is located above the capacitor rows has a thickness of about 300 nm, thereby forming a fifth interlayer dielectric film 30 made of the silicon oxide.

It should be noted that in the fifth embodiment, before the third interlayer dielectric film 23 is deposited, the insulative lower hydrogen-barrier film 19 may be removed where the film 19 is located outside the region for forming the trench 23*b*.

As described above, the semiconductor device of the fifth embodiment includes the insulative lower hydrogen-barrier film 19 and conductive lower hydrogen-barrier films 21, which cover the lower face of the cell block that includes the capacitors 27, the side-wall hydrogen-barrier film 49, which covers the lateral faces of the cell block, and the upper hydrogen-barrier film 29, which covers the top face of the cell block. Therefore, unlike in a case in which a hydrogen-barrier film is formed for each unit cell, the lateral barrier against hydrogen coming in the direction parallel with respect to the substrate surface is ensured without causing the cell area to increase.

In addition, the side-wall hydrogen-barrier film 49 is formed on the bottom and wall faces of the trench 23*b* having a tapered shape and flaring upward, while the upper hydrogen-barrier film 29 is formed with its lateral and bottom faces forming an obtuse-angled "L" in cross section. This structure produces sufficient coating-film thickness in the side-wall hydrogen-barrier film 49 and the upper hydrogen-barrier film 29, in the bends in their respective recessed and L-shaped forms. Accordingly, the barrier against hydrogen formed to the lateral portion of the capacitor rows sufficiently improves. As a result, the capacitive insulating films 25, made of a ferroelectric material and included in the capacitors 27, are reliably prevented from deteriorating due to hydrogen.

Furthermore, in the fifth embodiment, since the side-wall hydrogen-barrier film 49 and the upper hydrogen-barrier film 29 are independent of each other rather than formed as a single film, the coverage of the upper hydrogen-barrier film 29 is excellent even if the difference in level between the top and bottom surfaces of each capacitor 27 is relatively large.

It should be noted that in the fifth embodiment the semiconductor device may also employ a structure in which an insulative lower hydrogen-barrier film is connected with the end faces of conductive lower hydrogen-barrier films as in the second embodiment, or may employ a structure in which conductive lower hydrogen-barrier films are formed on the bottom and lateral faces of second contact plugs as in the third embodiment.

It should be also noted that although titanium aluminum oxide (TiAlO) is used to form hydrogen-barrier layers having insulative property in the first through fifth embodiments, aluminum oxide ($Al_2O_3$) or tantalum aluminum oxide (TaAlO) may be used instead of this. Alternatively, a multilayer film that includes at least two of these may be used.

Moreover, although titanium aluminum nitride (TiAlN) is used to form conductive barrier layers in the foregoing embodiments, any one of titanium aluminum (TiAl), titanium silicide nitride (TiSiN), tantalum nitride (TaN), tantalum silicide nitride (TaSiN), tantalum aluminum nitride (TaAlN), and tantalum aluminum (TaAl) may be used, or a multilayer film that includes at least two of these may be used.

(Sixth Embodiment)

Hereinafter, a sixth embodiment of the present invention will be described with reference to the accompanying drawing.

Figure 25:
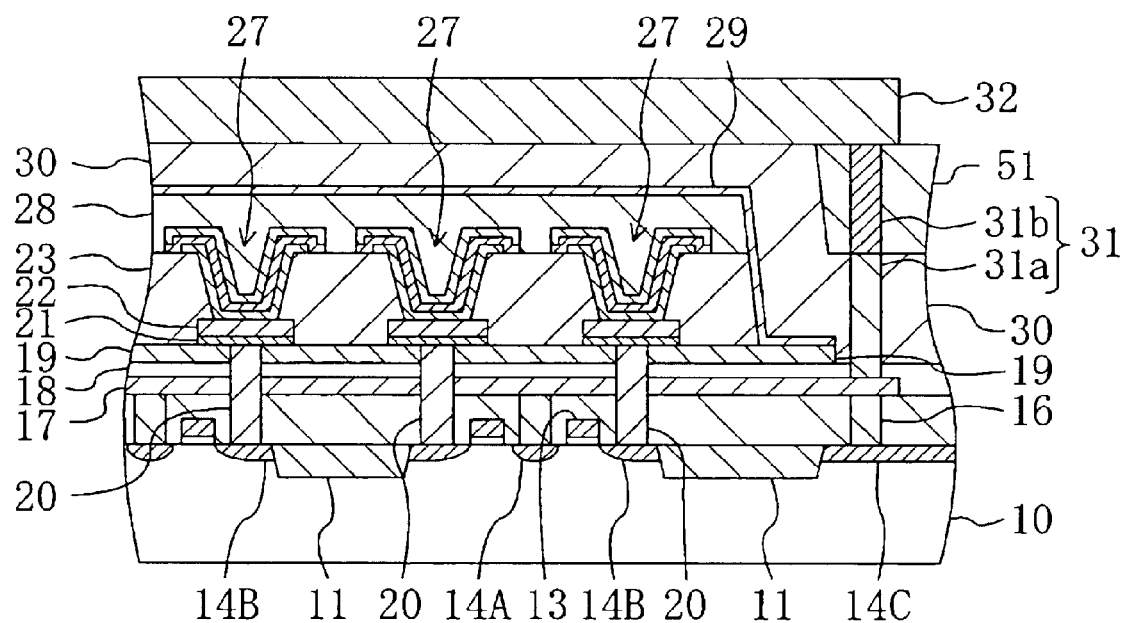
FIG. 25 illustrates a partial cross-sectional structure of a semiconductor device in accordance with a sixth embodiment of the present invention.

FIG. 25 illustrates a partial cross-sectional structure of a semiconductor device in accordance with the sixth embodiment of the present invention. In FIG. 25, the same members as those shown in FIG. 3 are identified by the same reference numerals and the description thereof will be omitted herein.

In the sixth embodiment, in forming third contact plugs 31, lower contact plugs 31*a* and upper contact plugs 31*b* provided on the lower contact plugs 31*a* are formed separately.

More specifically, as shown in FIG. 25, regions for forming third contact plugs 31, and the vicinity of those regions, located outside the cell block in the fifth interlayer dielectric film 30, are dug by a dry-etching process to form recesses down to a level that is equal to the height of the upper surface of the third interlayer dielectric film 23.

Subsequently, contact holes for exposing bit lines 17 are formed in the respective bottoms of the recesses that have been formed in the fifth interlayer dielectric film 30, and lower contact plugs 31*a* are formed in the respective contact holes in the same manner as in the first embodiment. It should be noted that since the lower contact plugs 31*a* are formed in the bottoms of the recesses formed in the fifth interlayer dielectric film 30, the plug-forming material deposited around the contact holes is removed by a dry-etching process using an etching gas whose major constituent is sulfur hexafluoride ($SF_6$), for example.

Then, after a sixth interlayer dielectric film 51 made of silicon oxide is deposited by a CVD process on the fifth interlayer dielectric film 30 so that the recesses are filled, the respective upper surfaces of the fifth and sixth interlayer dielectric films 30 and 51 are planarized by a CMP process. Then, contact holes for exposing the lower contact plugs 31*a* are formed in the sixth interlayer dielectric films 51 filled in the recesses formed in the fifth interlayer dielectric film 30, and upper contact plugs 31b are then formed in the contact holes in the same manner as in the first embodiment, thereby forming third contact plugs 31 each composed of the lower and upper contact plugs 31a and 31b.

As described above, in the sixth embodiment, the recesses are formed in the fifth interlayer dielectric film 30 to reduce the thickness, after which the lower contact plugs 31a are formed under the recesses formed in the fifth interlayer dielectric film 30. Subsequently, the recesses are filled with the sixth interlayer dielectric film 51, and the upper contact plugs 31b connected with the lower contact plugs 31a are formed in the sixth interlayer dielectric films 51. The respective aspect ratios of the contact holes for forming the lower and upper contact plugs are both smaller as compared with a case in which the third contact plugs 31 are formed at a time. This ensures the formation of the third contact plugs 31.

It should be noted that the third contact plugs divided into upper and lower portions are applicable to the semiconductor devices in accordance with the first through third embodiments.

(Seventh Embodiment)

Hereinafter, a seventh embodiment of the present invention will be described with reference to the accompanying drawing.

Figure 26:
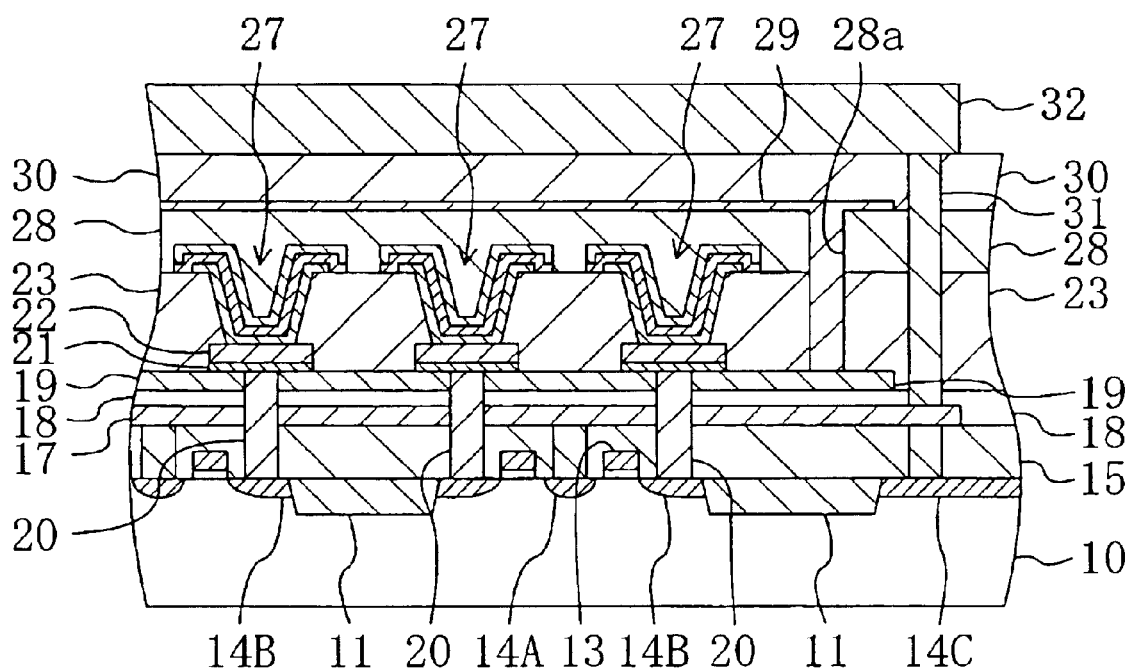
FIG. 26 illustrates a partial cross-sectional structure of a semiconductor device in accordance with a seventh embodiment of the present invention.

FIG. 26 illustrates a partial cross-sectional structure of a semiconductor device in accordance with the seventh embodiment of the present invention. In FIG. 26, the same members as those shown in FIG. 17 are identified by the same reference numerals and the description thereof will be omitted herein.

In the seventh embodiment, a trench 28a formed in third and fourth interlayer dielectric films 23 and 28 is filled with an upper hydrogen-barrier film 29. In this embodiment, the trench 28a has an opening width of from about 200 nm to about 250 nm. Thus, after aluminum oxide is grown to a thickness of about 150 nm by a CVD process, for example, the upper hydrogen barrier film 29 is polished by CMP process until its portions located on the planarized portions of the fourth interlayer dielectric film 28 have a thickness of about 50 nm.

In the seventh embodiment, since the trench 28a formed in the third and fourth interlayer dielectric films 23 and 28 is filled with the upper hydrogen-barrier film 29, when a fifth interlayer dielectric film 30 is deposited on the upper hydrogen-barrier film 29 in a later process step, the amount of deposition of the dielectric film is allowed to be reduced. As a result, the thickness of the fifth interlayer dielectric film 30 is lessened, thereby achieving the downsizing of the semiconductor device.

(Eighth Embodiment)

Hereinafter, an eighth embodiment of the present invention will be described with reference to the accompanying drawing.

Figure 27:
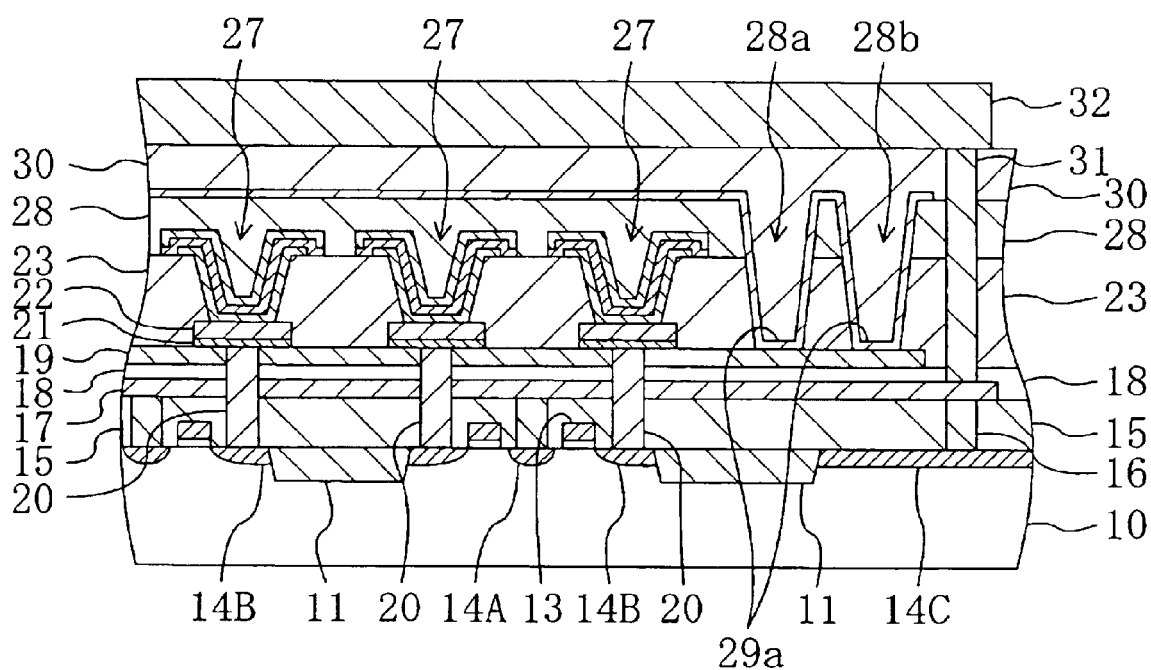
FIG. 27 illustrates a partial cross-sectional structure of a semiconductor device in accordance with an eighth embodiment of the present invention.

FIG. 27 illustrates a partial cross-sectional structure of a semiconductor device in accordance with the eighth embodiment of the present invention. In FIG. 27, the same members as those shown in FIG. 17 are identified by the same reference numerals and the description thereof will be omitted herein.

In the eighth embodiment, a two-fold structure trench, including a first trench 28a and a second trench 28b formed externally along the first trench 28a, is formed in third and fourth interlayer dielectric films 23 and 28. This structure further improves the sideways barrier against hydrogen coming toward the cell block in the direction parallel with respect to the substrate surface.

It will be appreciated that the trenches 28a and 28b are not limited to the two-fold structure, but may be three-fold or more. However, if the number of trenches is increased, the area of connection portions 29a, in which an insulative lower hydrogen-barrier film 19 is in contact with an upper hydrogen-barrier film 29, also increases correspondingly. Therefore, the double structure or so is preferable.

(Ninth Embodiment)

Hereinafter, a ninth embodiment of the present invention will be described with reference to the accompanying drawing.

Figure 28:
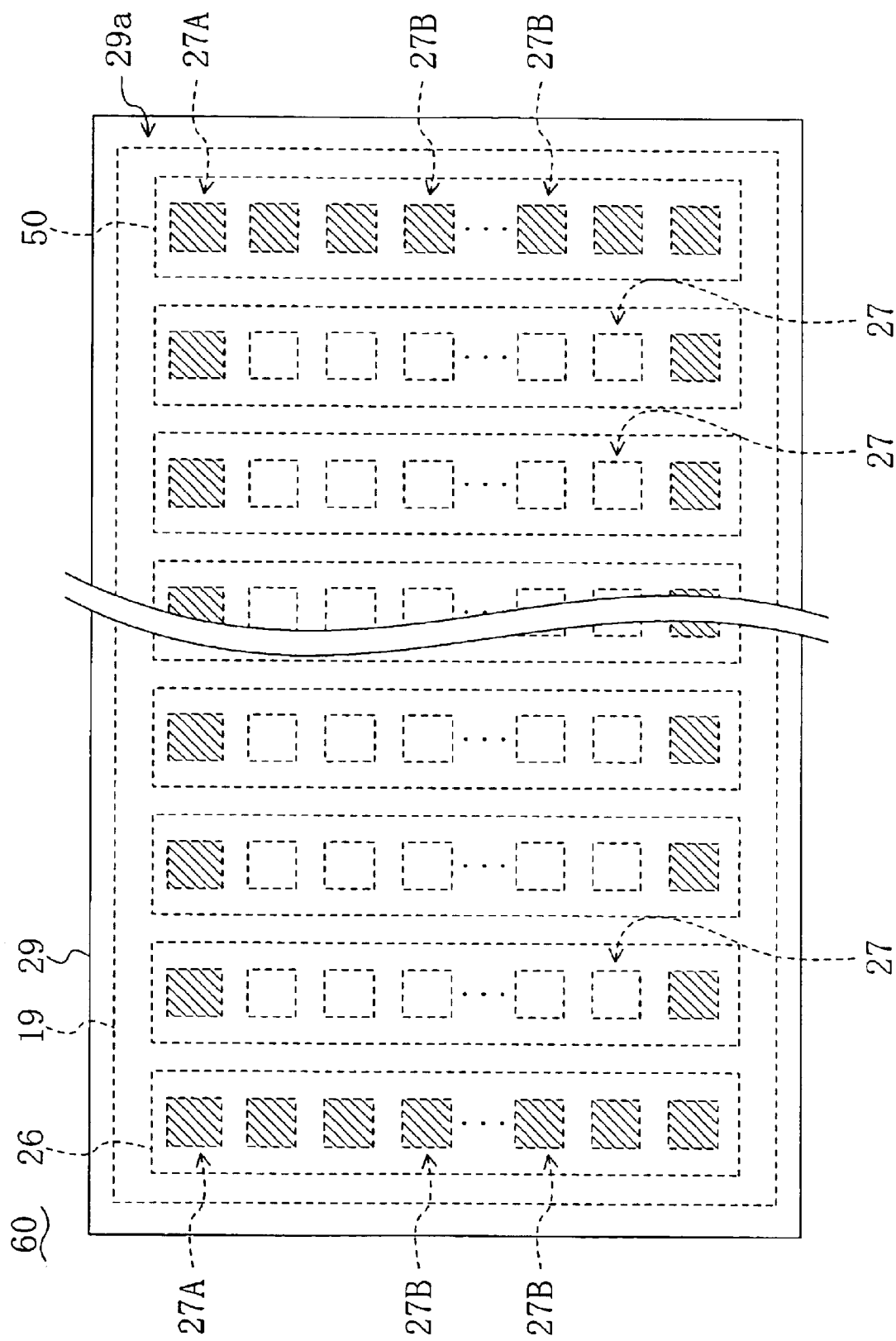
FIG. 28 is a plan view illustrating a cell block in a semiconductor device in accordance with a ninth embodiment of the present invention.

FIG. 28 illustrates a plan configuration for the main part of a semiconductor device in accordance with the ninth embodiment of the present invention.

As shown in FIG. 28, in the ninth embodiment, capacitors located adjacent to the peripheral portion of an upper hydrogen-barrier film 29 are non-actuating dummy capacitors 27B, which do not perform normal operation as capacitors. As mentioned above, conducting dummy capacitors 27A, formed in respective portions of the capacitor rows, have a structure in which the upper electrode is shorted with the lower electrode, and thus naturally do not function as capacitors.

Accordingly, in the ninth embodiment, since all of the capacitors located in the peripheral portion of the cell block 60 are not allowed to operate, the semiconductor device is capable of performing its predetermined operation, even if the upper hydrogen-barrier film 29 should fail to prevent hydrogen from diffusing into the capacitors.

Needless to say, the non-actuating dummy capacitors 27B are applicable to the semiconductor devices in accordance with the other embodiments.

(Tenth Embodiment)

Hereinafter, a tenth embodiment of the present invention will be described with reference to the accompanying drawing.

Figure 29:
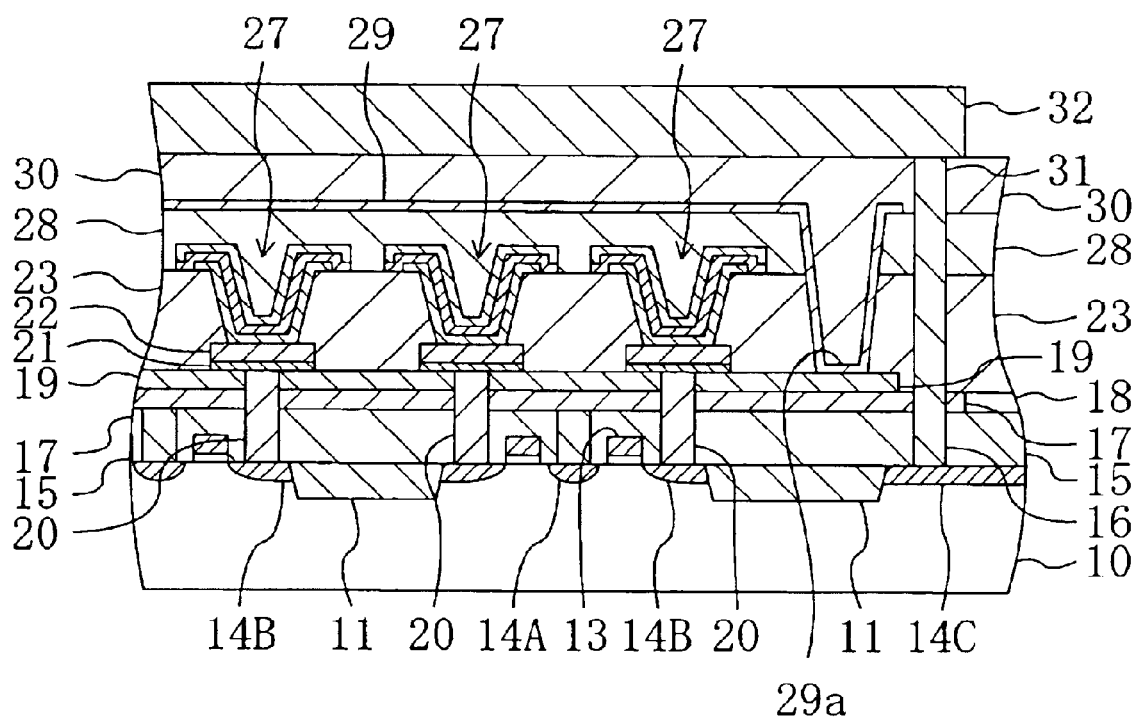
FIG. 29 illustrates a partial cross-sectional structure of a semiconductor device in accordance with a tenth embodiment of the present invention.

FIG. 29 illustrates a partial cross-sectional structure of a semiconductor device in accordance with the tenth embodiment of the present invention. In FIG. 29, the same members as those shown in FIG. 17 are identified by the same reference numerals and the description thereof will be omitted herein.

As shown in FIG. 29, in the semiconductor device of the tenth embodiment, a second interlayer dielectric film 18 formed between bit lines 17 and an insulative lower hydrogen-barrier film 19 is polished by a CMP process, for example, until the bit lines 17 are exposed, and the insulative lower hydrogen-barrier film 19 is formed directly on the exposed bit lines 17 and the second interlayer dielectric film 18 embedded in the spaces between the bit lines 17.

This structure reduces the aspect ratio of contact holes for forming third contact plugs 31 that pass through third, fourth and fifth interlayer dielectric films 23, 28 and 30 for connection with the bit lines 17, which therefore ensures the formation of the third contact plugs 31. In addition, the height of the semiconductor device is lessened, making the downsizing of the semiconductor device easier.

It should be noted that the structure in which the bit lines 17 are in contact with the insulative lower hydrogen-barrier film 19 may be applied to the semiconductor devices in accordance with the other embodiments of the present invention.

(Eleventh Embodiment)

Hereinafter, an eleventh embodiment of the present invention will be described with reference to the accompanying drawing.

Figure 30:
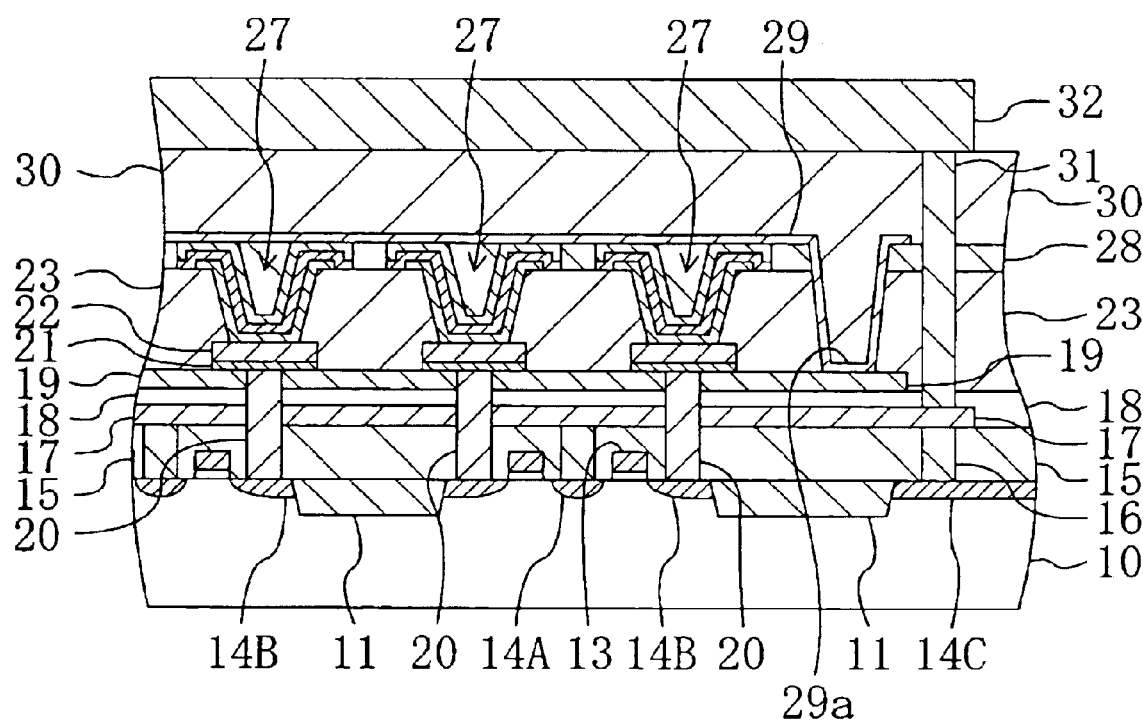
FIG. 30 illustrates a partial cross-sectional structure of a semiconductor device in accordance with an eleventh embodiment of the present invention.

FIG. 30 illustrates a partial cross-sectional structure of a semiconductor device in accordance with the eleventh embodiment of the present invention. In FIG. 30, the same members as those shown in FIG. 17 are identified by the same reference numerals and the description thereof will be omitted herein.

As shown in FIG. 30, in the semiconductor device of the eleventh embodiment, a fourth interlayer dielectric film 28 formed between capacitors 27 and an upper hydrogen-barrier film 29 is polished by a CMP process, for example, until the capacitors 27 are exposed, and the upper hydrogen-barrier film 29 is formed directly on the exposed capacitors 27 and the fourth interlayer dielectric film 28 embedded in the spaces between the capacitors 27.

This structure reduces the aspect ratio of contact holes for forming third contact plugs 31 that pass through second, third, fourth and fifth interlayer dielectric films 18, 23, 28 and 30 for connection with the bit lines 17, which therefore ensures the formation of the third contact plugs 31. In addition, the height of the semiconductor device is lessened, making the downsizing of the semiconductor device easier.

It should be noted that the structure in which the capacitors 27 are in contact with the upper hydrogen-barrier film 29 may be applied to the semiconductor devices in accordance with the other embodiments of the present invention.

(Twelfth Embodiment)

Hereinafter, a twelfth embodiment of the present invention will be described with reference to the accompanying drawing.

Figure 31:
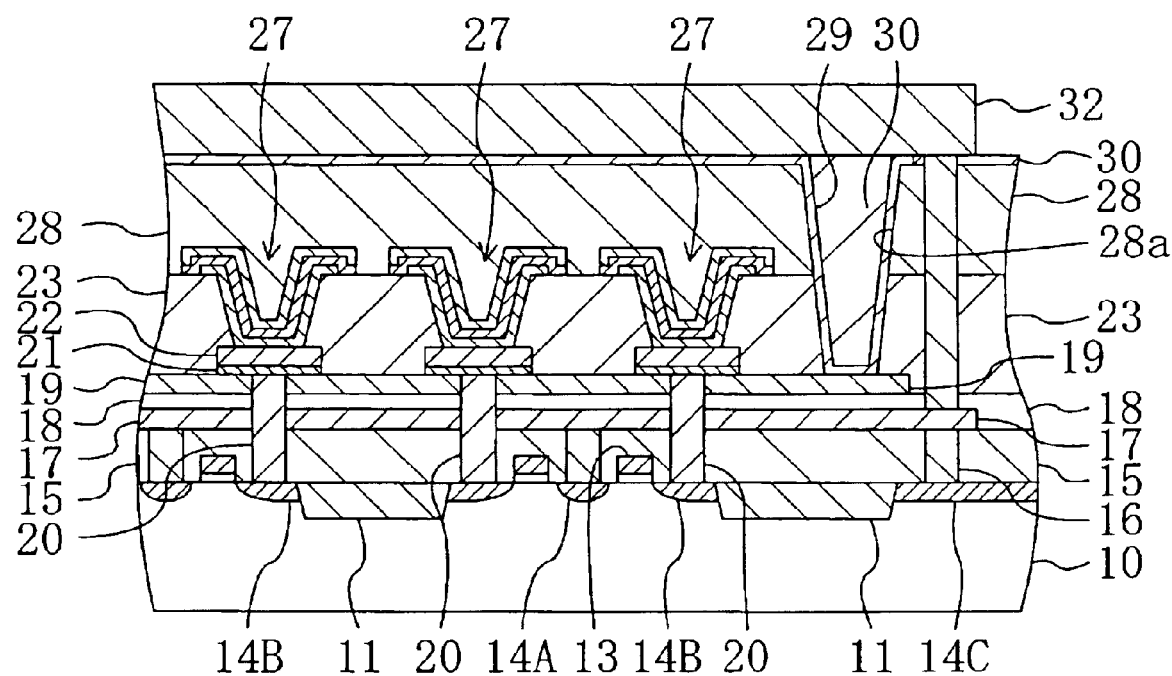
FIG. 31 illustrates a partial cross-sectional structure of a semiconductor device in accordance with a twelfth embodiment of the present invention.
Figure 32:
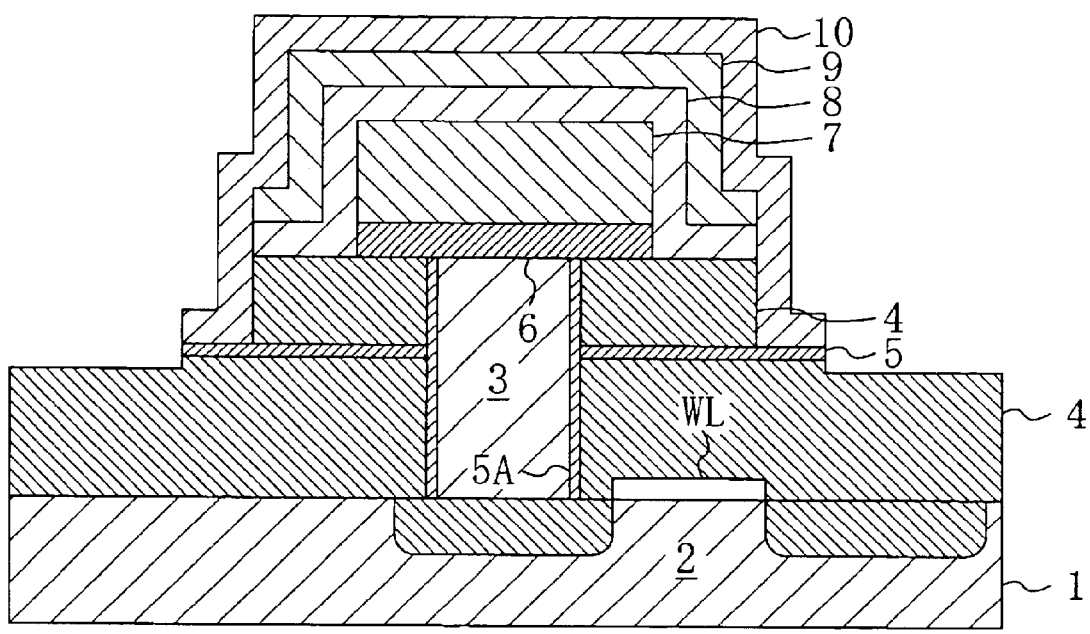
FIG. 32 illustrates a cross-sectional structure of a semiconductor device in accordance with a first prior art example, which has a capacitive insulating film in which a ferroelectric material is used.
Figure 33:
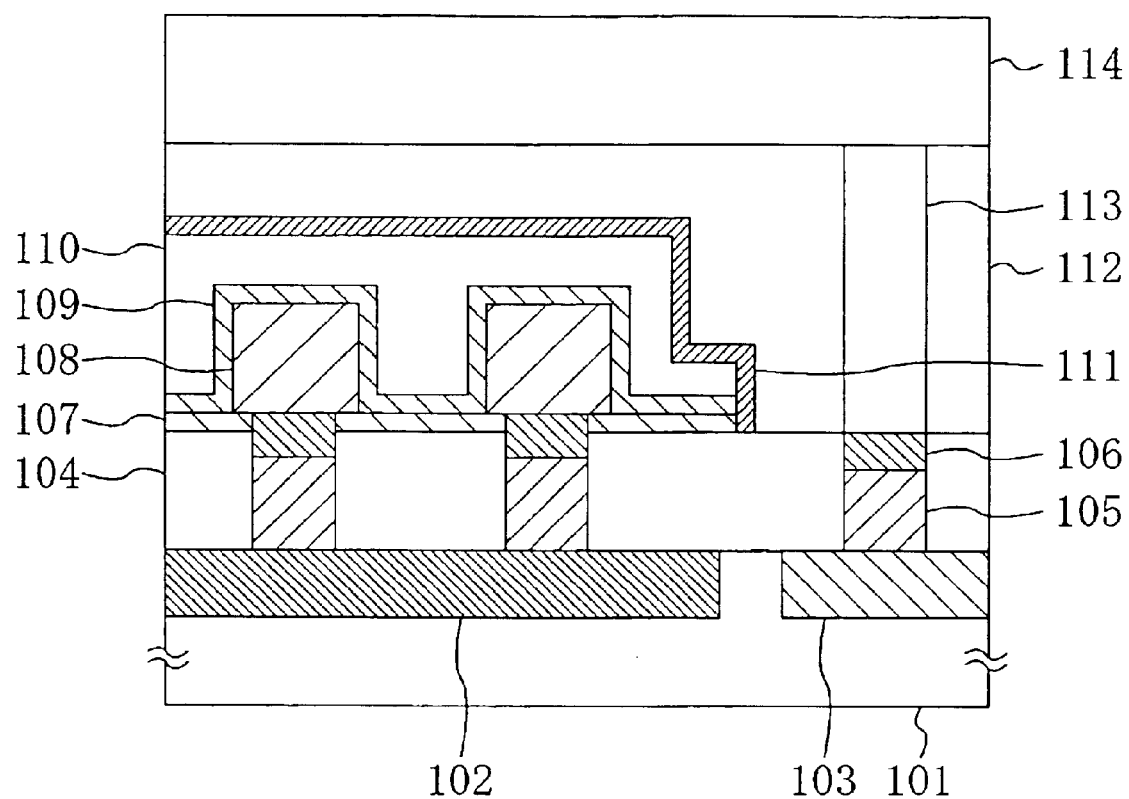
FIG. 33 illustrates a cross-sectional structure of a semiconductor device, in accordance with a second prior art example, that has a capacitive insulating film in which a ferroelectric material or a high dielectric material is used.

FIG. 31 illustrates a partial cross-sectional structure of a semiconductor device in accordance with the twelfth embodiment of the present invention. In FIG. 31, the same members as those shown in FIG. 17 are identified by the same reference numerals and the description thereof will be omitted herein.

As shown in FIG. 31, in the semiconductor device of the twelfth embodiment, a fifth interlayer dielectric film 30 formed between an upper hydrogen-barrier film 29 and interconnects 32 is polished by a CMP process, for example, until the upper hydrogen-barrier film 29 is exposed, and the interconnects 32 are formed directly on the exposed upper hydrogen-barrier film 29 and the fifth interlayer dielectric film 30 filled in a trench 28a.

This structure reduces the aspect ratio of contact holes for forming third contact plugs 31 that pass through the second, third, fourth and fifth interlayer dielectric films 18, 23, 28 and 30 for connection with the bit lines 17, which therefore ensures the formation of the third contact plugs 31. In addition, the height of the semiconductor device is lessened, making the downsizing of the semiconductor device easier.

It should be noted that the structure in which the upper hydrogen-barrier film 29 is in contact with the interconnects 32 may be applied to the semiconductor devices in accordance with the other embodiments of the present invention.

What is claimed is:

1. A semiconductor device comprising:
   a lower hydrogen-barrier film;
   one or more capacitors, each formed on the lower hydrogen-barrier film and including a lower electrode, a capacitive insulating film, and an upper electrode;
   a first interlayer dielectric film formed so as to cover the capacitor; and
   an upper hydrogen-barrier film covering the top and lateral portions of the capacitor,
   wherein an opening, which exposes the lower hydrogen-barrier film where the lower hydrogen-barrier film is located around the capacitor, and which is tapered and flares upward, is formed in the first interlayer dielectric film, and
   the upper hydrogen-barrier film is formed along the lateral and bottom faces of the opening, and is in contact with the lower hydrogen-barrier film in the opening.

2. The semiconductor device of claim 1, wherein the capacitor has a cross-sectional configuration that is tapered and flares upward.

3. The semiconductor device of claim 1, further comprising:
   a second interlayer dielectric film formed on the first interlayer dielectric film so as to cover the capacitor,
   wherein the upper hydrogen-barrier film includes a first hydrogen-barrier film and a second hydrogen-barrier film, wherein the first hydrogen-barrier film is formed along the opening, while the second hydrogen-barrier film is formed on the second interlayer dielectric film and the end portion of the second hydrogen-barrier film is connected to the first hydrogen-barrier film.

4. The semiconductor device of claim 1, further comprising:
   a second interlayer dielectric film formed over the first interlayer dielectric film so as to cover the upper hydrogen-barrier film, and
   a third interlayer dielectric film formed on the second interlayer dielectric film and located to the lateral portion of the capacitor,
   wherein a lower contact plug, which passes through the second interlayer dielectric film, is formed in a region of the second interlayer dielectric film which is located to the lateral portion of the capacitor, and
   an upper contact plug is formed in a region of the third interlayer dielectric film wherein the upper contact plug passes through the third interlayer dielectric film and is electrically connected with the lower contact plug.

5. The semiconductor device of claim 1, wherein the lower hydrogen-barrier film or the upper hydrogen-barrier film is made of an insulative material, and
   the insulative material is made of silicon nitride, silicon oxynitride, aluminum oxide, titanium aluminum oxide, tantalum aluminum oxide, titanium silicate oxide, or tantalum silicate oxide.

6. The semiconductor device of claim 1, wherein an oxygen-barrier film for preventing oxygen diffusion is provided under the capacitor.

7. The semiconductor device of claim 6, wherein the oxygen-barrier film is made of iridium, iridium oxide, ruthenium, or ruthenium oxide.

8. The semiconductor device of claim 6, wherein the oxygen-barrier film is made of any one of an iridium oxide film, a multilayer film composed of an iridium film and an iridium oxide film that are sequentially formed from the lowermost layer, a ruthenium oxide film, and a multilayer film composed of a ruthenium film and a ruthenium oxide film that are sequentially formed from the lowermost layer, or is made of a multilayer film that includes at least two of these films.

9. The semiconductor device of claim 1, wherein a conductive lower hydrogen-barrier film for preventing hydrogen diffusion is provided under the capacitor.

10. The semiconductor device of claim 9, wherein the conductive lower hydrogen-barrier film is made of titanium aluminum nitride, titanium aluminum, titanium silicide nitride, tantalum nitride, tantalum silicide nitride, tantalum aluminum nitride, or tantalum aluminum.

11. The semiconductor device of claim 9, wherein the conductive lower hydrogen-barrier film is made of a multi-layer film that includes at least two of a titanium aluminum nitride film, a titanium aluminum film, a titanium silicide nitride film, a tantalum nitride film, a tantalum silicide nitride film, a tantalum aluminum nitride film, and a tantalum aluminum film.

12. The semiconductor device of claim 9, wherein the conductive lower hydrogen-barrier film includes a multi-layer film composed of a first conductive barrier layer for preventing oxygen diffusion and hydrogen diffusion, and a second conductive barrier layer for preventing oxygen diffusion.

13. The semiconductor device of claim 1, wherein a plurality of the capacitors are arranged in a row to form a capacitor row, and
the capacitors are covered in capacitor row units by the upper hydrogen-barrier film.

14. The semiconductor device of claim 1, wherein a plurality of the capacitors are arranged to form a block, and
the capacitors are covered in block units by the upper hydrogen-barrier film.

15. The semiconductor device of claim 1, wherein a plurality of the capacitors are arranged in a matrix to form a capacitor array, and
the capacitors are covered in capacitor array units by the upper hydrogen-barrier film.

16. The semiconductor device of claim 1, wherein a plurality of the capacitors are arranged in rows to form capacitor rows, and the upper electrodes forming each said capacitor row are connected with each other to form a cell plate,
the capacitor rows are arranged to form blocks, and the blocks are arranged to form a capacitor array, and
the capacitors are covered by the upper hydrogen-barrier film in cell plate units, block units, or capacitor array units, or are covered in a mixture of the cell plate units and the block units.

17. The semiconductor device of claim 1, wherein a plurality of the capacitors are arranged, and
among the capacitors, capacitors located adjacent to the peripheral portion of the upper hydrogen-barrier film are non-actuating dummy capacitors that do not operate electrically.

18. The semiconductor device of claim 1, further comprising:
a cell-selecting transistor formed in a semiconductor substrate, and
a bit line formed over the semiconductor substrate, the bit line being electrically connected with the cell-selecting transistor,
wherein the bit line is connected with another interconnect where the bit line is located outside the lower and upper hydrogen-barrier films.

19. The semiconductor device of claim 18, wherein the bit line is formed underneath the lower hydrogen-barrier film.

20. The semiconductor device of claim 18, wherein the bit line is formed between the lower hydrogen-barrier film and the semiconductor substrate.

21. The semiconductor device of claim 18, wherein the bit line is formed under the lower hydrogen-barrier film so as to be in contact with the lower hydrogen-barrier film.

22. The semiconductor device of claim 1, wherein the upper electrode of the capacitor and the upper hydrogen-barrier film are in contact with each other.

23. The semiconductor device of claim 1, further comprising an interconnect formed directly on the upper hydrogen-barrier film.

24. The semiconductor device of claim 1, further comprising:
a cell-selecting transistor formed in a semiconductor substrate and having a source region and a drain region;
a second interlayer dielectric film formed on the semiconductor substrate and covering the cell-selecting transistor; and
a contact plug in the second interlayer dielectric film, the contact plug electrically connecting the lower electrode with the source region or the drain region.

25. The semiconductor device of claim 1, further comprising:
a plurality of cell-selecting transistors formed in a semiconductor substrate,
wherein a plurality of the capacitors are arranged to form a capacitor row, while the upper electrodes of the capacitors are connected with each other to form a cell plate;
each cell-selecting transistor is electrically connected with one of the capacitors by a contact plug;
the capacitor row includes a conducting dummy capacitor that is the same in structure as the capacitor; and
an upper electrode and a lower electrode in the conducting dummy capacitor are electrically connected with each other, so that the cell plate is electrically connected with the semiconductor substrate via the contact plug of the conducting dummy capacitor.

26. The semiconductor device of claim 25, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
the conductive lower hydrogen-barrier film is formed on the insulative lower hydrogen-barrier film so as to cover the upper surface of the contact plug.

27. The semiconductor device of claim 25, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
the end face of the conductive lower hydrogen-barrier film is in contact with the insulative lower hydrogen-barrier film.

28. The semiconductor device of claim 25, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
the conductive lower hydrogen-barrier film is formed on the lateral face of the contact plug, so that the conductive lower hydrogen-barrier film is in contact with the insulative lower hydrogen-barrier film.

29. The semiconductor device of claim 1, wherein the lower electrode or the upper electrode contains an element of the platinum group.

30. The semiconductor device of claim 1, wherein the capacitive insulating film is made of a substance, which is expressed by the general formula $SrBi_2(Ta_xNb_{1-x})_2O_9$, $Pb(Zr_xTi_{1-x})O_3$, $(Ba_xSr_{1-x}))TiO_3$, $(Bi_xLa_{1-x})_4Ti_3O_{12}$ (wherein $0 \leq x \leq 1$ in the formulas), or $Ta_2O_5$.

31. A semiconductor device comprising:
a lower hydrogen-barrier film;
one or more capacitors, each formed on the lower hydrogen-barrier film and including a lower electrode, a capacitive insulating film, and an upper electrode;
an interlayer dielectric film formed so as to cover the capacitor; and
an upper hydrogen-barrier film formed on the interlayer dielectric film,
wherein an open trench, which exposes the lower hydrogen-barrier film where the lower hydrogen-barrier film is located around the capacitor, is formed in the interlayer dielectric film, and
the upper hydrogen-barrier film is formed along the lateral and bottom faces of the open trench, and is in contact with the lower hydrogen-barrier film in the open trench.

32. The semiconductor device of claim 31, wherein the upper hydrogen-barrier film formed along the open trench has a cross-sectional configuration that is tapered and flares upward.

33. The semiconductor device of claim 31, wherein the upper hydrogen-barrier film is filled in the open trench.

34. The semiconductor device of claim 31, wherein the capacitor has a concave cross-sectional configuration.

35. The semiconductor device of claim 31, wherein a plurality of open trenches, which expose the lower hydrogen-barrier film, are formed in, parallel with each other in the interlayer dielectric film.

36. The semiconductor device of claim 31, wherein the lower hydrogen-barrier film or the upper hydrogen-barrier film is made of an insulative material, and
the insulative material is made of silicon nitride, silicon oxynitride, aluminum oxide, titanium aluminum oxide, tantalum aluminum oxide, titanium silicate oxide, or tantalum silicate oxide.

37. The semiconductor device of claim 31, wherein an oxygen-barrier film for preventing oxygen diffusion is provided under the capacitor.

38. The semiconductor device of claim 37, wherein the oxygen-barrier film is made of iridium, iridium oxide, ruthenium, or ruthenium oxide.

39. The semiconductor device of claim 37, wherein the oxygen-barrier film is made of any one of an iridium oxide film, a multilayer film composed of an iridium film and an iridium oxide film that are sequentially formed from the lowermost layer, a ruthenium oxide film, and a multilayer film composed of a ruthenium film and a ruthenium oxide film that are sequentially formed from the lowermost layer, or is made of a multilayer film that includes at least two of these films.

40. The semiconductor device of claim 31, wherein a conductive lower hydrogen-barrier film for preventing hydrogen diffusion is provided under the capacitor.

41. The semiconductor device of claim 40, wherein the conductive lower hydrogen-barrier film is made of titanium aluminum nitride, titanium aluminum, titanium silicide nitride, tantalum nitride, tantalum silicide nitride, tantalum aluminum nitride, or tantalum aluminum.

42. The semiconductor device of claim 40, wherein the conductive lower hydrogen-barrier film is made of a multilayer film that includes at least two of a titanium aluminum nitride film, a titanium aluminum film, a titanium silicide nitride film, a tantalum nitride film, a tantalum suicide nitride film, a tantalum aluminum nitride film, and a tantalum aluminum film.

43. The semiconductor device of claim 40, wherein the conductive lower hydrogen-barrier film includes a multilayer film composed of a first conductive barrier layer for preventing oxygen diffusion and hydrogen diffusion, and a second conductive barrier layer for preventing oxygen diffusion.

44. The semiconductor device of claim 31, wherein a plurality of the capacitors are arranged in a row to form a capacitor row, and
the capacitors are covered in capacitor row units by the upper hydrogen-barrier film.

45. The semiconductor device of claim 31, wherein a plurality of the capacitors are arranged to form a block, and
the capacitors are covered in block units by the upper hydrogen-barrier film.

46. The semiconductor device of claim 31, wherein a plurality of the capacitors are arranged in a matrix to form a capacitor array, and
the capacitors are covered in capacitor array units by the upper hydrogen-barrier film.

47. The semiconductor device of claim 31, wherein a plurality of the capacitors are arranged in rows to form capacitor rows, and the upper electrodes forming each said capacitor row are connected with each other to form a cell plate;
the capacitor rows are arranged to form blocks, and the blocks are arranged to form a capacitor array; and
the capacitors are covered by the upper hydrogen-barrier film in cell plate units, block units, or capacitor array units, or are covered in a mixture of the cell plate units and the block units.

48. The semiconductor device of claim 31, wherein a plurality of the capacitors are arranged, and
among the capacitors, capacitors located adjacent to the peripheral portion of the upper hydrogen-barrier film are non-actuating dummy capacitors that do not operate electrically.

49. The semiconductor device of claim 31, further comprising:
a cell-selecting transistor formed in a semiconductor substrate, and
a bit line formed over the semiconductor substrate, the bit line being electrically connected with the cell-selecting transistor,
wherein the bit line is connected with another interconnect where the bit line is located outside the lower and upper hydrogen-barrier films.

50. The semiconductor device of claim 49, wherein the bit line is formed underneath the lower hydrogen-barrier film.

51. The semiconductor device of claim 49, wherein the bit line is formed between the lower hydrogen-barrier film and the semiconductor substrate.

52. The semiconductor device of claim 49, wherein the bit line is formed under the lower hydrogen-barrier film so as to be in contact with the lower hydrogen-barrier film.

53. The semiconductor device of claim 31, wherein the upper electrode of the capacitor and the upper hydrogen-barrier film are in contact with each other.

54. The semiconductor device of claim 31, further comprising an interconnect formed directly on the upper hydrogen-barrier film.

55. The semiconductor device of claim 31, further comprising:
   a cell-selecting transistor formed in a semiconductor substrate and having a source region and a drain region;
   a second interlayer dielectric film formed on the semiconductor substrate and covering the cell-selecting transistor; and
   a contact plug in the second interlayer dielectric film, the contact plug electrically connecting the lower electrode with the source region or the drain region.

56. The semiconductor device of claim 31, further comprising:
   a plurality of cell-selecting transistors formed in a semiconductor substrate,
   wherein a plurality of the capacitors are arranged to form a capacitor row, while the upper electrodes of the capacitors are connected with each other to form a cell plate;
   each cell-selecting transistor is electrically connected with one of the capacitors by a contact plug;
   the capacitor row includes a conducting dummy capacitor that is the same in structure as the capacitor; and
   an upper electrode and a lower electrode in the conducting dummy capacitor are electrically connected with each other, so that the cell plate is electrically connected with the semiconductor substrate via the contact plug of the conducting dummy capacitor.

57. The semiconductor device of claim 56, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
   the conductive lower hydrogen-barrier film is formed on the insulative lower hydrogen-barrier film so as to cover the upper surface of the contact plug.

58. The semiconductor device of claim 56, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
   the end face of the conductive lower hydrogen-barrier film is in contact with the insulative lower hydrogen-barrier film.

59. The semiconductor device of claim 56, wherein the lower hydrogen-barrier film includes a conductive lower hydrogen-barrier film and an insulative lower hydrogen-barrier film, wherein the conductive lower hydrogen-barrier film is formed between each said cell-selecting transistor and each said capacitor, while the insulative lower hydrogen-barrier film is formed between the capacitor rows, and
   the conductive lower hydrogen-barrier film is formed on the lateral face of the contact plug, so that the conductive lower hydrogen-barrier film is in contact with the insulative lower hydrogen-barrier film.

60. The semiconductor device of claim 31, wherein the lower electrode or the upper electrode contains an element of the platinum group.

61. The semiconductor device of claim 31, wherein the capacitive insulating film is made of a substance, which is expressed by the general formula $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (wherein $0 \leq x \leq 1$ in the formulas), or $Ta_2O_5$.

62. The semiconductor device of claim 31, wherein the open trench has a cross-sectional configuration that is broadened upward from the bottom of the open trench.

63. The semiconductor device of claim 31, wherein a plurality of capacitors are arranged, and
   the plurality of capacitors are covered in plural units by the upper hydrogen-barrier film and the lower hydrogen-barrier film.

* * * * *